(12) United States Patent
Fujita

(10) Patent No.: US 8,681,533 B2
(45) Date of Patent: Mar. 25, 2014

(54) MEMORY CIRCUIT, SIGNAL PROCESSING CIRCUIT, AND ELECTRONIC DEVICE

(75) Inventor: Masashi Fujita, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 85 days.

(21) Appl. No.: 13/453,135

(22) Filed: Apr. 23, 2012

(65) Prior Publication Data

US 2012/0274378 A1 Nov. 1, 2012

(30) Foreign Application Priority Data

Apr. 28, 2011 (JP) ................................. 2011-101158
May 20, 2011 (JP) ................................. 2011-112994

(51) Int. Cl.
*G11C 11/24* (2006.01)

(52) U.S. Cl.
USPC ...... 365/149; 365/174; 365/188; 365/189.15; 326/102

(58) Field of Classification Search
USPC .............. 365/149, 174, 188, 189.15; 326/102
See application file for complete search history.

(56) References Cited

U.S. PATENT DOCUMENTS

| | | | |
|---|---|---|---|
| 5,218,607 A | 6/1993 | Saito et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Jannotti et al. "Native Point Defects in ZnO," Phys. Rev. B (Physical Review B), 2007 vol. 76 No. 16, pp. 165202-1-165202-22.*

(Continued)

*Primary Examiner* — Douglas King
*Assistant Examiner* — Lance Reidlinger
(74) *Attorney, Agent, or Firm* — Fish & Richardson P.C.

(57) ABSTRACT

A signal processing circuit using a nonvolatile memory circuit with a novel structure is provided. The nonvolatile memory circuit is formed using a transistor including an oxide semiconductor and a capacitor connected to one of a source electrode and a drain electrode of the transistor. A high-level potential is written to the memory circuit in advance, and this state is kept in the case where data to be saved has a high-level potential, whereas a low-level potential is written to the memory circuit in the case where data to be saved has a low-level potential. Thus, a signal processing circuit with improved writing speed can be provided.

7 Claims, 32 Drawing Sheets

(56) References Cited

U.S. PATENT DOCUMENTS

| | | | |
|---|---|---|---|
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,978,274 B2 * | 7/2011 | Umezaki et al. | 349/42 |
| 8,410,838 B2 * | 4/2013 | Kato et al. | 327/215 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101332 A1 | 5/2011 | Yamazaki et al. | |
| 2011/0101351 A1 | 5/2011 | Yamazaki | |
| 2011/0121878 A1 | 5/2011 | Kato et al. | |
| 2012/0140550 A1 * | 6/2012 | Endo et al. | 365/149 |
| 2012/0287702 A1 * | 11/2012 | Fujita | 365/149 |

FOREIGN PATENT DOCUMENTS

| | | | |
|---|---|---|---|
| JP | 58-205226 A | 11/1983 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 03-027419 A | 2/1991 | |
| JP | 05-251705 A | 9/1993 | |
| JP | 08-264794 A | 10/1996 | |
| JP | 10-078836 A | 3/1998 | |
| JP | 11-505377 A | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| WO | 2004/114391 A1 | 12/2004 | |

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center (with English language translation).

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507 (in English).

Asakuma, n. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

(56) References Cited

OTHER PUBLICATIONS

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-0 TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, a et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, n. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000°C," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of , Challenges to, and Perspective view of Am-Oled," IDW '06: Proceedings of the 13th International Display Workshop, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single Crystalline Transparent Oxide Semiconductor," Science, May 23, 2003, vol. 300, No. 5623, pp. 1269-1272.

Nomura, K et al., "Amorphous Oxide Semiconductor for High-Performance Flexible Thin-Film Transistors," Jpn. J. Appl. Phys. (Japanaese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2; Intermediate Connector with Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4): a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08; SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

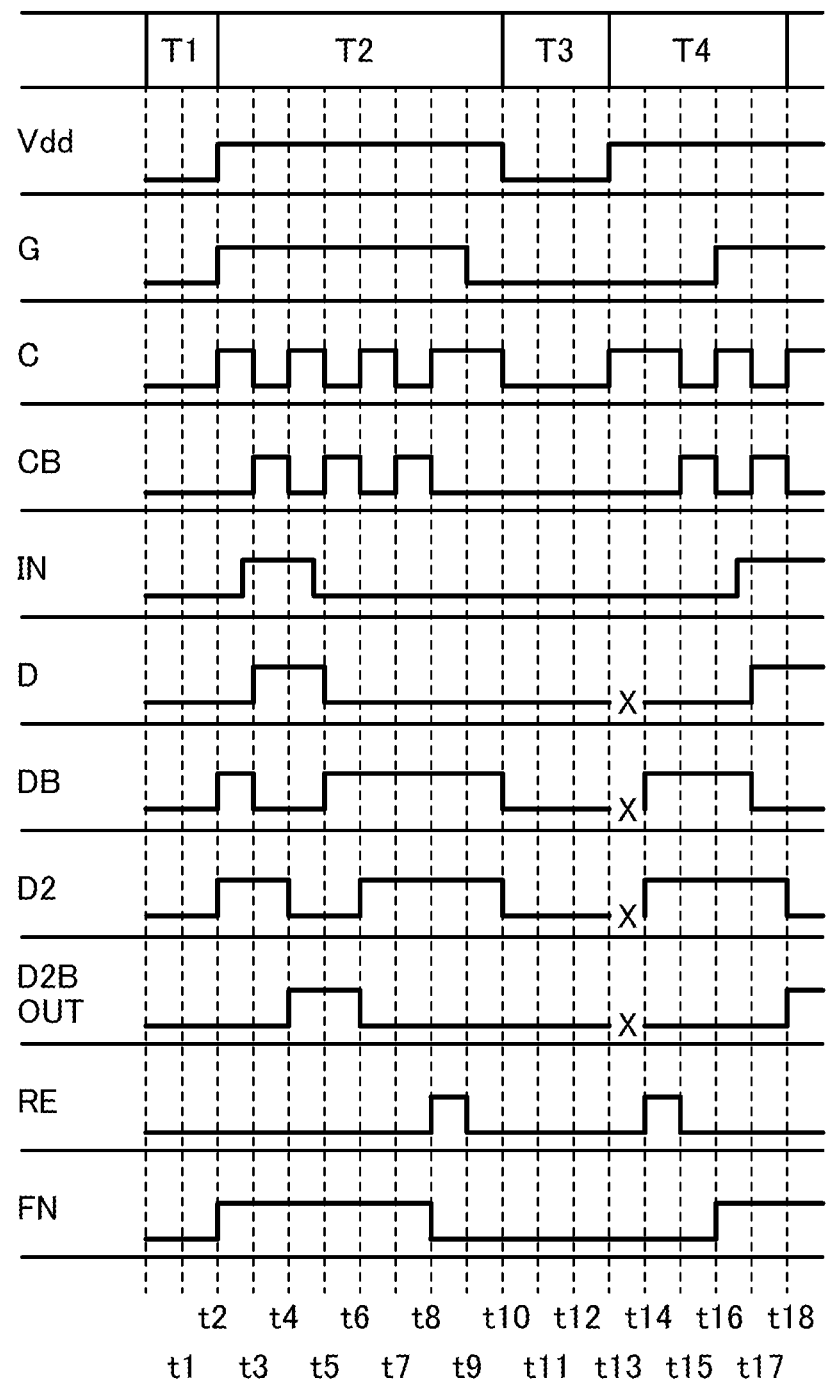

● In
☾ Sn
⌒ Zn
● O

● In
● Ga
● Zn
● O

MEMORY CIRCUIT, SIGNAL PROCESSING CIRCUIT, AND ELECTRONIC DEVICE

BACKGROUND OF THE INVENTION

1. Field of the Invention

The present invention relates to a nonvolatile memory circuit that can keep a stored logic state even after power is turned off. Further, the present invention relates to a memory device and a signal processing circuit including the memory circuit. Furthermore, the present invention relates to an electronic device including the signal processing circuit.

2. Description of the Related Art

A signal processing circuit such as a central processing unit (CPU) has a variety of configurations depending on its application but is generally provided with some kinds of memory circuits such as a register and a cache memory as well as a main memory for storing data or a program.

In a memory circuit such as a register or a cache memory, reading and writing of data needs to be performed at higher speed than in a main memory. Thus, in general, a flip-flop or the like is used as a register, and a static random access memory (SRAM) or the like is used as a cache memory. That is, a volatile memory circuit in which data is erased when supply of power supply voltage is stopped is used for such a register, a cache memory, or the like.

In order to reduce power consumption, a method for temporarily stopping supply of a power supply voltage to a signal processing circuit in a period during which data is not input and output has been suggested. In the method, a nonvolatile memory circuit is located in the periphery of a volatile memory circuit such as a register or a cache memory, so that the data is temporarily stored in the nonvolatile memory circuit. Thus, the register, the cache memory, or the like holds data even while supply of power supply voltage is stopped in the signal processing circuit (for example, see Patent Document 1).

In addition, in the case where supply of power supply voltage is stopped for a long time in a signal processing circuit, data in a volatile memory circuit is transferred to an external memory device such as a hard disk or a flash memory before the supply of the power supply voltage is stopped, so that the data can be prevented from being erased.

REFERENCE

Patent Document

[Patent Document 1] Japanese Published Patent Application No. H10-078836

SUMMARY OF THE INVENTION

In such a signal processing circuit disclosed in Patent Document 1, a ferroelectric is used for a memory element included in a nonvolatile memory circuit. In the memory element including a ferroelectric, a ferroelectric material is fatigued by repetition of data writing, which causes a problem such as a writing error. As a result, the number of rewriting times is limited. In addition, the data processing speed (hereinafter also referred to as access speed), for example, the speed of reading and writing data is low.

In the case where a flash memory is used as a nonvolatile memory circuit, electrons are injected and released by tunnel current generated by application of high voltage. This leads to a problem, for example, of significant deterioration of memory elements due to repeated data rewriting, and the number of rewrite cycles is therefore limited. In addition, the access speed is slow.

In the case where data of the volatile memory circuit is stored in an external memory device while supply of power supply voltage is stopped in a signal processing circuit, it takes a long time for returning data from the external memory device to the volatile memory circuit. Therefore, such a signal processing circuit is not suitable in the case where the power supply is stopped for a short time so as to reduce power consumption.

In view of the above problems, an object of one embodiment of the present invention is to provide a signal processing circuit including a memory circuit with a novel structure in which a stored logic state is kept even after power is turned off.

In one embodiment of the present invention, a nonvolatile memory circuit is formed using a transistor including an oxide semiconductor and a capacitor connected to one of a source electrode and a drain electrode of the transistor. A transistor including an oxide semiconductor is an n-channel transistor in many cases because of its physical properties. In an n-channel transistor, the speed of writing a high-level potential is slower than that of writing a low-level potential in principle. Therefore, in order to improve the writing speed, a high-level potential is written to a memory circuit in advance, and this state is kept in the case where data to be saved has a high-level potential, whereas a low-level potential is written to the memory circuit in the case where data to be saved has a low-level potential. Thus, a signal processing circuit with improved writing speed can be provided. Details thereof will be described below.

One embodiment of the present invention is a memory circuit including a first circuit having two input terminals and one output terminal; a second circuit having two input terminals and one output terminal; a third circuit having two input terminals and one output terminal; a first switch; a first transistor including an oxide semiconductor; a first capacitor; a first inverter; and a second inverter. One of the input terminals of the first circuit is connected to a signal line to which a reading signal is supplied, the other of the input terminals of the first circuit is connected to one of a source electrode and a drain electrode of the first transistor, and the output terminal of the first circuit is connected to an input terminal of the first switch. One of the input terminals of the second circuit is connected to a signal line to which the reading signal is supplied, the other of the input terminals of the second circuit is connected to an output terminal of the first switch, and the output terminal of the second circuit is connected to the other of the source electrode and the drain electrode of the first transistor. One of the input terminals of the third circuit is connected to an output terminal of the first inverter, the other of the input terminals of the third circuit is connected to the signal line to which the reading signal is supplied, the output terminal of the third circuit is connected to an input terminal of the second inverter and a first control terminal of the first switch, and an output terminal of the second inverter is connected to a second control terminal of the first switch. A gate electrode of the first transistor is connected to a signal line to which a control signal is supplied. The signal line to which the control signal is supplied is connected to an input terminal of the first inverter. One of electrodes of the first capacitor is connected to the one of the source electrode and the drain electrode of the first transistor, and the other of the electrodes of the first capacitor is grounded. A low-level potential is supplied to either of the input terminals of the second circuit before supply of a power supply voltage is stopped. A high-level potential is supplied between the other of the source electrode and the drain electrode of the first transistor and the first capacitor.

In the above structure, the first transistor preferably includes an oxide semiconductor material containing In, Ga, and Zn. With an oxide semiconductor material containing In, Ga, and Zn, off-state current can be extremely small.

Another embodiment of the present invention is a signal processing circuit including the above memory circuit; a second switch; a third inverter; a third switch; a fourth inverter; a fourth switch; a fifth inverter; and a sixth inverter. An input terminal of the second switch is connected to a signal line to which an input signal is supplied, and an output terminal of the second switch is connected to an input terminal of the third inverter and an output terminal of the fourth inverter. An output terminal of the third inverter is connected to an input terminal of the third switch. An output terminal of the third switch is connected to an input terminal of the fourth inverter and an input terminal of the fourth switch. An output terminal of the fourth switch is connected to an input terminal of the fifth inverter and an output terminal of the sixth inverter. An output terminal of the fifth inverter is connected to an input terminal of the sixth inverter. The memory circuit is connected to the third switch.

The above memory circuit preferably has the following structure: the first circuit includes a second transistor, a third transistor, a fourth transistor, and a fifth transistor; one of a source electrode and a drain electrode of the second transistor is connected to a signal line to which a power supply potential is supplied; the other of the source electrode and the drain electrode of the second transistor is connected to one of a source electrode and a drain electrode of the third transistor; the other of the source electrode and the drain electrode of the third transistor is connected to one of a source electrode and a drain electrode of the fourth transistor; the other of the source electrode and the drain electrode of the fourth transistor is grounded; a gate electrode of the second transistor and a gate electrode of the third transistor are connected to the signal line to which the reading signal is supplied; one of a source electrode and a drain electrode of the fifth transistor is connected to a signal line to which the power supply potential is supplied; the other of the source electrode and the drain electrode of the fifth transistor is connected to the other of the source electrode and the drain electrode of the second transistor; a gate electrode of the fifth transistor is connected to a gate electrode of the fourth transistor; and the one of the source electrode and the drain electrode of the first transistor is connected to the gate electrode of the fourth transistor.

The above memory circuit preferably has the following structure: the first circuit includes a second transistor, a third transistor, a fourth transistor, and a second capacitor; one of a source electrode and a drain electrode of the second transistor is connected to a signal line to which a power supply potential is supplied; the other of the source electrode and the drain electrode of the second transistor is connected to one of a source electrode and a drain electrode of the third transistor; the other of the source electrode and the drain electrode of the third transistor is connected to one of a source electrode and a drain electrode of the fourth transistor; the other of the source electrode and the drain electrode of the fourth transistor is grounded; a gate electrode of the second transistor and a gate electrode of the third transistor are connected to the signal line to which the reading signal is supplied; one of electrodes of the second capacitor is connected to the other of the source electrode and the drain electrode of the second transistor; the other of the electrodes of the second capacitor is grounded; and the one of the source electrode and the drain electrode of the first transistor is connected to a gate electrode of the fourth transistor.

With the above memory circuit and signal processing circuit, data can be saved in the memory circuit when supply of power supply voltage is stopped. Therefore, it is possible to employ a driving method in which power supply voltage is supplied only when needed (hereinafter, also referred to as normally-off driving method). With such a driving method, power consumption of the memory circuit and the signal processing circuit can be significantly reduced.

The memory circuit includes a first transistor with extremely small off-state current, and a first capacitor having a pair of electrodes one of which is connected to a node (hereinafter referred to as FN) that is brought into a floating state when the first transistor is turned off. In the memory circuit, data is stored by controlling the potential of the one of the pair of electrodes of the first capacitor (or the amount of charge corresponding to the potential) in response to the data. For example, one-bit data can be stored when a state where the first capacitor is charged with given charge (e.g., a high-level potential) corresponds to "1" and a state where the first capacitor is not charged with charge (i.e., the first capacitor is charged with a low-level potential) corresponds to "0".

By turning off the first transistor with extremely small off-state current in the above memory circuit, the potential of the one of the pair of electrodes of the first capacitor can be held for a long time even after the supply of the power supply voltage is stopped. Therefore, in a memory including a memory circuit having the above structure, regular data rewriting (hereinafter also referred to as refresh operation) is not needed or the frequency of refresh operation can be markedly decreased. That is, the above memory circuit can be regarded as a nonvolatile memory circuit.

Further, such a memory circuit stores data in such a manner that a signal potential corresponding to data is input to a predetermined node, a transistor with extremely small off-state current is turned off, and the node is brought into a floating state. Thus, in the memory circuit, it is possible to reduce fatigue of the element due to repetition of data rewriting and to increase data rewrite cycles.

A high-level potential is written to the memory circuit in advance before supply of power supply voltage is stopped. This state is kept in the case where data to be saved has a high-level potential, whereas the high-level potential is rewritten with a low-level potential before the supply of the power supply voltage is stopped in the case where data to be saved has a low-level potential. With such a structure, the writing speed can be improved.

Another embodiment of the present invention is an electronic device including the memory circuit and the signal processing circuit.

Note that a signal processing circuit of the preset invention can be applied to a CPU, a large scale integrated circuit (LSI) such as a microprocessor, an image processing circuit, a digital signal processor (DSP), or a field programmable gate array (FPGA), an arithmetic logic unit (ALU), and the like. The memory can function as a main memory for storing data or a program.

The use of the above nonvolatile memory circuit having a novel structure for a signal processing circuit enables the signal processing circuit to keep holding data for a long time even after supply of power supply voltage is stopped. Thus, normally-off driving can be carried out. Accordingly, power consumption of the signal processing circuit can be drastically reduced. Shortly after the supply of power supply voltage is selected, the signal processing circuit can start predetermined processing with held data. Therefore, time from selection of the supply of power supply voltage to start of the predetermined processing can be shortened in the signal processing circuit.

A high-level potential is written to the memory circuit in advance before supply of power supply voltage is stopped. This state is kept in the case where data to be saved has a high-level potential, whereas the high-level potential is rewritten with a low-level potential before the supply of the power supply voltage is stopped in the case where data to be saved has a low-level potential. With such a structure, the writing speed can be improved.

BRIEF DESCRIPTION OF THE DRAWINGS

FIG. 3 is a timing chart illustrating a driving method of a signal processing circuit.

DETAILED DESCRIPTION OF THE INVENTION

Figure 1A:
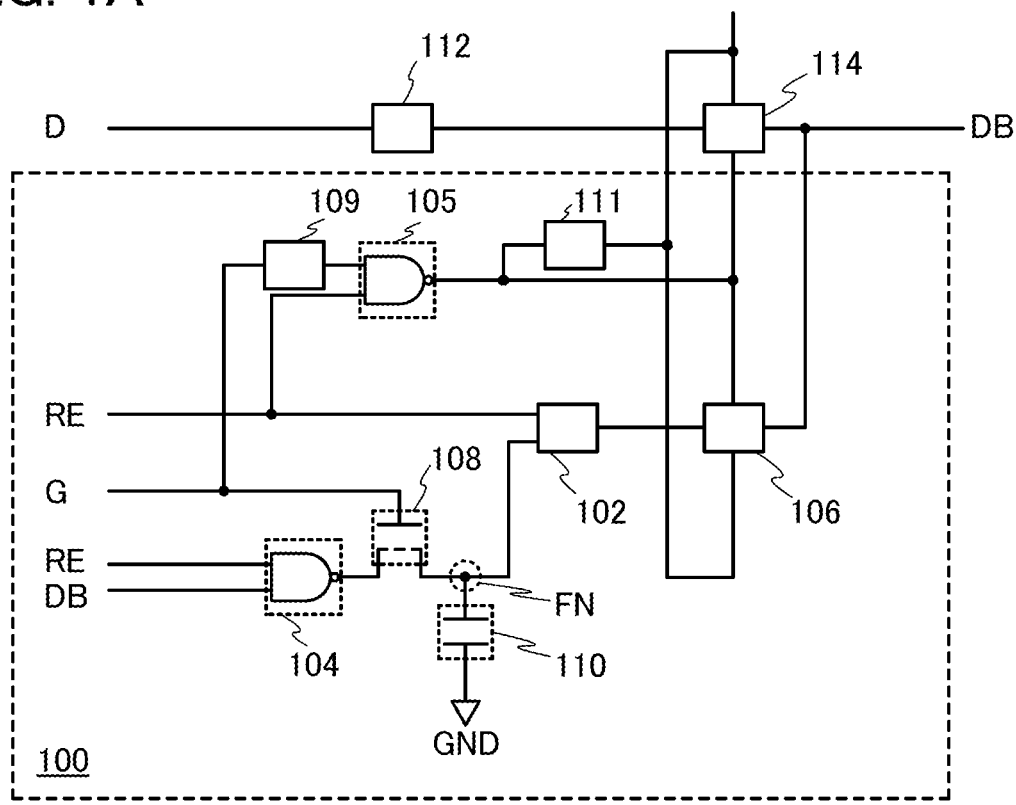
FIGS. 1A and 1B illustrate a configuration of a signal processing circuit.

Hereinafter, embodiments of the present invention will be described in detail with reference to the accompanying drawings. Note that the present invention is not limited to the following description and it is easily understood by those skilled in the art that the mode and details can be variously changed without departing from the spirit and scope of the present invention. Therefore, the present invention should not be interpreted as being limited to the description in the following embodiments.

Functions of a "source" and a "drain" are sometimes interchanged with each other when a transistor of opposite polarity is used or when the direction of current flow is changed in circuit operation, for example. Therefore, the terms "source" and "drain" can be used to denote the drain and the source, respectively, in this specification.

Note that voltage refers to a potential difference between a predetermined potential and a reference potential (e.g., a ground potential) in many cases. Accordingly, in this specification, voltage, potential and a potential difference can be referred to as potential, voltage, and a voltage difference, respectively.

In this specification and the like, the terms "over" and "below" do not necessarily mean "directly on" and "directly below", respectively, in the description of a positional relationship between components. For example, the expression "a gate electrode over a gate insulating film" can mean the case where there is an additional component between the gate insulating film and the gate electrode.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal numbers such as "first", "second", and "third" are used in order to avoid confusion among components.

[Embodiment 1]

Figure 1B:
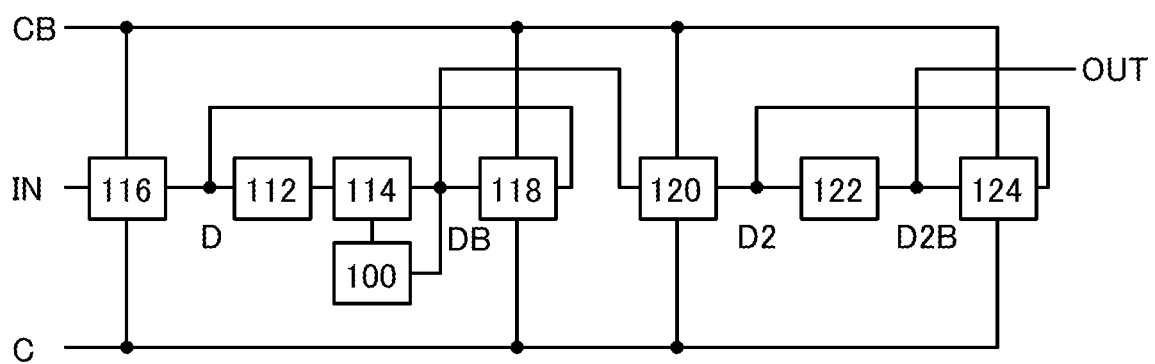

One embodiment of the present invention will be described with reference to FIGS. 1A and 1B. FIGS. 1A and 1B illustrate configurations of a memory circuit and a signal processing circuit according to one embodiment of the present invention.

<Configuration of Memory Circuit>

A memory circuit 100 illustrated in FIG. 1A includes a first circuit 102 having two input terminals and one output terminal, a second circuit 104 having two input terminals and one output terminal, a third circuit 105 having two input terminals and one output terminal, a first switch 106, a first transistor 108 including an oxide semiconductor, a first capacitor 110, a first inverter 109, and a second inverter 111. Note that the memory circuit 100 is connected to control terminals of a third switch 114 and an output terminal of the third switch 114. An input terminal of the third switch 114 is connected to a third inverter 112.

One of the input terminals of the first circuit 102 is connected to a signal line to which a reading signal (RE) is supplied. The other of the input terminals of the first circuit 102 is connected to one of a source electrode and a drain electrode of the first transistor 108. The output terminal of the first circuit 102 is connected to an input terminal of the first switch 106.

One of the input terminals of the second circuit 104 is connected to a signal line to which the reading signal (RE) is supplied. The other of the input terminals of the second circuit 104 is connected to a signal line to which a potential equivalent to a potential supplied to the output terminal of the third switch 114 is supplied. The output terminal of the second circuit 104 is connected to the other of the source electrode and the drain electrode of the first transistor 108.

One of the input terminals of the third circuit 105 is connected to an output terminal of the first inverter 109. The other of the input terminals of the third circuit 105 is connected to the signal line to which the reading signal (RE) is supplied. The output terminal of the third circuit 105 is connected to an input terminal of the second inverter 111 and a first control terminal of the first switch 106.

An output terminal of the second inverter 111 is connected to a second control terminal of the first switch 106 and a first control terminal of the third switch 114. A second control terminal of the third switch 114 is connected to the first control terminal of the first switch 106. An input terminal of the third inverter 112 is connected to a signal line to which a signal (D) is supplied.

Note that a point where an output terminal of the first switch 106 and the output terminal of the third switch 114 are connected to each other is referred to as a node DB, and a signal (DB) supplied to the node DB is also supplied to the other of the input terminals of the second circuit 104.

In the case where at least one of the reading signal (RE) and the signal (DB) input to the second circuit 104 has a low-level potential, the second circuit 104 outputs a high-level potential. For example, the second circuit 104 outputs a high-level potential in the following cases: the case where the reading signal (RE) has a high-level potential and the signal (DB) has a low-level potential; the case where the reading signal (RE) has a low-level potential and the signal (DB) has a high-level potential; and the case where the reading signal (RE) and the signal (DB) each have a low-level potential.

A gate electrode of the first transistor 108 is connected to a signal line to which a control signal (G) is supplied. The control signal (G) can be controlled independently. The control signal (G) is supplied to an input terminal of the first inverter 109.

The first transistor 108 includes an oxide semiconductor (OS), and a portion corresponding to a channel region of the first transistor 108 is shown with a dashed line in FIG. 1A, unlike in the case of a general transistor.

The one of the source electrode and the drain electrode of the first transistor 108 is connected to one electrode of the first capacitor 110. The other electrode of the first capacitor 110 is grounded. In FIG. 1A, a point where the one of the source electrode and the drain electrode of the first transistor 108 and the one electrode of the first capacitor 110 are connected to each other is denoted by "FN" (floating node). By turning off the first transistor 108, potentials supplied to FN and the one electrode of the first capacitor 110 can be held.

The off-state current of the first transistor 108 is extremely small because the channel formation region of the first transistor 108 includes an oxide semiconductor. The off-state current of the first transistor 108 including an oxide semiconductor is smaller than or equal to one hundred thousandth of the off-state current of a transistor including a silicon semiconductor or the like; thus, loss of the charge accumulated in FN due to leakage current of the first transistor 108 is negligible. That is, with the first transistor 108 including an oxide semiconductor, a nonvolatile memory circuit that can hold data without power supply can be achieved.

Here, a configuration that can be used for the first circuit 102 is described with reference to FIG. 4A.

<Configuration of First Circuit>

Figure 4A:
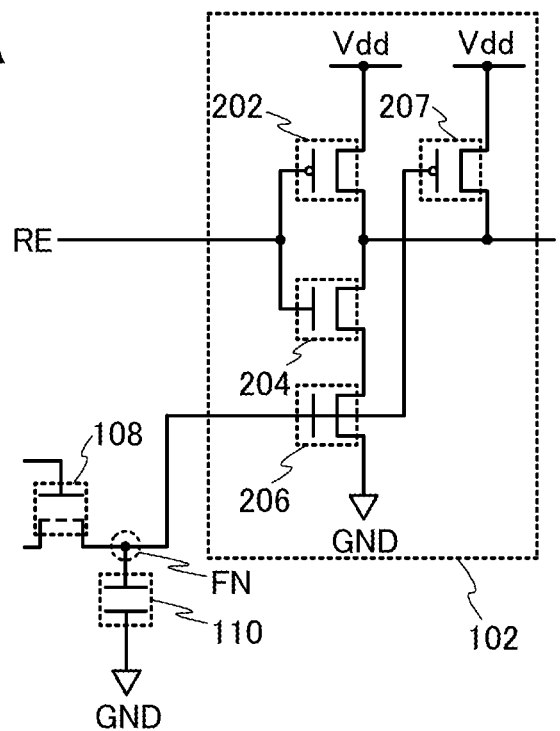
FIGS. 4A and 4B each illustrate a configuration of a signal processing circuit.

The first circuit 102 illustrated in FIG. 4A forms a NAND circuit, which includes a second transistor 202, a third transistor 204, a fourth transistor 206, and a fifth transistor 207.

The second transistor 202 and the fifth transistor 207 have one conductivity type (e.g., p-type conductivity), and the third transistor 204 and the fourth transistor 206 have a conductivity type (e.g., n-type conductivity) different from that of the second transistor 202 and the fifth transistor 207.

One of a source electrode and a drain electrode of the second transistor 202 is connected to a potential line to which a power supply voltage (Vdd) is supplied, and the other thereof is connected to one of a source electrode and a drain electrode of the third transistor 204. The other of the source electrode and the drain electrode of the third transistor 204 is connected to one of a source electrode and a drain electrode of the fourth transistor 206, and the other of the source electrode and the drain electrode of the fourth transistor 206 is grounded. A gate electrode of the second transistor 202 and a gate electrode of the third transistor 204 can be used as potential lines to which the reading signal (RE) is supplied.

A gate electrode of the fourth transistor 206 is connected to FN and a gate electrode of the fifth transistor 207. One of a source electrode and a drain electrode of the fifth transistor 207 is connected to a potential line to which the power supply voltage (Vdd) is supplied. The other of the source electrode and the drain electrode of the fifth transistor 207 is connected to the other of the source electrode and the drain electrode of the second transistor 202 and the one of the source electrode and the drain electrode of the third transistor 204.

Note that there is no particular limitation on materials that can be used for the second transistor 202, the third transistor 204, the fourth transistor 206, and the fifth transistor 207. A material with which the transistor can operate at high speed is preferable; for example, single crystal silicon, an oxide semiconductor, or the like can be used.

Next, a configuration of the signal processing circuit in FIG. 1B will be described.

<Configuration of Signal Processing Circuit>

The signal processing circuit in FIG. 1B includes a second switch 116, the third inverter 112, the third switch 114, a fourth inverter 118, a fourth switch 120, a fifth inverter 122, a sixth inverter 124, and the memory circuit 100.

An input terminal of the second switch 116 is connected to a signal line to which an input signal (IN) is supplied, and an output terminal thereof is connected to an input terminal of the third inverter 112 and an output terminal of the fourth inverter 118. An output terminal of the third inverter 112 is connected to an input terminal of the third switch 114, and an output terminal of the third switch 114 is connected to an input terminal of the fourth inverter 118 and an input terminal of the fourth switch 120.

An output terminal of the fourth switch 120 is connected to an input terminal of the fifth inverter 122 and an output terminal of the sixth inverter 124. An output terminal of the fifth inverter 122 is connected to an input terminal of the sixth inverter 124. Note that the potential of a point where the fifth inverter 122 and the sixth inverter 124 are connected to each other is output as an output signal (OUT).

A point where the second switch 116 and the third inverter 112 are connected to each other is referred to as a node D. A point where the third switch 114 and the fourth inverter 118 are connected to each other is referred to as a node DB. A point where the fourth switch 120 and the fifth inverter 122 are connected to each other is referred to as a node D2. A point where the fifth inverter 122 and the sixth inverter 124 are connected to each other is referred to as a node D2B.

Here, the node DB is supplied with a signal (DB) that is an inverted signal of a signal (D) supplied to the node D. The node D2B is supplied with a signal (D2B) that is an inverted signal of a signal (D2) supplied to the node D2.

Note that in this embodiment, an inverted signal has a low-level potential (also referred to as a low potential) when an input signal has a high-level potential (also referred to as a high potential), and has a high-level potential when an input signal has a low-level potential.

Note that in the circuit configuration of FIG. 1B, a feedback loop is formed with the third inverter 112 and the fourth inverter 118 in the case where the power supply voltage is supplied and the first transistor 108 in the memory circuit 100 is on.

When supply of the power supply voltage is stopped, data held in the node DB, that is, the signal (DB) can be saved and held in the memory circuit 100. When the power supply voltage is supplied again, data can be restored by being returned from the memory circuit 100 to the node DB.

In the circuit configuration of FIG. 1B, a clock signal (C) and an inverted clock signal (CB) are each input to the second switch 116, the fourth inverter 118, the fourth switch 120, and the sixth inverter 124.

Note that the second switch 116 and the sixth inverter 124 are on when the clock signal (C) has a low-level potential and the inverted clock signal (CB) has a high-level potential, and are off when the clock signal (C) has a high-level potential and the inverted clock signal (CB) has a low-level potential. Further, the fourth inverter 118 and the fourth switch 120 are on when the clock signal (C) has a high-level potential and the inverted clock signal (CB) has a low-level potential, and are off when the clock signal (C) has a low-level potential and the inverted clock signal (CB) has a high-level potential.

Note that in this embodiment, the operations of the second switch 116, the fourth inverter 118, the fourth switch 120, and the sixth inverter 124 using, without particular limitation, the above potentials are described. For example, the following structure may be employed: the second switch 116 and the sixth inverter 124 are on when the clock signal (C) has a high-level potential and the inverted clock signal (CB) has a low-level potential, and are off when the clock signal (C) has a low-level potential and the inverted clock signal (CB) has a high-level potential; and the fourth inverter 118 and the fourth switch 120 are on when the clock signal (C) has a low-level potential and the inverted clock signal (CB) has a high-level potential, and are off when the clock signal (C) has a high-level potential and the inverted clock signal (CB) has a low-level potential.

Here, a description is given of a driving method of the memory circuit and the signal processing circuit in FIGS. 1A and 1B in the case where, after the power supply voltage is supplied, the supply of the power supply voltage is stopped in order to reduce power consumption and then the power supply voltage is supplied again with reference to FIGS. 1A and 1B, FIG. 2, and FIG. 3.

<Driving Method of Memory Circuit and Signal Processing Circuit>

Figure 2:
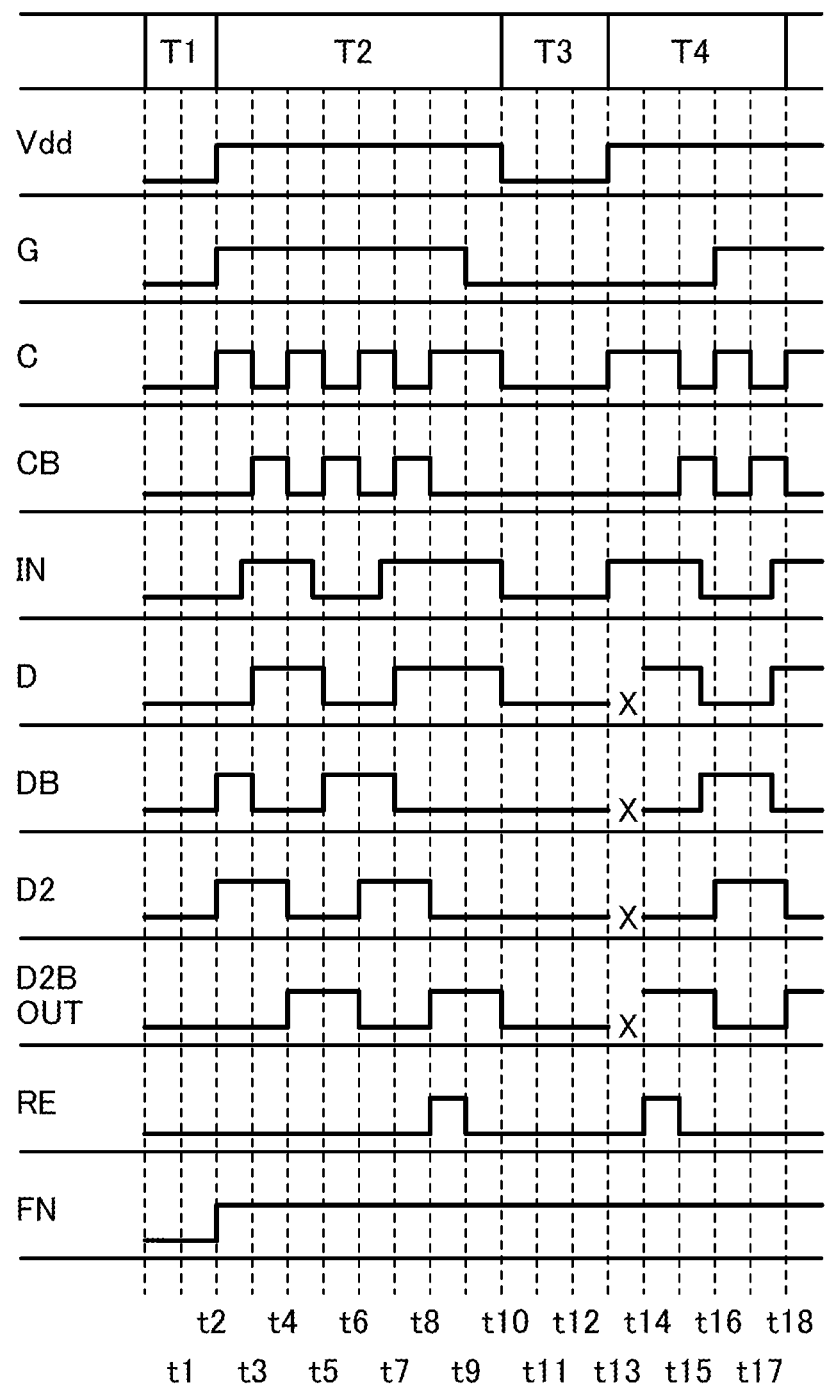
FIG. 2 is a timing chart illustrating a driving method of a signal processing circuit.

FIG. 2 and FIG. 3 are timing charts illustrating a driving method of the memory circuit and the signal processing circuit illustrated in FIGS. 1A and 1B. Note that FIG. 2 is a timing chart in the case where data that is held after the power supply voltage is supplied has a high-level potential, and FIG. 3 is a timing chart in the case where data that is held after the power supply voltage is supplied has a low-level potential.

In the timing charts of FIG. 2 and FIG. 3, Vdd represents the power supply voltage (Vdd), G represents the control signal (G), C represents the clock signal (C), CB represents the inverted clock signal (CB), IN represents the data signal (IN) input to the input terminal, D represents the signal (D) of the node D, DB represents the inverted signal (DB) of the signal of the node D, D2 represents the signal (D2) of the node D2, D2B OUT represents the inverted signal (D2B) of the signal of the node D2 and the signal (OUT) output from the output terminal, FN represents the signal (FN) of the node FN, and RE represents the reading signal (RE). Note that the power supply voltage is not supplied while Vdd is 0 (corresponding to a low-level potential in FIG. 2 and FIG. 3).

Note that in FIG. 2 and FIG. 3, a first period (denoted by T1 in FIG. 2 and FIG. 3) refers to a period in an initial state before the power supply voltage is supplied, a second period (denoted by T2 in FIG. 2 and FIG. 3) refers to a period during which normal operation is performed after the power supply voltage is supplied, a third period (denoted by T3 in FIG. 2 and FIG. 3) refers to a period during which supply of the power supply voltage is stopped, and a fourth period (denoted by T4 in FIG. 2 and FIG. 3) refers to a period after the supply of the power supply voltage is restarted.

In FIG. 2 and FIG. 3, Time t1 to Time t18 are illustrated in order to show the times in the periods, the first period (T1) to the fourth period (T4).

In FIG. 2 and FIG. 3, X represents a state where the signal potential is indeterminate. In an indeterminate state, the signal potential has either a high-level potential or a low-level potential because the clock signal (C) is kept at a high-level potential and thus the second switch 116 is off.

<Initial-state Period and Normal-operation Period>

First, in FIG. 2, in order to terminate the first period (T1) and start the second period (T2), the clock signal (C) and the inverted clock signal (CB) each of whose potentials is periodically changed between a high-level potential and a low-level potential are supplied in the state where the power supply voltage (Vdd) is supplied (in the state where the power supply voltage is larger than 0 V) (Time t2). Note that the clock signal (C) may rise sooner than the power supply voltage (Vdd) because the operation might be unstable when the clock signal (C) rises at the same time as the power supply voltage (Vdd).

Further, the control signal (G) is changed to a high-level potential, so that the first transistor 108 is turned on. Accordingly, the output potential of the second circuit 104 connected to the source electrode or the drain electrode of the first transistor 108 is supplied to FN and the first capacitor 110 (Time t2).

In the second period (T2), the input signal (IN) is supplied to the second switch 116. When the inverted clock signal (CB) having a high-level potential is input to the second switch 116, the second switch 116 is turned on. Since the second switch 116 is turned on, a signal having the same potential as the input signal (IN) is supplied to the node D (Time t3 to Time t4, and the like).

Further, the potential of the node D is supplied to the input terminal of the third inverter 112. The third inverter 112 is a phase inverter circuit, and thus outputs a signal whose phase is the inverse of that of an input signal. The third switch 114 is turned on when the reading signal (RE) has a low-level potential. Note that signal delay actually occurs; thus, after the signal potential of the node D is changed, the potential of the node DB where the third switch 114 and the memory circuit 100 are connected to each other is changed.

Next, the signal (DB) of the node DB is input to the fourth inverter 118 and the fourth switch 120. When the high-level potential of the clock signal (C) is input to the fourth inverter 118 and the fourth switch 120, the fourth inverter 118 and the fourth switch 120 are turned on. Since the fourth switch 120 is turned on, the signal (D2) is supplied to the node D2. The signal (D2) supplied to the node D2 is then input to the fifth inverter 122 and the sixth inverter 124. The fifth inverter 122 outputs the signal (D2B) to the node D2B. The signal (D2B) supplied to the node D2B is then output as OUT (Time t4 to Time t5, and the like).

<Operation Before Stopping Supply of Power Supply Voltage>

The third period (denoted by T3 in FIG. 2) is a period during which the supply of the power supply voltage is stopped. In the second period (T2) just before the third period (T3), the levels (signal potentials) of the clock signal (C) and the inverted clock signal (CB) are fixed before the supply of the power supply voltage is stopped (Time t9 to Time t10). In other words, predetermined data is held with the feedback loop, and the levels (signal potentials) of the clock signal (C) and the inverted signal (CB) remain unchanged. That is, regardless of the fact that the clock signal (C) and the inverted clock signal (CB) are each a signal whose potential is periodically changed between a high-level potential and a low-level potential in normal operation, a clock signal fixed period during which such a change does not occur is provided.

The control signal (G) which is different from the clock signal (C) and the inverted clock signal (CB) is input to the gate of the first transistor 108. That is, the on/off state of the first transistor 108 can be controlled by the control signal (G) at timing independently of the clock signal (C) and the inverted clock signal (CB). Therefore, before supply of power supply voltage to the signal processing circuit is stopped, the first transistor 108 can be turned off while the levels of the clock signal (C) and the inverted clock signal (CB) are kept constant. In this manner, data can be accurately held in the node FN and the first capacitor 110.

Note that in FIG. 2, the signal (DB) has a low-level potential when a high-level potential is input as the reading signal (RE); thus, the second circuit 104 outputs a high-level potential, and the high-level potential is held in the node FN and the first capacitor 110 (Time t8).

<Operation of Stopping Supply of Power Supply Voltage>

The third period (denoted by T3 in FIG. 2) is a period during which the supply of the power supply voltage is stopped. At the time between the second period (T2) and the third period (T3), the supply of the power supply voltage is stopped (Time t10). Note that the first transistor 108 is off at that time. Even after the supply of the power supply voltage (Vdd) to the signal processing circuit is stopped, a signal corresponding to data held with the feedback loop is held in the node FN and the first capacitor 110. Here, the leakage current of the first transistor 108 is extremely small; thus, the signal (potential) held in the node FN and the first capacitor 110 can be prevented from changing.

<Operation of Restarting Supply of Power Supply Voltage>

The fourth period (denoted by T4 in FIG. 2) is a period during which the supply of the power supply voltage is restarted. After the supply of the power supply voltage (Vdd) is restarted, the clock signal (C) and the inverted clock signal (CB) whose levels are fixed at the time of stopping the supply of the power supply voltage (Vdd) are supplied (Time t13).

Next, data held in the node FN and the first capacitor 110 before the supply of the power supply voltage is stopped is read out. Data reading is performed by supplying a high-level potential as the reading signal (RE) (Time t14 to Time t15).

When data is read out, a signal with a high-level potential held in the node FN is supplied to one of the input terminals of the first circuit 102. Further, since the reading signal (RE) that is input to the other input terminal of the first circuit 102 has a high-level potential, the first circuit 102 outputs a low-level potential. When the reading signal (RE) has a high-level potential, the third switch 114 is off and the first switch 106 is on; therefore, the potential of the node DB is the same as the potential of the output from the first circuit 102. Accordingly, the node D, the node DB, the node D2, and the node D2B whose potentials have been in an indeterminate state X are returned to the respective states before the supply of the power supply voltage is stopped (Time t14).

Next, fixing of the levels (signal potentials) of the clock signal (C) and the inverted clock signal (CB) is canceled (Time t15). That is, the clock signal (C) and the inverted clock signal (CB) are each returned to a normal signal whose potential is periodically changed between a high-level potential and a low-level potential.

Then, after data reading is completed, the control signal (G) is supplied to the gate of the first transistor 108 to turn on the first transistor 108 (Time t16). In this manner, a high-level potential is written to the node FN again.

When the supply of the power supply voltage (Vdd) is restarted in a state where the levels of the clock signal (C) and the inverted clock signal (CB) are kept constant in this manner, the potential of the node for holding data in the feedback loop can be prevented from changing.

The above is the driving method of the memory circuit and the signal processing circuit in FIGS. 1A and 1B referring to the timing chart of FIG. 2.

Next, another driving method of the memory circuit and the signal processing circuit in FIGS. 1A and 1B will be described with reference to FIG. 3. FIG. 3 is a timing chart in which a low-level potential is written to the node FN before the supply of the power supply voltage (Vdd) is stopped. A description of portions similar to those described with reference to FIG. 2 is not repeated.

<Initial-state Period and Normal-operation Period>

First, in FIG. 3, in order to terminate the first period (T1) and start the second period (T2), the clock signal (C) and the inverted clock signal (CB) each of whose potentials is periodically changed between a high-level potential and a low-level potential are supplied in the state where the power supply voltage (Vdd) is supplied (in the state where the power supply voltage is larger than 0 V) (Time t2). Note that the clock signal (C) may rise sooner than the power supply voltage (Vdd) because the operation might be unstable when the clock signal (C) rises at the same time as the power supply voltage (Vdd).

Further, the control signal (G) is changed to a high-level potential, so that the first transistor 108 is turned on. Accordingly, the output potential of the second circuit 104 connected to the source electrode or the drain electrode of the first transistor 108 is supplied to the node FN and the first capacitor 110 (Time t2).

Next, the input signal (IN) is supplied to the second switch 116. When the inverted clock signal (CB) having a high-level potential is input to the second switch 116, the second switch 116 is turned on. Since the second switch 116 is turned on, a signal having the same potential as the input signal (IN) is supplied to the node D (Time t3 to Time t4, and the like).

Further, the potential of the node D is supplied to the input terminal of the third inverter 112. The third inverter 112 is a phase inverter circuit, and thus outputs a signal whose phase is the inverse of that of an input signal. The third switch 114 is turned on when the reading signal (RE) has a low-level potential. Note that signal delay actually occurs; thus, after the signal potential of the node D is changed, the potential of the node DB where the third switch 114 and the memory circuit 100 are connected to each other is changed.

Next, the signal (DB) of the node DB is input to the fourth inverter 118 and the fourth switch 120. When the high-level potential of the clock signal (C) is input to the fourth inverter 118 and the fourth switch 120, the fourth inverter 118 and the fourth switch 120 are turned on. Since the fourth switch 120 is turned on, the signal (D2) is supplied to the node D2. The signal (D2) supplied to the node D2 is then input to the fifth inverter 122 and the sixth inverter 124. The fifth inverter 122 outputs the signal (D2B) to the node D2B. The signal (D2B) supplied to the node D2B is then output as OUT (Time t4 to Time t5, and the like).

<Operation Before Stopping Supply of Power Supply Voltage>

The third period (denoted by T3 in FIG. 3) is a period during which the supply of the power supply voltage is stopped. In the second period (T2) just before the third period (T3), the levels (signal potentials) of the clock signal (C) and the inverted clock signal (CB) are fixed before the supply of the power supply voltage is stopped (Time t9 to Time t10). In other words, predetermined data is held with the feedback loop, and the levels (signal potentials) of the clock signal (C) and the inverted signal (CB) remain unchanged. That is, regardless of the fact that the clock signal (C) and the inverted clock signal (CB) are each a signal whose potential is periodically changed between a high-level potential and a low-level potential in normal operation, a clock signal fixed period during which such a change does not occur is provided.

The control signal (G) which is different from the clock signal (C) and the inverted clock signal (CB) is input to the gate of the first transistor 108. That is, the on/off state of the first transistor 108 can be controlled by the control signal (G) at timing independently of the clock signal (C) and the inverted clock signal (CB). Therefore, before supply of power supply voltage to the signal processing circuit is stopped, the first transistor 108 can be turned off while the levels of the clock signal (C) and the inverted clock signal (CB) are kept constant. In this manner, data can be accurately held in the node FN and the first capacitor 110.

Note that in FIG. 3, the signal (DB) has a high-level potential when a high-level potential is input as the reading signal (RE); thus, the second circuit 104 outputs a low-level potential, and the low-level potential is held in the node FN and the first capacitor 110 (Time t8).

<Operation of Stopping Supply of Power Supply Voltage>

The third period (denoted by T3 in FIG. 3) is a period during which the supply of the power supply voltage is stopped. At the time between the second period (T2) and the third period (T3), the supply of the power supply voltage is stopped (Time t10). Note that the first transistor 108 is off at that time. Even after the supply of the power supply voltage (Vdd) to the signal processing circuit is stopped, a signal corresponding to data held with the feedback loop is held in the node FN and the first capacitor 110. Here, the leakage current of the first transistor 108 is extremely small; thus, the signal (potential) held in the node FN and the first capacitor 110 can be prevented from changing.

<Operation of Restarting Supply of Power Supply Voltage>

The fourth period (denoted by T4 in FIG. 3) is a period during which the supply of the power supply voltage is restarted. After the supply of the power supply voltage (Vdd) is restarted, the clock signal (C) and the inverted clock signal (CB) whose levels are fixed at the time of stopping the supply of the power supply voltage (Vdd) are supplied (Time t13).

Next, data held in the node FN and the first capacitor 110 before the supply of the power supply voltage is stopped is read out. Data reading is performed by supplying a high-level potential as the reading signal (RE) (Time t14 to Time t15).

When data is read out, a signal with a high-level potential held in the node FN is supplied to one of the input terminals of the first circuit 102. Further, since the reading signal (RE) that is input to the other input terminal of the first circuit 102 has a high-level potential, the first circuit 102 outputs a low-level potential. When the reading signal (RE) has a high-level potential, the third switch 114 is off and the first switch 106 is on; therefore, the potential of the node DB is the same as the potential of the output from the first circuit 102. Accordingly, the node D, the node DB, the node D2, and the node D2B whose potentials have been in an indeterminate state X are returned to the respective states before the supply of the power supply voltage is stopped (Time t14).

Next, fixing of the levels (signal potentials) of the clock signal (C) and the inverted clock signal (CB) is canceled (Time t15). That is, the clock signal (C) and the inverted clock signal (CB) are each returned to a normal signal whose level (signal potential) is periodically changed between a high-level potential and a low-level potential.

Then, after data reading is completed, the control signal (G) is supplied to the gate of the first transistor 108 to turn on the first transistor 108 (Time t16). In this manner, a high-level potential is written to the node FN again.

When the supply of the power supply voltage (Vdd) is restarted in a state where the levels of the clock signal (C) and the inverted clock signal (CB) are kept constant in this manner, the potential of the node for holding data in the feedback loop can be prevented from changing.

The above is the driving method of the memory circuit and the signal processing circuit in FIGS. 1A and 1B referring to the timing chart of FIG. 3.

As described above, in the memory circuit and the signal processing circuit of this embodiment, a high-level potential is written in advance to the node FN in the memory circuit. This state is kept in the case where data to be saved has a high-level potential, and the high-level potential is rewritten with a low-level potential just before the power is turned off in the case where data to be saved has a low-level potential. With such a structure, the writing speed can be improved.

By applying the above-described memory circuit and signal processing circuit to a memory device such as a register or a cache memory, data in the memory device can be prevented from being erased owing to the stop of the supply of the power supply voltage. Further, shortly after the supply of the power supply voltage is restarted, the memory device can be returned to the same state as that before the power supply is stopped. Therefore, even for a short time when the memory device is in a standby state, the power supply can be stopped in the entire signal processing circuit or one or a plurality of logic circuits included in the signal processing circuit. Accordingly, it is possible to provide a signal processing circuit with low power consumption and a driving method of the signal processing circuit with low power consumption.

This embodiment can be implemented in combination with any of the other embodiments as appropriate.

[Embodiment 2]

In this embodiment, a circuit configuration including the first circuit 102 described in Embodiment 1, which is different from the circuit configuration of FIG. 4A, will be described with reference to FIG. 4B. Note that the portions described in Embodiment 1 are denoted by the same reference numerals, and the description is not repeated.

Figure 4B:
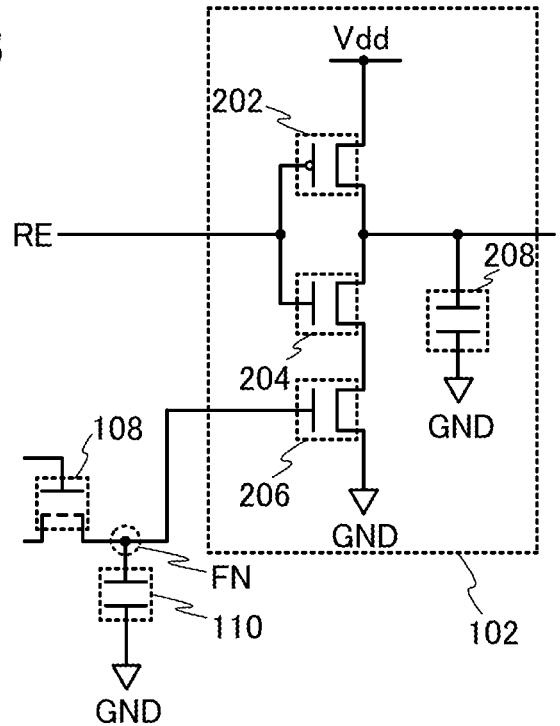

The first circuit 102 illustrated in FIG. 4B includes the second transistor 202, the third transistor 204, the fourth transistor 206, and a second capacitor 208.

The second transistor 202 has one conductivity type (e.g., p-type conductivity), and the third transistor 204 and the fourth transistor 206 have a conductivity type (e.g., n-type conductivity) different from that of the second transistor 202.

The second transistor 202, the third transistor 204, and the fourth transistor 206 are connected in series. A gate electrode of the second transistor 202 and a gate electrode of the third transistor 204 are connected to each other, and they can be used as potential lines to which the reading signal (RE) is supplied as in Embodiment 1. A gate electrode of the fourth transistor 206 is connected to FN.

One of a source electrode and a drain electrode of the second transistor 202 is connected to a potential line to which a power supply voltage (Vdd) is supplied, and the other thereof is connected to one of a source electrode and a drain electrode of the third transistor 204. The other of the source electrode and the drain electrode of the third transistor 204 is connected to one of a source electrode and a drain electrode of the fourth transistor 206, and the other of the source electrode and the drain electrode of the fourth transistor 206 is grounded.

The other of the source electrode and the drain electrode of the second transistor 202 and the one of the source electrode and the drain electrode of the third transistor 204 are connected to one electrode of the second capacitor 208, and the other electrode of the second capacitor 208 is grounded.

Note that there is no particular limitation on materials that can be used for the second transistor 202, the third transistor 204, and the fourth transistor 206. A material with which the transistor can operate at high speed is preferable; for example, single crystal silicon, an oxide semiconductor, or the like can be used.

As described in Embodiment 1, a high-level potential is supplied to FN before supply of the power supply voltage is stopped. Since the reading signal (RE) is at low level except when data is read out and the second transistor 202 is a p-channel transistor, the second transistor 202 is turned on and the power supply voltage (Vdd) is supplied to the second capacitor 208.

Note that the circuit configuration of FIG. 4B described in this embodiment is favorable because the number of transistors can be smaller than that of the circuit configuration of FIG. 4A. Further, power consumption can be reduced as compared to the case of the circuit configuration of FIG. 4A. For example, in the case where the first circuit 102 illustrated in FIG. 4A is used, the second transistor 202 is turned off and the third transistor 204 is turned on when the reading signal (RE) has a high-level potential. Since the node FN keeps a high-level potential, the high-level potential is supplied to the gate electrode of the fourth transistor 206. Therefore, through the fifth transistor 207 and the fourth transistor 206, the power supply voltage (Vdd) might flow as through current; generation of the through current might lead to an increase in power consumption. The fifth transistor 207 is not provided in the circuit configuration of FIG. 4B, which is favorable because an increase in power consumption due to the through current can be suppressed.

This embodiment can be implemented in combination with any of the other embodiments as appropriate.

[Embodiment 3]

In this embodiment, a memory processing device having a plurality of circuits where the memory circuit and the signal processing circuit described in Embodiment 1 are included will be described with reference to FIG. 5.

Figure 5:
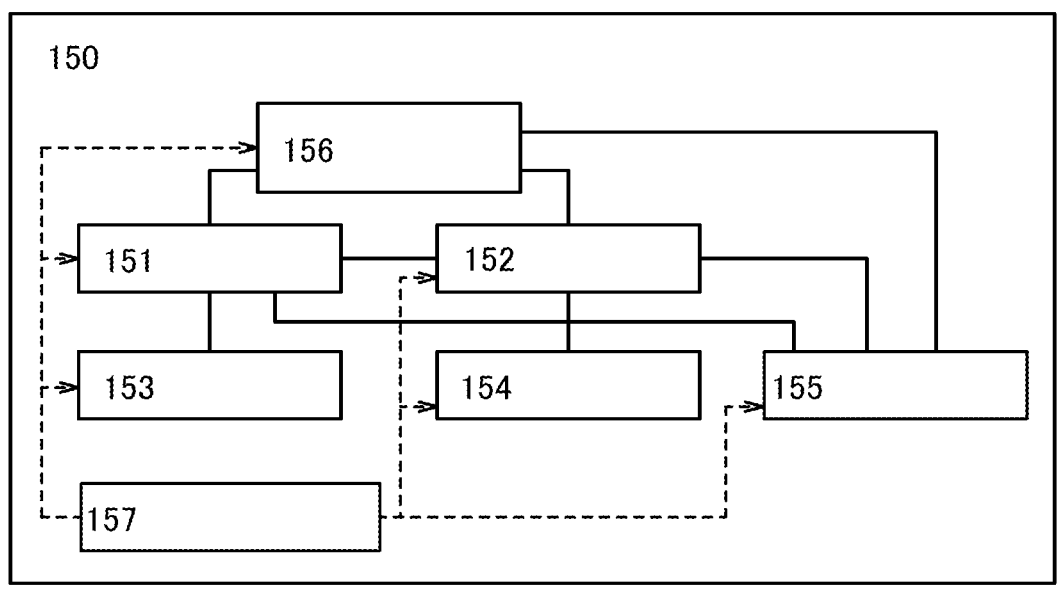
FIG. 5 illustrates a structure of a memory processing device.

FIG. 5 illustrates an example of a memory processing unit according to one embodiment of the present invention. The memory processing unit includes at least one or a plurality of arithmetic circuits and one or a plurality of memory circuits. Specifically, a memory processing unit 150 illustrated in FIG. 5 includes an arithmetic circuit 151, an arithmetic circuit 152, a memory circuit 153, a memory circuit 154, a memory circuit 155, a control circuit 156, and a power supply control circuit 157.

The arithmetic circuits 151 and 152 each include, as well as a logic circuit which carries out simple logic arithmetic processing, an adder, a multiplier, and various arithmetic circuits. The memory circuit 153 functions as a register for temporarily holding data when the arithmetic processing is carried out in the arithmetic circuit 151. The memory circuit 154 functions as a register for temporarily holding data when the arithmetic processing is carried out in the arithmetic circuit 152.

In addition, the memory circuit 155 can be used as a main memory and can store a program executed by the control circuit 156 as data or can store data from the arithmetic circuit 151 and the arithmetic circuit 152.

The control circuit 156 is a circuit which collectively controls operations of the arithmetic circuit 151, the arithmetic circuit 152, the memory circuit 153, the memory circuit 154, and the memory circuit 155 included in the memory processing unit 150.

By using the memory circuit and the signal processing circuit described in Embodiment 1 for the memory circuit 153, the memory circuit 154, and the memory circuit 155, data can be held even when the supply of the power supply voltage to the memory circuit 153, the memory circuit 154, and the memory circuit 155 is stopped. In the above manner, the supply of the power supply voltage to the entire memory processing unit 150 can be stopped, whereby power consumption can be suppressed. Alternatively, the supply of the power supply voltage to one or more of the memory circuits 153, the memory circuit 154, and the memory circuit 155 can be stopped, whereby power consumption of the memory processing unit 150 can be suppressed. Before the supply of the power supply voltage is stopped, data can be written at high speed. Further, shortly after the supply of the power supply voltage is restarted, the memory processing unit can return to the same state as that before the power supply voltage is stopped.

In addition, as well as the supply of the power supply voltage to the memory circuit 153, the memory circuit 154, and the memory circuit 155, the supply of the power supply voltage to the control circuit 156 or the arithmetic circuit 151 or 152 which transmits/receives data to/from the memory circuit 153, the memory circuit 154, and the memory circuit 155 may be stopped. For example, when the arithmetic circuit 151 and the memory circuit 153 are not operated, the supply of the power supply voltage to the arithmetic circuit 151 and the memory circuit 153 may be stopped.

In addition, the power supply control circuit 157 controls the level of the power supply voltage which is supplied to the arithmetic circuit 151, the arithmetic circuit 152, the memory circuit 153, the memory circuit 154, the memory circuit 155, and the control circuit 156 included in the memory processing unit 150. Further, in the case where the supply of the power supply voltage is stopped, a switching element for stopping the supply of the power supply voltage may be provided for the power supply control circuit 157, or for each of the arithmetic circuit 151, the arithmetic circuit 152, the memory circuit 153, the memory circuit 154, the memory circuit 155, and the control circuit 156.

A memory circuit which functions as a cache memory may be provided between the memory circuit 155 that is a main memory and each of the arithmetic circuit 151, the arithmetic circuit 152, and the control circuit 156. By providing the cache memory, low-speed access to the main memory can be reduced and the speed of the signal processing such as arithmetic processing can be higher. By applying the above-described signal processing circuit also to the memory device functioning as a cache memory, power consumption of the memory processing unit 150 can be suppressed. Before the supply of the power supply voltage is stopped, data can be written at high speed. Further, shortly after the supply of the power supply voltage is restarted, the memory processing unit can return to the same state as that before the power supply voltage is stopped.

This embodiment can be implemented in combination with any of the other embodiments as appropriate.

[Embodiment 4]

In this embodiment, a configuration of a CPU, which is one of signal processing circuits according to one embodiment of the present invention, will be described.

Figure 6:
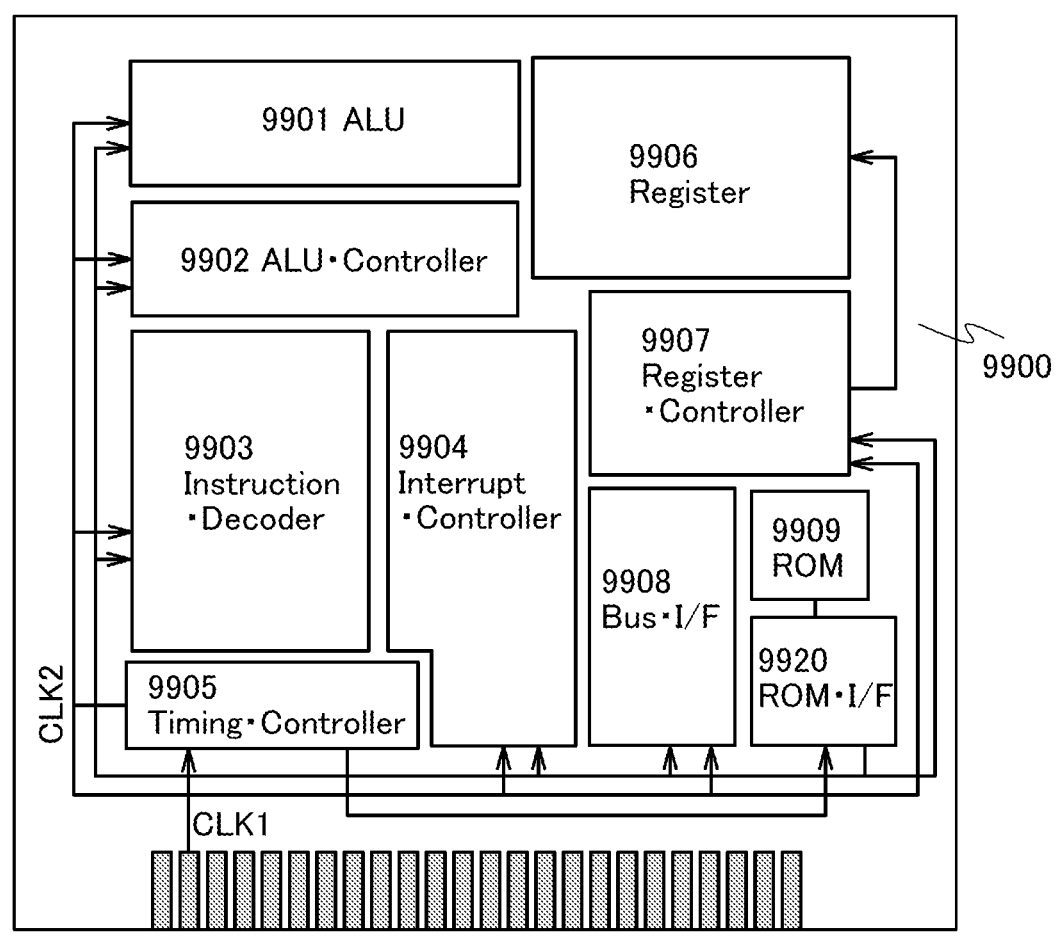
FIG. 6 illustrates a structure of a CPU.

FIG. 6 illustrates a configuration of the CPU in this embodiment. The CPU illustrated in FIG. 6 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900. Further, the ROM 9909 and the ROM I/F 9920 may be provided over different chips. Naturally, the CPU illustrated in FIG. 6 is only an example with a simplified configuration, and an actual CPU may employ a variety of configurations depending on the application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and supplies the clock signal CLK2 to the above circuits.

In the CPU of this embodiment, a memory circuit and a signal processing circuit having the structure described in any of the above embodiments is provided in the register 9906. The register controller 9907 determines, in response to an instruction from the ALU 9901, whether data is temporarily held in the memory circuit of the register 9906.

In such a manner, even in the case where the operation of the CPU is temporarily stopped and the supply of the power supply voltage is stopped, data can be held and power consumption can be reduced. Specifically, for example, while a user of a personal computer does not input data to an input device such as a keyboard, the operation of the CPU can be stopped, so that the power consumption can be reduced.

Although the example of the CPU is described in this embodiment, the signal processing circuit according to one embodiment of the present invention is not limited to the CPU and can be applied to an LSI such as a microprocessor, an image processing circuit, a digital signal processor (DSP), or a field programmable gate array (FPGA).

This embodiment can be implemented in combination with any of the other embodiments as appropriate.

[Embodiment 5]

In this embodiment, a manufacturing method of the memory circuit 100 having the circuit configuration of FIGS. 1A and 1B in Embodiment 1 and the circuit configuration of FIG. 4B in Embodiment 2 will be described. Note that the fourth transistor 206, the first transistor 108 including an oxide semiconductor, and the first capacitor 110 in FIG. 4B will be described as examples for the explanation with reference to FIGS. 7A to 7C, FIGS. 8A to 8C, FIGS. 9A to 9C, and FIG. 10. Note that the other elements included in the memory circuit 100 can be manufactured in a manner similar to that of the fourth transistor 206, the first transistor 108, and the first capacitor 110.

In this embodiment, an example of a manufacturing method in which the fourth transistor 206 is formed using single crystal silicon is described below.

Figure 7A:
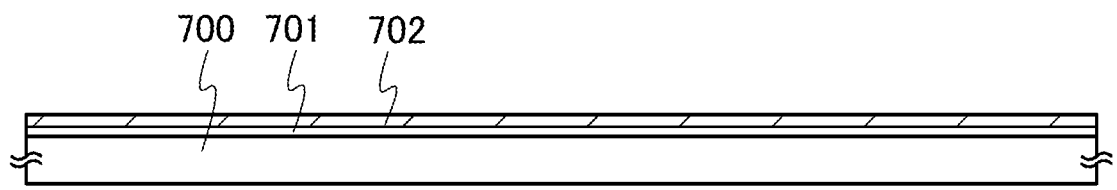
FIGS. 7A to 7C illustrate a manufacturing process of a signal processing circuit.

First, as illustrated in FIG. 7A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where a glass substrate is used and the temperature at which the heat treatment is to be performed later is high, a glass substrate whose strain point is higher than or equal to 730° C. is preferably used.

Note that a specific example of a forming method of the semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 N/cm$^2$ to 500 N/cm$^2$, preferably 11 N/cm$^2$ to 20 N/cm$^2$ is applied to part of the bond substrate and part of the substrate 700 so that the substrates are attached to each other. When the pressure is applied, bonding between the bond substrate and the insulating film 701 starts from the portion, which results in bonding of the entire surface where the bond substrate and the insulating film 701 are in close contact with each other. Subsequently, heat treatment is performed, whereby microvoids that exist in the fragile layer are combined, so that the microvoids increase in volume. Accordingly, a single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which has not been patterned or may be added to the semiconductor film 702 which is formed through the patterning. Alternatively, the impurity element for controlling the threshold voltage may be added to the bond substrate. Further alternatively, the impurity element may be added to the bond substrate in order to roughly control the threshold voltage, and the impurity element may be further added to the semiconductor film which has not been patterned or the semiconductor film 702 which is formed through the patterning in order to finely control the threshold voltage.

Note that although an example in which the single crystal semiconductor film is used is described in this embodiment, the present invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. In the case of using a heat-resistant substrate such as a quartz substrate, it is possible to combine any of the following crystallization methods: a thermal crystallization method using an electrically heated oven, a lamp annealing crystallization method using infrared light, a crystallization method using a catalytic element, and a high-temperature annealing method at approximately 950° C.

Figure 7B:
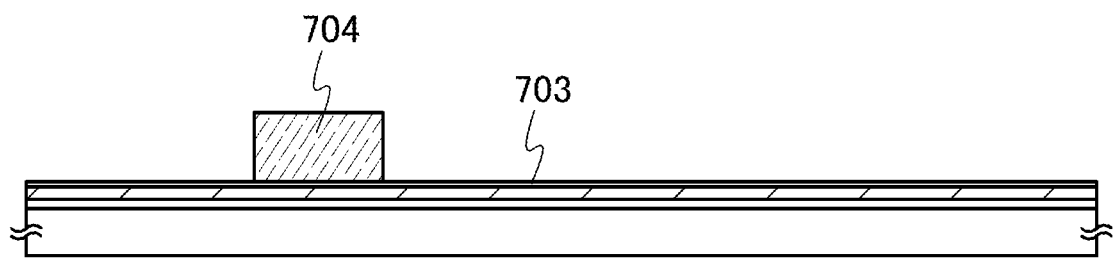

Next, as illustrated in FIG. 7B, a gate insulating film 703 is formed over the semiconductor film 702.

The gate insulating film 703 can be formed by oxidation or nitridation of a surface of the semiconductor film 702 by high-density plasma treatment, heat treatment, or the like. The high-density plasma treatment is performed using, for example, a mixed gas of a rare gas such as He, Ar, Kr, or Xe, and oxygen, nitrogen oxide, ammonia, nitrogen, hydrogen, or the like. In that case, when plasma is excited by introduction of microwaves, plasma with a low electron temperature and high density can be generated. By oxidation or nitridation of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed so as to be in contact with the semiconductor film.

The gate insulating film 703 may be formed using a single layer or a stack of layers using silicon oxide, silicon nitride oxide, silicon oxynitride, silicon nitride, hafnium oxide, lanthanum oxide, aluminum oxide, tantalum oxide, yttrium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen is added, or the like by a plasma CVD method, a sputtering method, or the like.

In this specification, in oxynitride, the amount of oxygen is larger than that of nitrogen, and in nitride oxide, the amount of nitrogen is larger than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by a plasma CVD method.

Next, a gate electrode 704 is formed as illustrated in FIG. 7B.

The gate electrode 704 can be formed in such a manner that a conductive film is formed, and then the conductive film is processed (patterned and etched) into a predetermined shape. The conductive film can be formed by a PECVD method, a sputtering method, an evaporation method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing any of the aforementioned metals or a compound containing any of the aforementioned metals may be used. Alternatively, the conductive film may be formed using a semiconductor such as polycrystalline silicon doped with an impurity element such as phosphorus which imparts conductivity to the semiconductor film.

Note that although the gate electrode 704 is formed of a single-layer conductive film in this embodiment, this embodiment is not limited to this structure. The gate electrode 704 may be formed of a plurality of stacked conductive films.

The gate electrode 704 can be formed in such a manner that the conductive film is etched into a desired tapered shape by an inductively coupled plasma (ICP) etching method in which the etching condition (e.g., the amount of electric power applied to a coil-shaped electrode layer, the amount of electric power applied to an electrode layer on the substrate side, and the electrode temperature on the substrate side) is controlled as appropriate. In addition, angles and the like of the tapered shapes may also be controlled by the shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 7C:
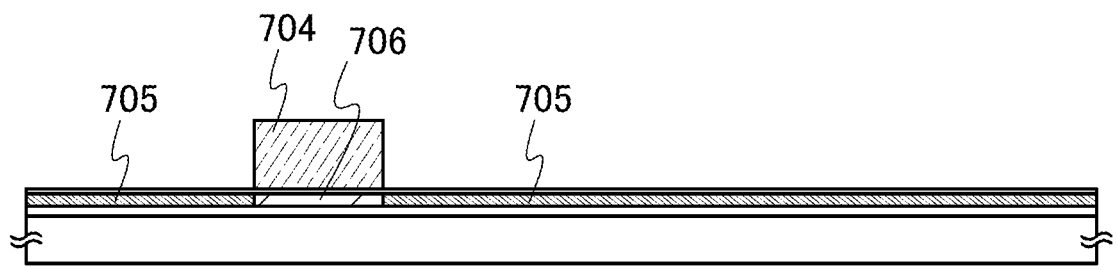

Next, an impurity element imparting one conductivity type is added to the semiconductor film 702 with the use of the gate electrode 704 as a mask, whereby a channel formation region 706 which overlaps with the gate electrode 704 and a pair of impurity regions 705 with the channel formation region 706 interposed therebetween are formed in the semiconductor film 702 as illustrated in FIG. 7C.

In this embodiment, the case where an impurity element imparting n-type conductivity (e.g., phosphorus) is added to the semiconductor film 702 is described as an example.

Figure 8A:
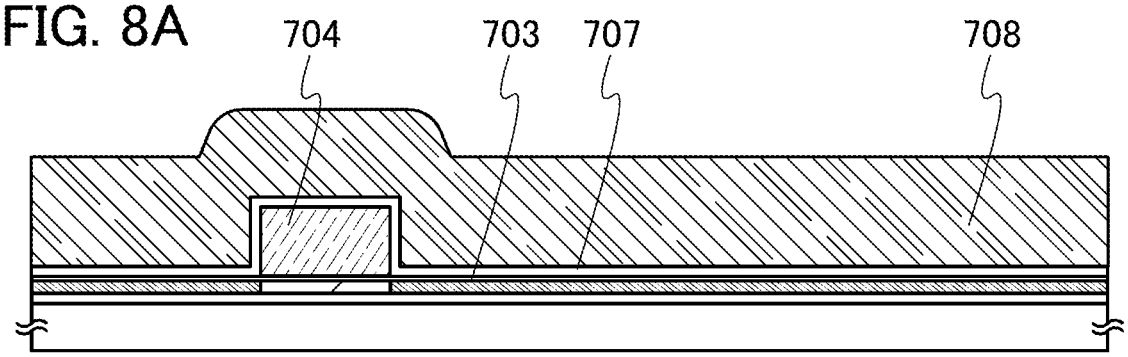
FIGS. 8A to 8C illustrate a manufacturing process of a signal processing circuit.

Next, as illustrated in FIG. 8A, insulating films 707 and 708 are formed so as to cover the gate insulating film 703 and the gate electrode 704. Specifically, an inorganic insulating film of silicon oxide, silicon nitride, silicon nitride oxide, silicon oxynitride, aluminum nitride, aluminum nitride oxide, or the like can be used as the insulating films 707 and 708. In particular, a material with a low dielectric constant (a low-k material) is preferably used for the insulating films 707 and 708, because capacitance due to overlap of electrodes or wirings can be sufficiently reduced. Note that a porous insulating film including such a material may be employed as the insulating films 707 and 708. A porous insulating film has a lower dielectric constant than an insulating film with high density, and thus allows a further reduction in parasitic capacitance generated by electrodes or wirings.

In this embodiment, an example in which silicon oxynitride is used for the insulating film 707 and silicon nitride oxide is used for the insulating film 708 is described. In addition, an example in which the insulating films 707 and 708 are formed over the gate electrode 704 is described in this embodiment; however, in the present invention, only one insulating film may be formed over the gate electrode 704 or a plurality of insulating films of three or more layers may be stacked.

Figure 8B:
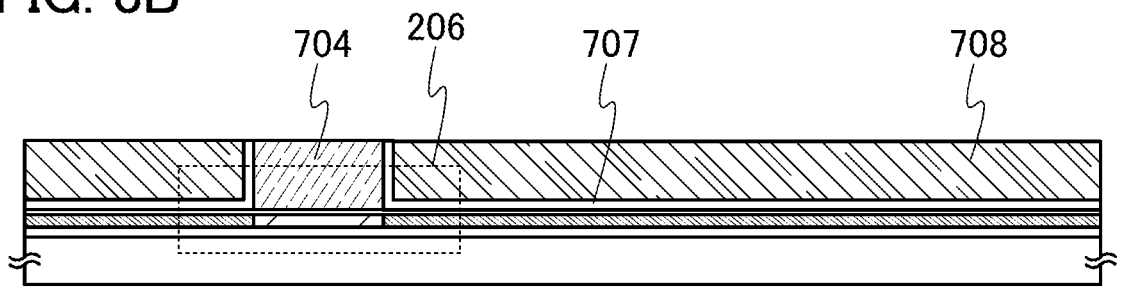

Next, as illustrated in FIG. 8B, the insulating films 707 and 708 are subjected to chemical mechanical polishing (CMP) or etching, so that a surface of the gate electrode 704 is exposed. Note that in order to improve the characteristics of the first transistor 108 which is formed later, surfaces of the insulating films 707 and 708 are preferably flattened as much as possible.

Through the above steps, the fourth transistor 206 can be formed.

Figure 8C:
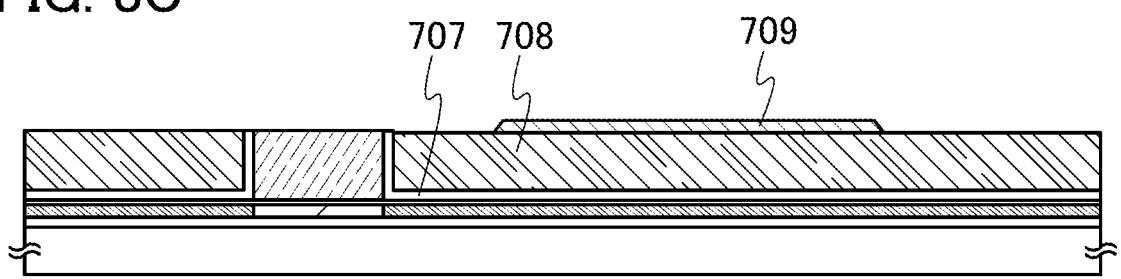

Next, a manufacturing method of the first transistor 108 is described. First, as illustrated in FIG. 8C, an oxide semiconductor layer 709 is formed over the insulating film 708.

The oxide semiconductor layer 709 can be formed by processing an oxide semiconductor film formed over the insulating films 707 and 708 into a desired shape. The thickness of the oxide semiconductor film is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using a metal oxide target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

An oxide semiconductor film to be used preferably contains at least indium (In) or zinc (Zn). In particular, In and Zn are preferably contained. As a stabilizer for reducing changes in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main component, and there is no limitation on the ratio of In:Ga:Zn. Further, the In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on needed semiconductor characteristics (such as mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

For example, it is relatively easy to obtain high mobility with an In—Sn—Zn-based oxide. However, it is possible to obtain high mobility even with an In—Ga—Zn-based oxide by reducing the defect density in a bulk.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor with an amorphous structure, interface scattering can be reduced, and relatively high mobility can be obtained with relative ease.

In an oxide semiconductor having crystallinity, defects in a bulk can be further reduced and when a surface flatness is improved, and mobility higher than that of an oxide semiconductor in an amorphous state can be obtained. In order to improve the surface flatness, the oxide semiconductor is preferably formed on a flat surface. Specifically, the oxide semiconductor may be formed on a surface with an average surface roughness ($R_a$) of 1 nm or less, preferably 0.3 nm or less, more preferably 0.1 nm or less.

Note that the average surface roughness ($R_a$) is obtained by expanding, into three dimensions, center line average roughness that is defined by JIS B 0601 so as to be applied to a surface. The $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \quad \text{[Formula 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents the average height of the plane to be measured. Further, $R_a$ can be measured using an atomic force microscope (AFM).

For the oxide semiconductor film, any of the following oxide semiconductors can be used: a four-component metal oxide such as an In—Sn—Ga—Zn-based oxide semiconductor; a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, a Sn—Al—Zn-based oxide semiconductor, or an Hf—In—Zn-based oxide semiconductor; a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based oxide semiconductor; an In-based oxide semiconductor; a Sn-based oxide semiconductor; and a Zn-based oxide semiconductor.

In this embodiment, as the oxide semiconductor film, an In—Ga—Zn-based oxide semiconductor thin film with a thickness of 30 nm, which is obtained by a sputtering method using a metal oxide target containing indium (In), gallium (Ga), and zinc (Zn), is used. As the target, for example, a target having a composition ratio of In:Ga:Zn=1:1:0.5, In:Ga:Zn=1:1:1, or In:Ga:Zn=1:1:2 in an atomic ratio can be used. The filling rate of the target containing In, Ga, and Zn is greater than or equal to 90% and less than or equal to 100%, preferably greater than or equal to 95% and less than 100%. With the use of the target with high filling rate, a dense oxide semiconductor film is formed.

Alternatively, as the oxide semiconductor film, an In—Sn—Zn-based oxide semiconductor thin film which is obtained by a sputtering method using a metal oxide target containing indium (In), tin (Sn), and zinc (Zn) may be used. In the case where an In—Sn—Zn-based oxide semiconductor material is used as the oxide semiconductor, a target having a composition ratio of In:Sn:Zn=1:2:2, In:Sn:Zn=2:1:3, In:Sn:Zn=1:1:1, In:Sn:Zn=20:45:35, or the like in an atomic ratio is used.

In this embodiment, the oxide semiconductor film is formed in such a manner that the substrate is held in a treatment chamber kept under reduced pressure, an argon gas and an oxygen gas from which hydrogen and moisture are removed are introduced into the treatment chamber while remaining moisture therein is removed, and the above target is used. A high-purity gas is preferably used as a sputtering gas. Specifically, as for the argon gas, it is preferable that the purity be 9N (99.9999999%), the dew point be −121° C., the content of $H_2O$ be 0.1 ppb or lower, and the content of $H_2$ be 0.5 ppb or lower. Further, as for the oxygen gas, it is preferable that the purity be 8N (99.999999%), the dew point be −112° C., the content of $H_2O$ be 1 ppb or lower, and the content of $H_2$ be 1 ppb or lower. With the use of such a high-purity gas, the impurity concentration in the oxide semiconductor film to be formed can be reduced.

The substrate temperature in film formation may be higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo molecular pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

Deposition is preferably performed in the state where the substrate is heated because the defect density in the oxide semiconductor film to be formed is reduced. The field-effect mobility of the transistor is affected by the defect density in the oxide semiconductor film.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at the interface between the semiconductor and an insulating film. When a Levinson model is used, the field-effect mobility that is based on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. When the potential barrier is assumed to be attributed to a defect, the height E of the potential barrier can be expressed as the following formula according to the Levinson model.

$$E = \frac{e^2 N^2}{8\varepsilon n} = \frac{e^3 N_t^2}{8\varepsilon C_{ox} V_g} \quad \text{[Formula 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W\mu V_g V_d C_{ox}}{L} \exp\left(-\frac{E}{kT}\right)$$ [Formula 4]

Here, L represents the channel length and W represents the channel width, and L and W are each 10 μm. Further, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$ [Formula 5]

The right side of Formula 5 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

Figure 17:
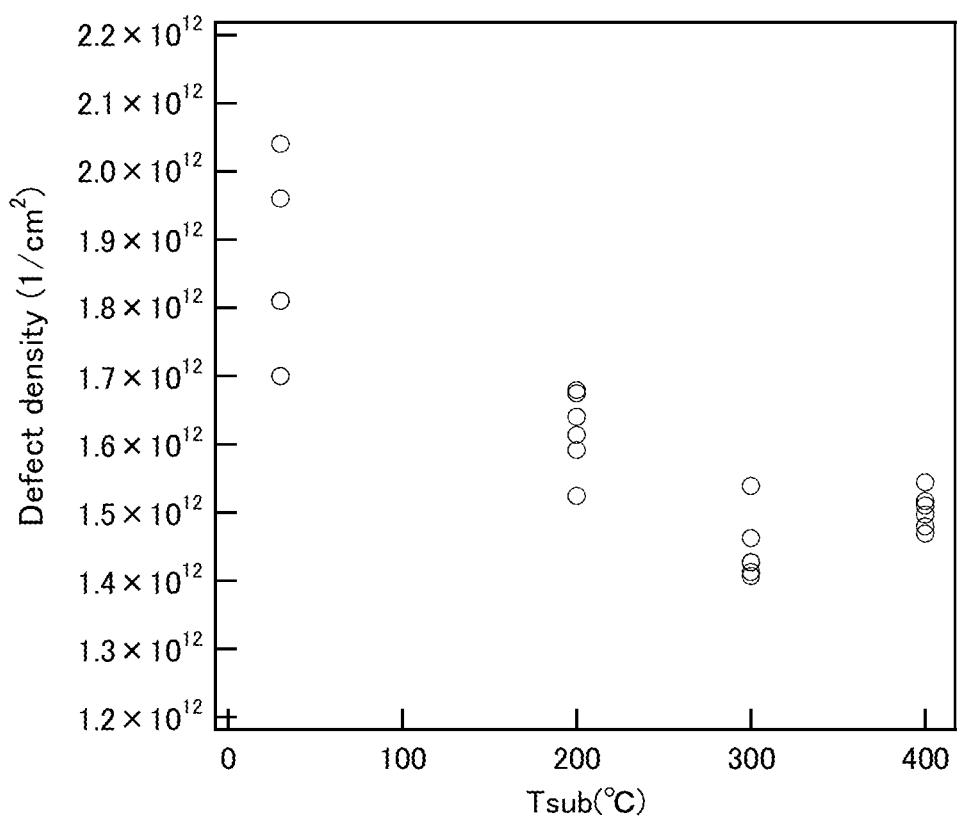
FIG. 17 is a graph showing a relation between substrate heating temperature and defect density.

The defect density depends on the substrate temperature in deposition of an oxide semiconductor. FIG. 17 shows a relation between the substrate heating temperature and the defect density. An oxide semiconductor in which the ratio of indium (In), gallium (Ga), and zinc (Zn) is 1:1:1 is used. It is shown that the defect density is reduced when the substrate is heated at a temperature higher than room temperature.

On the basis of the defect density obtained in this manner, or the like, $\mu_0$ can be calculated to be 120 cm²/Vs from Formula 2 and Formula 3. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the ideal oxide semiconductor is expected to be 120 cm²/Vs.

Note that even when no defect exists inside a semiconductor, scattering at the interface between a channel and a gate insulating film affects the transport property of the transistor. In other words, the mobility $\mu_1$ at a position that is distance x away from the interface between the channel and the gate insulating film can be expressed as the following formula.

$$\frac{1}{\mu_1} = \frac{1}{\mu_0} + \frac{D}{B}\exp\left(-\frac{x}{l}\right)$$ [Formula 6]

Here, D represents the electric field in the gate direction, and B and l are constants. Note that B and l can be obtained from actual measurement results; according to the above measurement results, B is $4.75 \times 10^7$ cm/s and l is 10 nm (the depth to which the influence of interface scattering reaches).

When D is increased (i.e., when the gate voltage is increased), the second term of Formula 6 is increased and accordingly the mobility $\mu_1$ is decreased.

Figure 18:
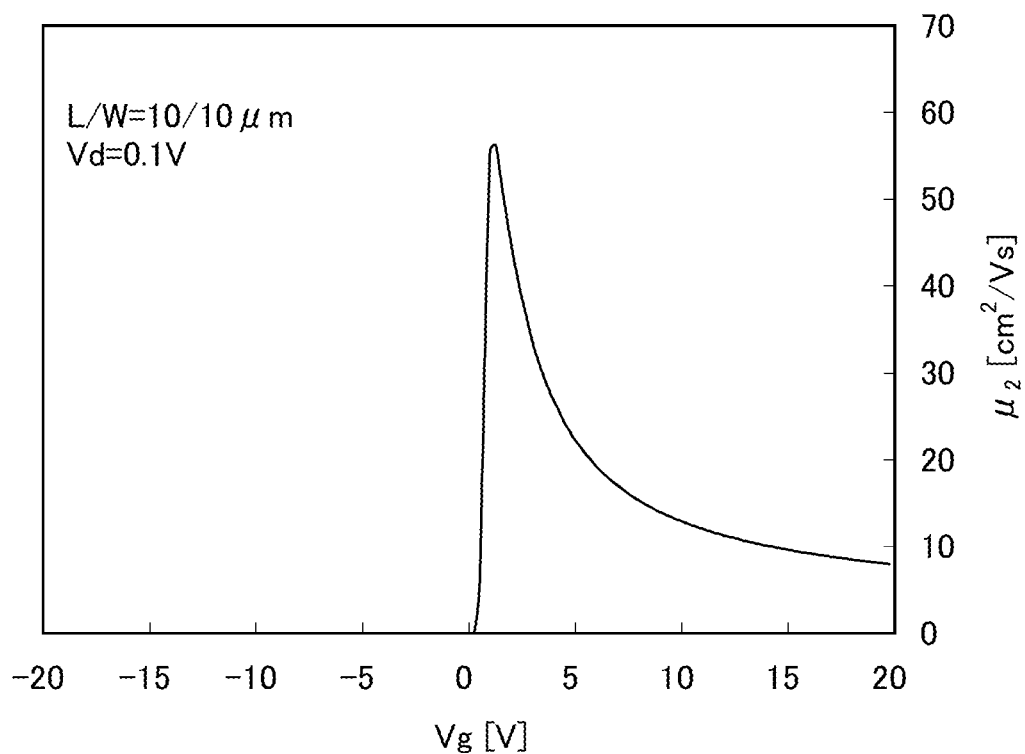
FIG. 18 is a graph showing mobility of a transistor whose channel includes an oxide semiconductor.

FIG. 18 shows first calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 3.15 eV, 4.6 eV, 15, and 30 nm, respectively. Further, the work functions of a gate, a source, and a drain were assumed to be 5.5 eV, 4.6 eV, and 4.6 eV, respectively. The thickness of a gate insulating film was assumed to be 30 nm, and the relative permittivity thereof was assumed to be 4.1. The channel length and the channel width were each assumed to be 10 μm, and the drain voltage $V_d$ was assumed to be 0.1 V.

As shown in FIG. 18, the mobility has a peak of 50 cm²/Vs or more at a gate voltage that is a little over 1 V, and is decreased as the gate voltage becomes higher because the influence of interface scattering is increased.

Figure 19:
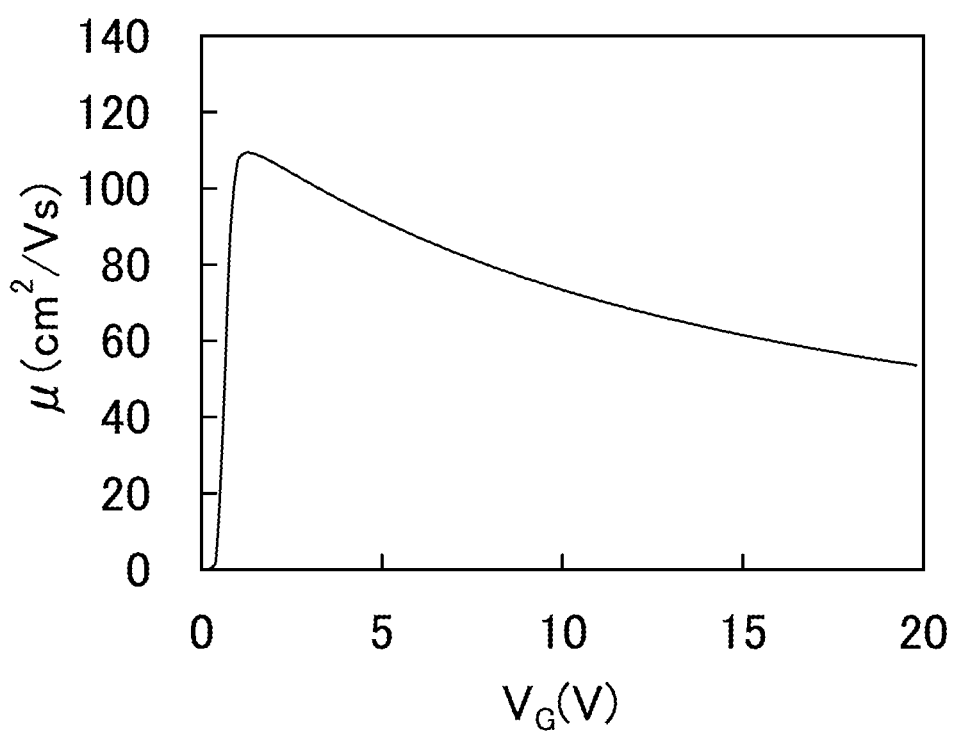
FIG. 19 shows gate voltage dependence of mobility obtained by calculation.

FIG. 19 shows second calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 19, the mobility has a peak of 100 cm²/Vs or more at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness).

FIGS. 20A to 20C, FIGS. 21A to 21C, and FIGS. 22A to 22C show calculation results of characteristics of minute transistors formed using an oxide semiconductor having such a mobility as is shown in the above second calculation results. FIGS. 23A and 23B illustrate cross-sectional structures of the transistors used for the calculation. The transistors illustrated in FIGS. 23A and 23B each include a semiconductor region 1103a and a semiconductor region 1103c that have n⁺-type conductivity in an oxide semiconductor layer. The resistivity of the semiconductor regions 1103a and 1103c is $2 \times 10^{-3}$ Ωcm.

The transistor in FIG. 23A is formed over a base insulating film 1101 and an embedded insulator 1102 that is embedded in the base insulating film 1101 and formed of aluminum oxide. The transistor includes the semiconductor region 1103a, the semiconductor region 1103c, an intrinsic semiconductor region 1103b that is placed between the semiconductor regions 1103a and 1103c and serves as a channel formation region, and a gate electrode 1105. The width of the gate electrode 1105 is 33 nm.

A gate insulating film 1104 is formed between the gate electrode 1105 and the semiconductor region 1103b. A sidewall insulator 1106a and a sidewall insulator 1106b are formed on both side surfaces of the gate electrode 1105, and an insulator 1107 is formed over the gate electrode 1105 so as to prevent a short circuit between the gate electrode 1105 and another wiring. The sidewall insulator has a width of 5 nm. A source electrode 1108a and a drain electrode 1108b are provided in contact with the semiconductor region 1103a and the semiconductor region 1103c, respectively. Note that the channel width of this transistor is 40 nm.

The transistor in FIG. 23B is the same as the transistor in FIG. 23A in that it is formed over the base insulating film 1101 and the embedded insulator 1102 formed of aluminum oxide and that it includes the semiconductor region 1103a, the semiconductor region 1103c, the intrinsic semiconductor region 1103b provided therebetween, the gate electrode 1105 having a width of 33 nm, the gate insulating film 1104, the sidewall insulator 1106a, the sidewall insulator 1106b, the insulator 1107, the source electrode 1108a, and the drain electrode 1108b.

The difference between the transistor in FIG. 23A and the transistor in FIG. 23B is the conductivity type of semiconductor regions under the sidewall insulators 1106a and 1106b. In the transistor in FIG. 23A, the semiconductor regions under the sidewall insulator 1106a and the sidewall insulator 1106b are part of the semiconductor region 1103a having n$^+$-type conductivity and part of the semiconductor region 1103c having n$^+$-type conductivity, whereas in the transistor in FIG. 23B, the semiconductor regions under the sidewall insulator 1106a and the sidewall insulator 1106b are part of the intrinsic semiconductor region 1103b. In other words, in the semiconductor layer of FIG. 23B, a region having a width of $L_{off}$ which overlaps with neither the semiconductor region 1103a (the semiconductor region 1103c) nor the gate electrode 1105 is provided. This region is called an offset region, and the width $L_{off}$ is called an offset length. As is seen from the drawing, the offset length is equal to the width of the sidewall insulator 1106a (the sidewall insulator 1106b).

Figure 20A:
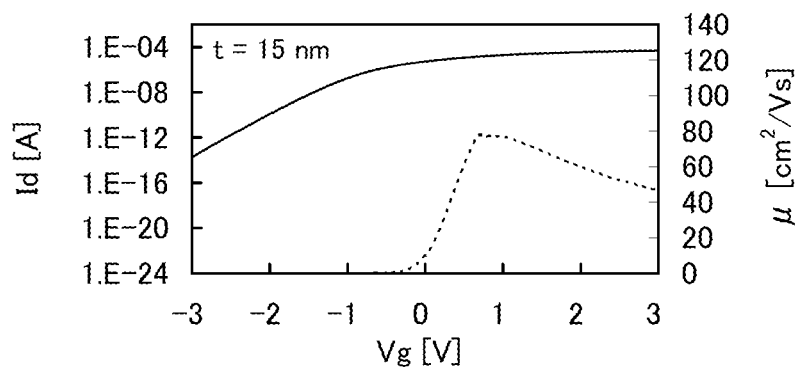
FIGS. 20A to 20C each show gate voltage dependence of drain current and mobility obtained by calculation.
Figure 20B:
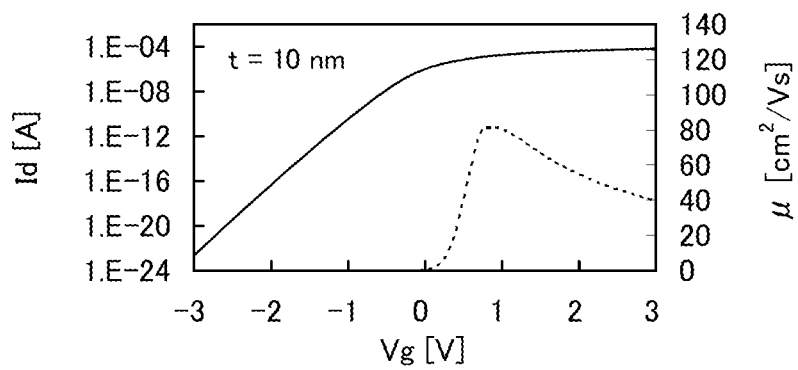
Figure 20C:
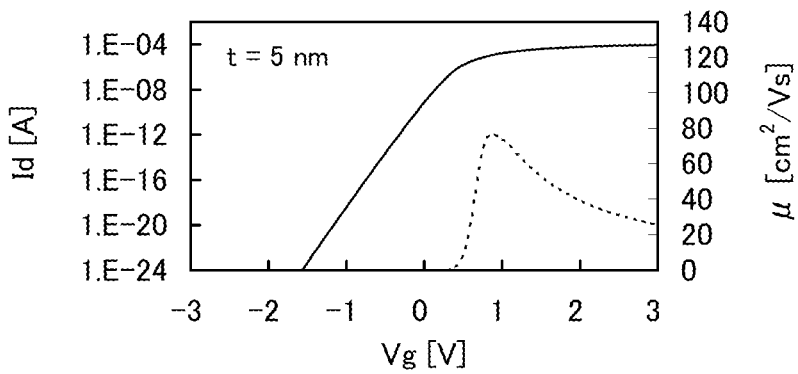

The other parameters used in calculation are as described above. For the calculation, device simulation software Sentaurus Device manufactured by Synopsys, Inc. was used. FIGS. 20A to 20C show the gate voltage ($V_g$: a potential difference between the gate and the source) dependence of the drain current ($I_d$, a solid line) and the mobility ($\mu$, a dotted line) of the transistor having the structure illustrated in FIG. 23A. The drain current $I_d$ is obtained by calculation under the assumption that the drain voltage (a potential difference between the drain and the source) is +1 V, and the mobility $\mu$ is obtained by calculation under the assumption that the drain voltage is +0.1 V.

FIG. 20A shows the gate voltage dependence of the transistor in the case where the thickness of the gate insulating film is 15 nm, FIG. 20B shows that of the transistor in the case where the thickness of the gate insulating film is 10 nm, and FIG. 20C shows that of the transistor in the case where the thickness of the gate insulating film is 5 nm. As the gate insulating film is thinner, the drain current $I_d$ in an off state (the off-state current) in particular is significantly decreased. In contrast, there is no noticeable change in peak value of the mobility $\mu$ and the drain current $I_d$ in an on state (the on-state current). The graphs show that the drain current exceeds 10 μA, which is sufficient for a transistor used in a memory circuit, at a gate voltage of around 1 V.

Figure 21A:
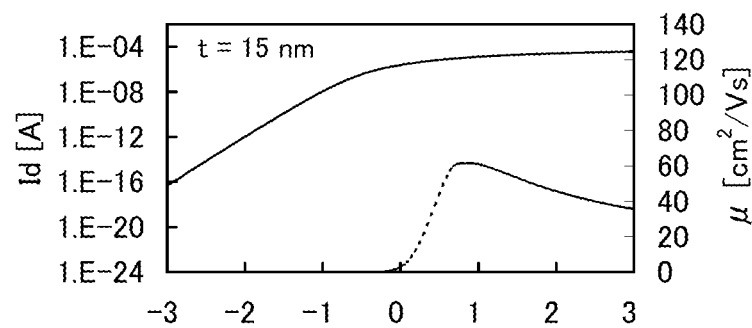
FIGS. 21A to 21C each show gate voltage dependence of drain current and mobility obtained by calculation.
Figure 21B:
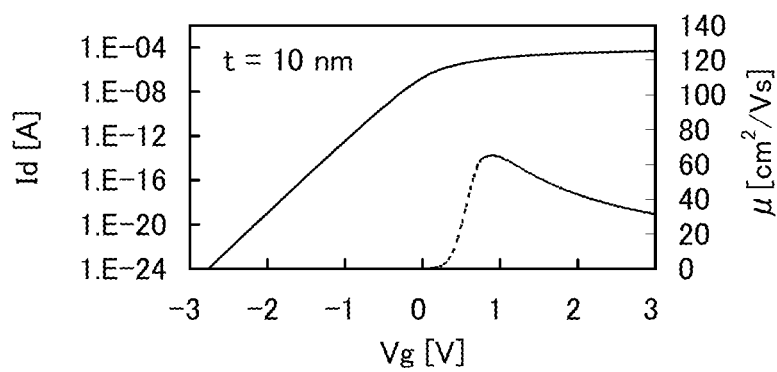
Figure 21C:
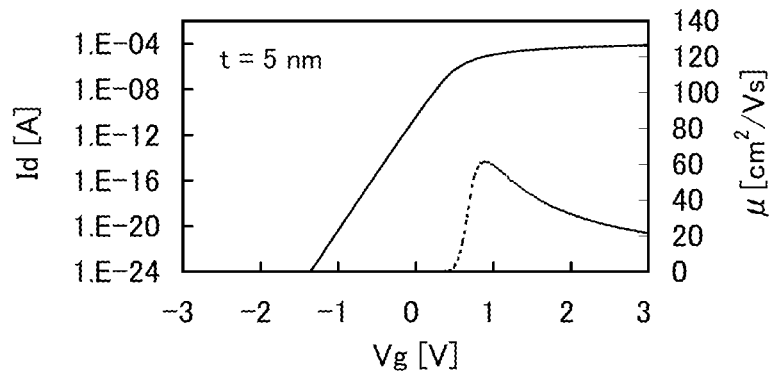

FIGS. 21A to 21C show the gate voltage $V_g$ dependence of the drain current $I_d$ (a solid line) and the mobility $\mu$ (a dotted line) of the transistor having the structure in FIG. 23B and an offset length $L_{off}$ of 5 nm. The drain current $I_d$ is obtained by calculation under the assumption that the drain voltage $V_d$ is +1 V and the mobility $\mu$ is obtained by calculation under the assumption that the drain voltage is +0.1 V. FIG. 21A shows the gate voltage dependence of the transistor in the case where the thickness of the gate insulating film is 15 nm, FIG. 21B shows that of the transistor in the case where the thickness of the gate insulating film is 10 nm, and FIG. 21C shows that of the transistor in the case where the thickness of the gate insulating film is 5 nm.

Figure 22A:
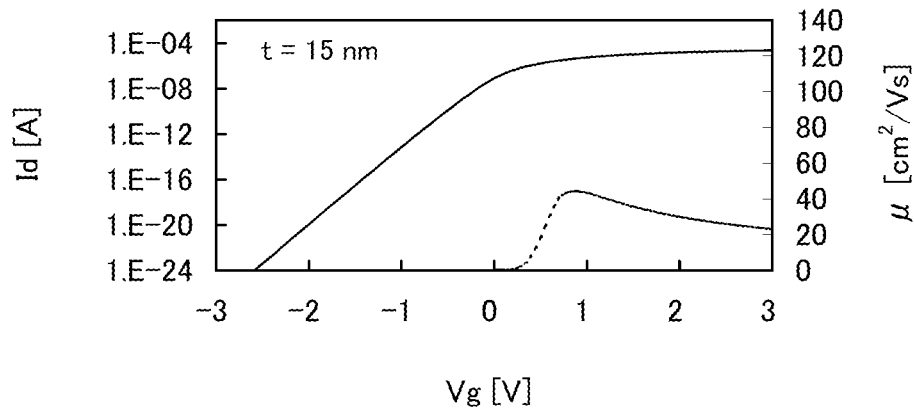
FIGS. 22A to 22C each show gate voltage dependence of drain current and mobility obtained by calculation.
Figure 22B:
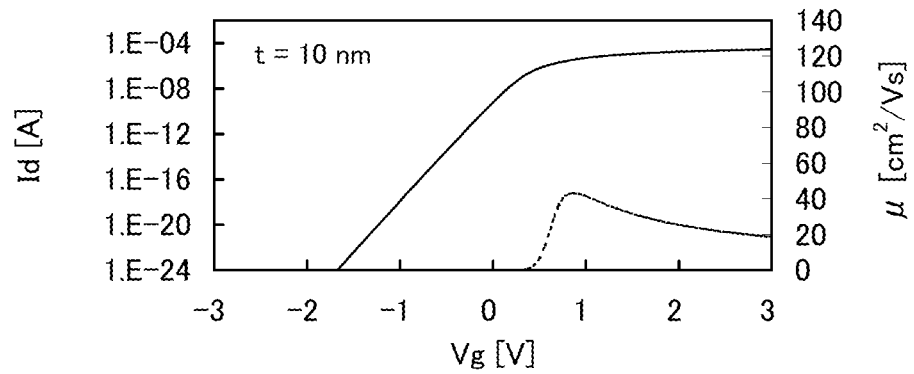
Figure 22C:
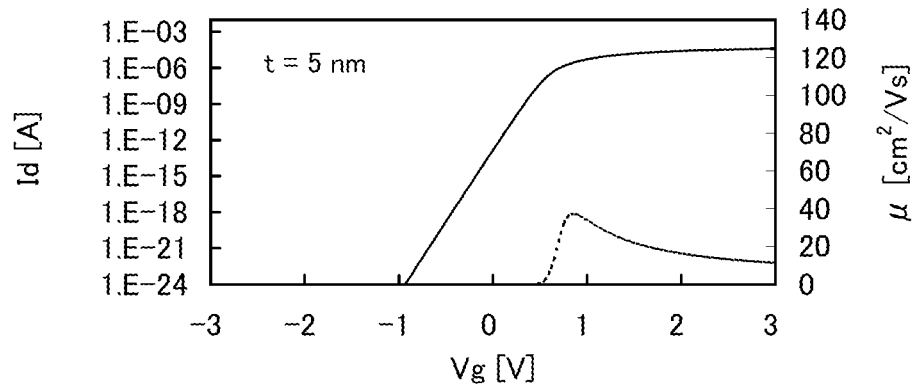
Figure 23A:
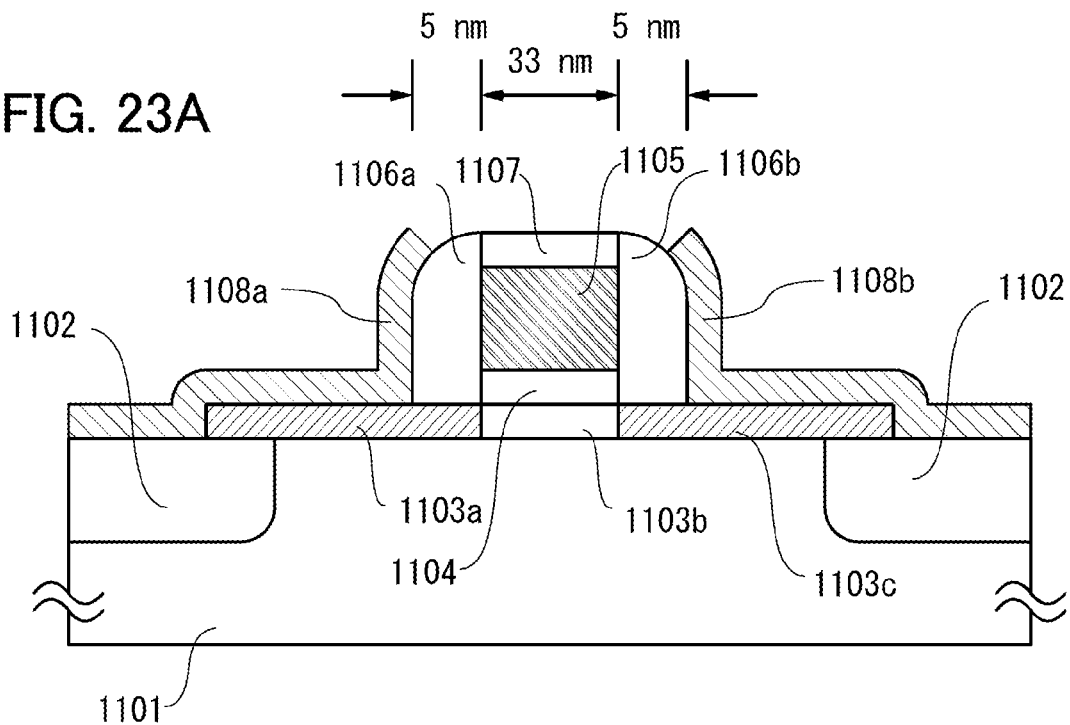
FIGS. 23A and 23B illustrate cross-sectional structures of transistors used for calculation.
Figure 23B:
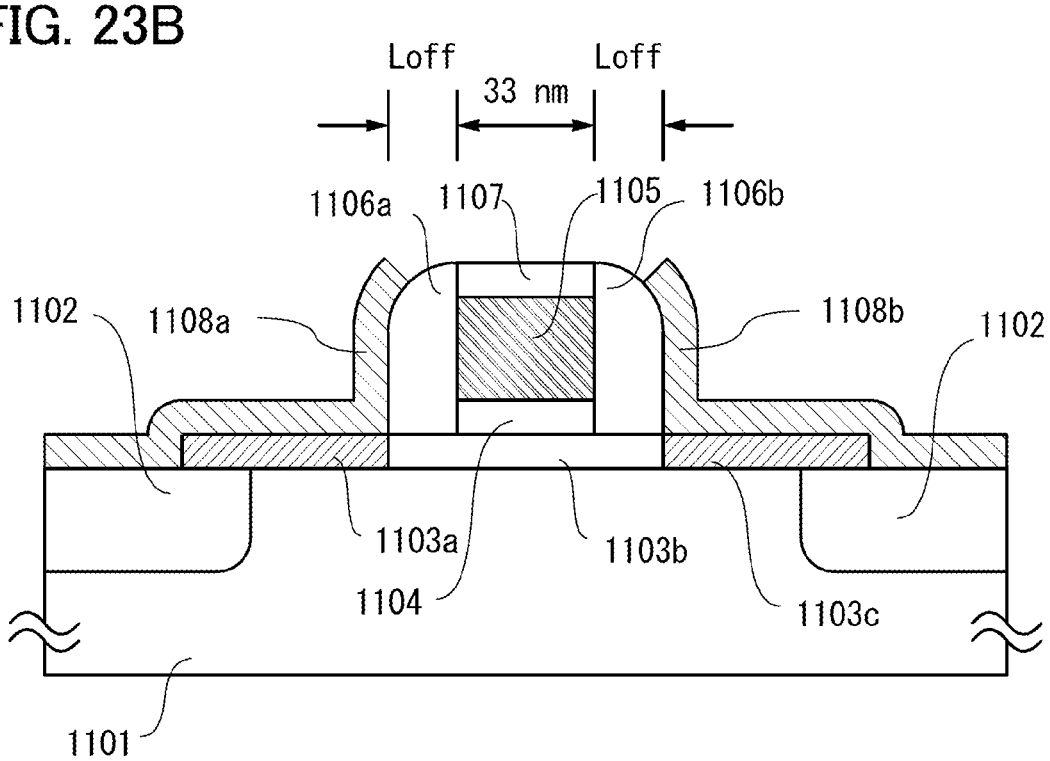

FIGS. 22A to 22C show the gate voltage dependence of the drain current $I_d$ (a solid line) and the mobility $\mu$ (a dotted line) of the transistor having the structure in FIG. 23B and an offset length $L_{off}$ of 15 nm. The drain current $I_d$ is obtained by calculation under the assumption that the drain voltage $V_d$ is +1 V, and the mobility $\mu$ is obtained by calculation under the assumption that the drain voltage $V_d$ is +0.1 V. FIG. 22A shows the gate voltage dependence of the transistor in the case where the thickness of the gate insulating film is 15 nm, FIG. 22B shows that of the transistor in the case where the thickness of the gate insulating film is 10 nm, and FIG. 22C shows that of the transistor in the case where the thickness of the gate insulating film is 5 nm.

In either of the structures, as the gate insulating film is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 20A to 20C, approximately 60 cm$^2$/Vs in FIGS. 21A to 21C, and approximately 40 cm$^2$/Vs in FIGS. 22A to 22C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. The graphs show that the drain current exceeds 10 μA, which is sufficient for a transistor used in a memory circuit, at a gate voltage of around 1 V.

As one example of the film formation condition of the oxide semiconductor film, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

When the leakage rate of the treatment chamber of the sputtering apparatus is set to $1 \times 10^{-10}$ Pa·m$^3$/s or less, entry of impurities such as an alkali metal and hydride into the oxide semiconductor film that is being deposited by sputtering can be reduced. Further, with the use of the above entrapment vacuum pump as an evacuation system, counter flow of impurities such as alkali metal, a hydrogen atom, a hydrogen molecule, water, a hydroxyl group, and hydride from the evacuation system can be reduced.

When the purity of the target is set to 99.99% or higher, alkali metal, a hydrogen atom, a hydrogen molecule, water, a hydroxyl group, hydride, or the like entering the oxide semiconductor film can be reduced. In addition, when the target is used, the concentration of alkali metal such as lithium, sodium, or potassium can be reduced in the oxide semiconductor film.

In order that the oxide semiconductor film contains as little hydrogen, a hydroxyl group, and moisture as possible, it is preferable that impurities adsorbed on the substrate 700, such as moisture and hydrogen, be eliminated and removed by preheating the substrate 700, over which films up to the insulating films 707 and 708 are formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an evacuation unit provided in the preheating chamber, a cryopump is preferable.

Note that etching for forming the oxide semiconductor layer 709 may be dry etching, wet etching, or both dry etching and wet etching. As an etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coiled electrode, the amount of electric power applied to an electrode on the substrate side, the electrode temperature on the substrate side, or the like) is adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 709 may be formed by an inkjet method. Formation of the resist mask by an inkjet method needs no photomask; thus, manufacturing cost can be reduced.

Note that, in some cases, the oxide semiconductor film formed by sputtering or the like contains a large amount of moisture or hydrogen (including a hydroxyl group) as impurities. Moisture and hydrogen easily form a donor level and thus serve as impurities in the oxide semiconductor. Therefore, in one embodiment of the present invention, in order to reduce impurities such as moisture and hydrogen in the oxide semiconductor film (dehydration or dehydrogenation), the oxide semiconductor layer 709 is subjected to heat treatment in a reduced-pressure atmosphere, an inert gas atmosphere of nitrogen, a rare gas, or the like, an oxygen gas atmosphere, or the like.

By performing heat treatment on the oxide semiconductor layer 709, moisture or hydrogen in the oxide semiconductor layer 709 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 minutes to 6 minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may include a device for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

Note that it is preferable that in the heat treatment, moisture, hydrogen, or the like be not contained in nitrogen or a rare gas such as helium, neon, or argon. It is preferable that the purity of nitrogen or a rare gas such as helium, neon, or argon which is introduced into the heat treatment apparatus be set to be 6N (99.9999%) or higher, preferably 7N (99.99999%) or higher (that is, the impurity concentration is 1 ppm or less, preferably 0.1 ppm or less).

Through the above steps, the hydrogen concentration in the oxide semiconductor layer 709 can be reduced. The hydrogen concentration in the oxide semiconductor layer 709 is $5 \times 10^{19}/cm^3$ or lower, preferably $5 \times 10^{18}/cm^3$ or lower. Accordingly, the oxide semiconductor layer can be stable.

It is preferable that heat treatment in an oxidation atmosphere be further performed after the above heat treatment for dehydration or dehydrogenation. By supplying oxygen to the oxide semiconductor layer 709 through heat treatment in an oxidation atmosphere, oxygen deficiency caused in the oxide semiconductor layer 709 due to the heat treatment for dehydration or dehydrogenation can be compensated for. Heat treatment in an oxidation atmosphere can be referred to as supply of oxygen because oxygen can be supplied to the oxide semiconductor layer 709 in this manner. For example, supply of oxygen is performed at a temperature higher than or equal to 100° C. and lower than 350° C., preferably higher than or equal to 150° C. and lower than 250° C. It is preferable that the heat treatment for dehydration or dehydrogenation and the heat treatment for supply of oxygen be successively performed. When these are successively performed, the productivity can be improved.

Note that the oxidation atmosphere refers to an atmosphere of an oxidation gas (e.g., an oxygen gas, an ozone gas, or a nitrogen oxide gas) and preferably does not contain hydrogen or the like. For example, the purity of the oxidation gas to be introduced is 8N (99.999999%) or higher, preferably 9N (99.9999999%) or higher. As the oxidation gas atmosphere, an atmosphere in which an oxidation gas is mixed with an inert gas may be used, and the oxidation gas of at least 10 ppm is contained.

Note that the oxide semiconductor layer may be amorphous or crystalline. The oxide semiconductor layer having crystallinity can be formed using a CAAC-OS (c-axis aligned crystalline oxide semiconductor) film.

In a broad sense, a CAAC-OS film means a film of a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS film is not a single crystal, but this does not mean that the CAAC-OS film is composed of only an amorphous component. Although the CAAC-OS film includes a crystallized portion (crystalline portion) or a crystallized region (crystalline region), a boundary between one crystalline portion and another crystalline portion or a boundary between one crystalline region and another crystalline region is not clear in some cases.

Nitrogen may be substituted for part of oxygen included in the CAAC-OS film. Further, the c-axes of individual crystalline portions included in the CAAC-OS film may be aligned in one direction (e.g., a direction parallel to a normal vector of the surface where the CAAC-OS film is formed or a normal vector of a surface of the CAAC-OS film).

The CAAC-OS film becomes a conductor, a semiconductor, or an insulator depending on its composition or the like. The CAAC-OS film transmits or does not transmit visible light depending on its composition or the like.

As an example of such a CAAC-OS film, there is an oxide which is formed into a film shape and has a triangular or hexagonal atomic arrangement when observed from the direction perpendicular to a surface of the film or a surface of a substrate over which the CAAC-OS film is formed, and in which metal atoms are arranged in a layered manner or metal atoms and oxygen atoms (or nitrogen atoms) are arranged in a layered manner when a cross section of the film is observed.

An example of a crystal structure of the CAAC-OS film will be described in detail with reference to FIGS. 14A to 14E, FIGS. 15A to 15C, and FIGS. 16A to 16C. In FIGS. 14A to 14E, FIGS. 15A to 15C, and FIGS. 16A to 16C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 14A to 14E, 0 surrounded by a circle represents tetracoordinate 0 and a double circle represents tricoordinate O.

Figure 14A:
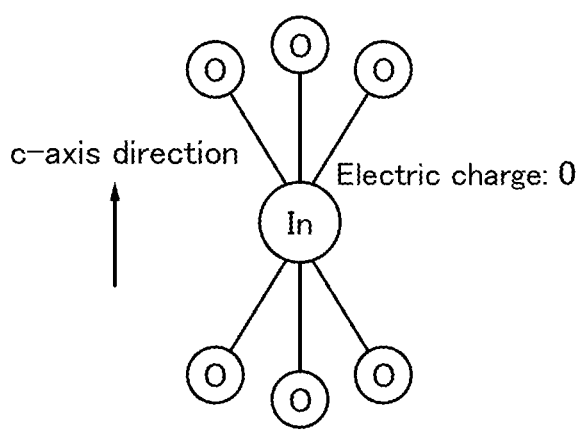
FIGS. 14A to 14E illustrate crystal structures of oxide materials.

FIG. 14A illustrates a structure including one hexacoordinate In atom and six tetracoordinate oxygen (hereinafter referred to as tetracoordinate 0) atoms proximate to the In atom. Here, a structure including one metal atom and oxygen atoms proximate thereto is referred to as a small group. The structure in FIG. 14A is actually an octahedral structure, but is illustrated as a planar structure for simplicity. Note that three tetracoordinate O atoms exist in each of an upper half and a lower half in FIG. 14A. In the small group illustrated in FIG. 14A, electric charge is 0.

Figure 14D:
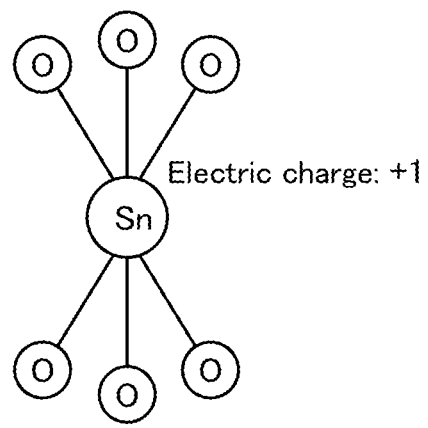
Figure 14B:
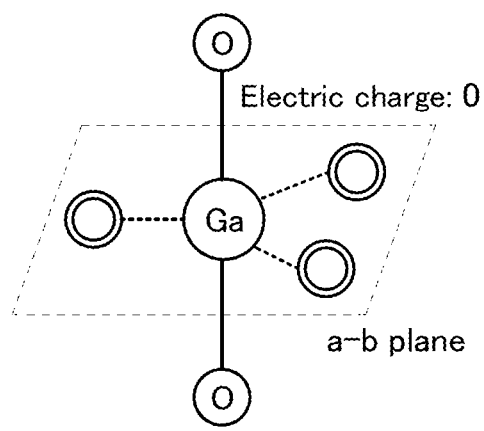

FIG. 14B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 14B. An In atom can also have the structure illustrated in FIG. 14B because an In atom can have five ligands. In the small group illustrated in FIG. 14B, electric charge is 0.

Figure 14E:
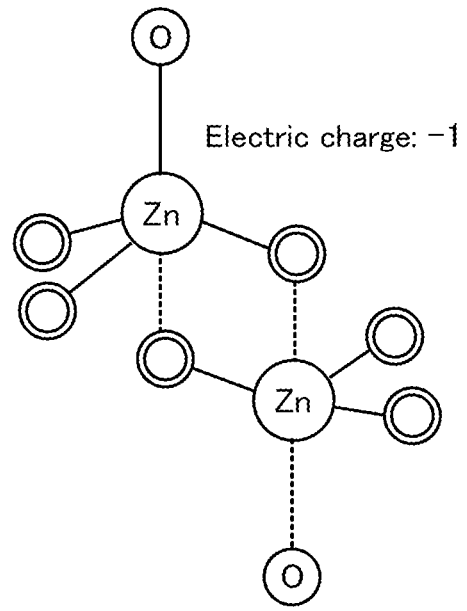
Figure 14C:
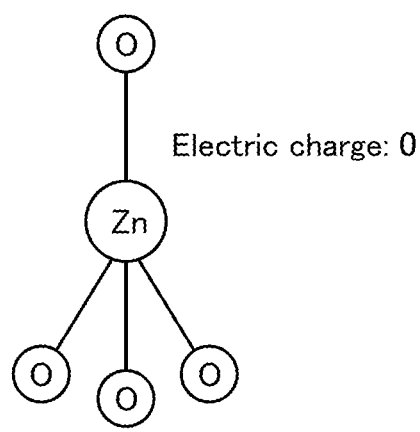

FIG. 14C illustrates a structure including one tetracoordinate Zn atom and four tetracoordinate O atoms proximate to the Zn atom. In FIG. 14C, one tetracoordinate O atom exists in an upper half and three tetracoordinate O atoms exist in a lower half Alternatively, three tetracoordinate O atoms may exist in the upper half and one tetracoordinate O atom may exist in the lower half in FIG. 14C. In the small group illustrated in FIG. 14C, electric charge is 0.

FIG. 14D illustrates a structure including one hexacoordinate Sn atom and six tetracoordinate O atoms proximate to the Sn atom. In FIG. 14D, three tetracoordinate O atoms exist in each of an upper half and a lower half. In the small group illustrated in FIG. 14D, electric charge is +1.

FIG. 14E illustrates a small group including two Zn atoms. In FIG. 14E, one tetracoordinate O atom exists in each of an upper half and a lower half In the small group illustrated in FIG. 14E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 14A each have three proximate In atoms in the downward direction, and the three O atoms in the lower half each have three proximate In atoms in the upward direction. The one O atom in the upper half with respect to the pentacoordinate Ga atom in FIG. 14B has one proximate Ga atom in the downward direction, and the one O atom in the lower half has one proximate Ga atom in the upward direction. The one O atom in the upper half with respect to the tetracoordinate Zn atom in FIG. 14C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining small groups so that the total electric charge of the layered structure is 0.

Figure 15A:
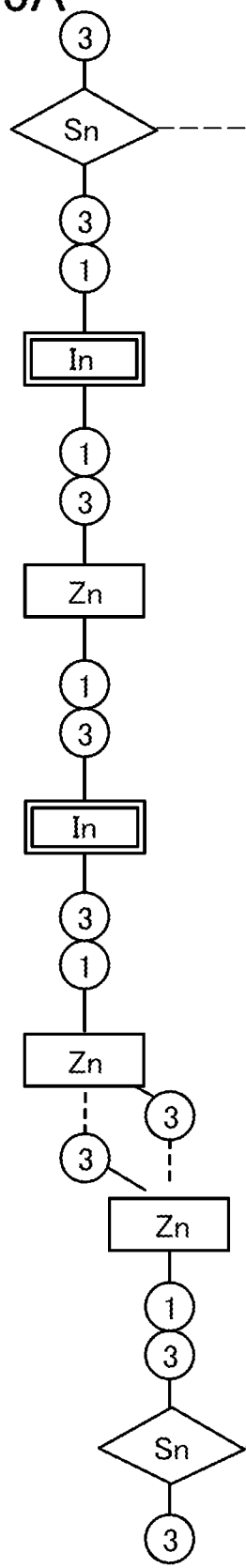
FIGS. 15A to 15C illustrate a crystal structure of an oxide material.
Figure 15B:
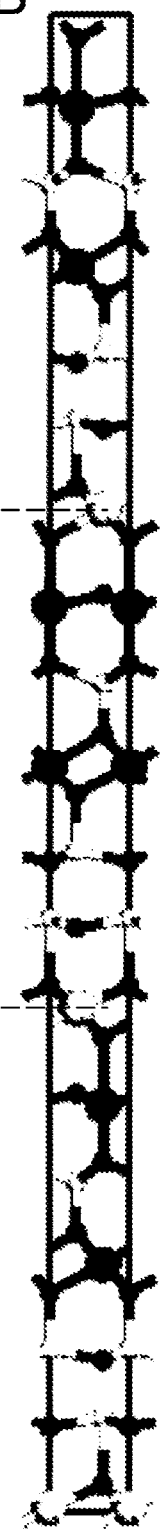
Figure 15C:
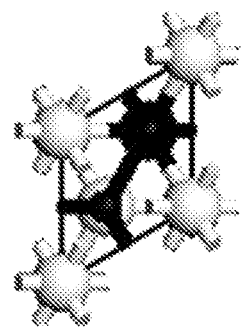

FIG. 15A illustrates a model of a medium group included in a layered structure of an In—Sn—Zn—O-based material. FIG. 15B illustrates a large group including three medium groups. Note that FIG. 15C illustrates an atomic arrangement in the case where the layered structure in FIG. 15B is observed from the c-axis direction.

In FIG. 15A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 15A, one tetracoordinate O atom existing in each of an upper half and a lower half with respect to an In atom is denoted by circled 1. FIG. 15A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based oxide in FIG. 15A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 14E can be given. For example, with one small group including two Zn atoms, electric charge of one small group including a Sn atom can be cancelled, so that the total electric charge of the layered structure can be 0.

An In atom can have either five ligands or six ligands. When the large group illustrated in FIG. 15B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 16A:
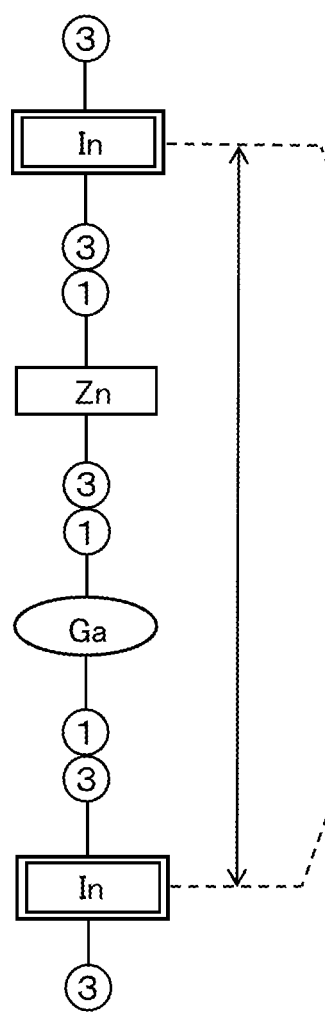
FIGS. 16A to 16C illustrate a crystal structure of an oxide material.

As an example, FIG. 16A illustrates a model of a medium group included in a layered structure of an In—Ga—Zn—O-based material.

In the medium group included in the layered structure of the In—Ga—Zn—O-based material in FIG. 16A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 16B:
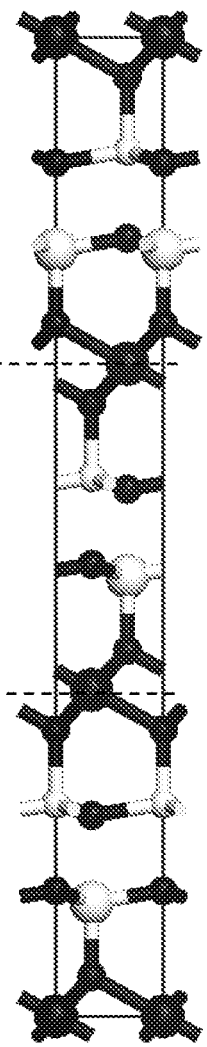
Figure 16C:
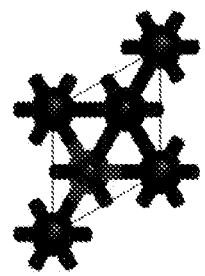

FIG. 16B illustrates a large group including three medium groups. Note that FIG. 16C illustrates an atomic arrangement in the case where the layered structure in FIG. 16B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 16A but also a medium group in which the arrangement of the In atom, the Ga atom, and the Zn atom is different from that in FIG. 16A.

In the CAAC-OS film, metal atoms and oxygen atoms are bonded in an orderly manner in comparison with anamorphous oxide semiconductor film. In other words, in the case where an oxide semiconductor film is amorphous, the coordination number may vary according to the kind of metal atom. In contrast, in the case of the CAAC-OS film, the coordination numbers of metal atoms are substantially the same. Accordingly, microscopic oxygen deficiency can be reduced, and instability and charge transfer due to attachment and detachment of hydrogen atoms (including hydrogen ions) or alkali metal atoms can be reduced.

The CAAC-OS film can be formed even when the thickness of an oxide semiconductor film is extremely small (e.g., 5 nm). When the CAAC-OS film is formed with such a small thickness, even a transistor having a short L length (e.g., 30 nm) can have high reliability.

In the case where the CAAC-OS film is formed, the planarity of a surface of a base film (here, the insulating film 708) is preferably improved. In order to improve the planarity of the surface, the surface of the insulating film is preferably flat at the atomic level (atomic layer flatness (ALF)). For example, the average surface roughness ($R_a$) of the insulating film 708 is preferably greater than or equal to 0.1 nm and less than 0.5 nm. When the planarity of the surface of the insulating film 708 is improved, the crystallinity of the CAAC-OS film can be improved.

Through the above steps, the oxide semiconductor layer 709 can be formed.

Figure 9A:
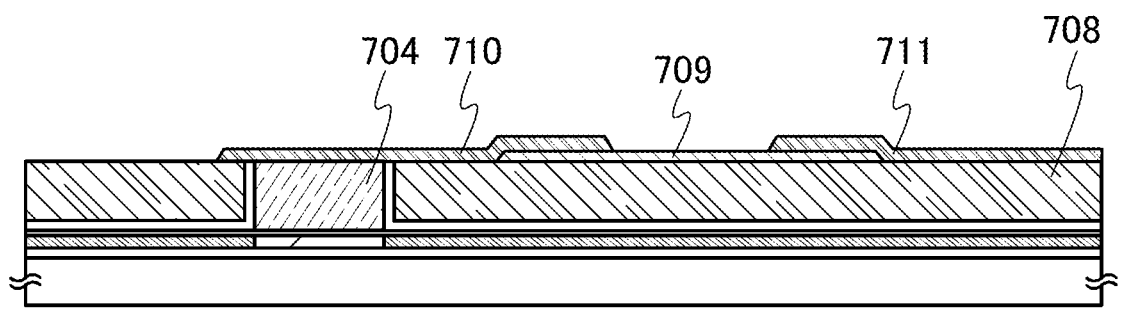
FIGS. 9A to 9C illustrate a manufacturing process of a signal processing circuit.

Next, as illustrated in FIG. 9A, a conductive film 710 which is in contact with the gate electrode 704 and the oxide semiconductor layer 709, and a conductive film 711 which is in contact with the oxide semiconductor layer 709 are formed. The conductive film 710 and the conductive film 711 function as a source and drain electrodes.

Specifically, the conductive film 710 and the conductive film 711 can be formed in such a manner that a conductive film is formed by a sputtering method or a vacuum evaporation method so as to cover the gate electrode 704, the insulating film 707, the insulating film 708, and the oxide semiconductor layer 709, and then the conductive film is processed (patterned and etched) into a predetermined shape.

As the conductive film for forming the conductive films 710 and 711, any of the following materials can be used: an element selected from aluminum, chromium, copper, tantalum, titanium, molybdenum, or tungsten; an alloy containing any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to prevent a heat resistance problem and a corrosive problem. As the refractory metal material, molybdenum, titanium, chromium, tantalum, tungsten, neodymium, scandium, yttrium, or the like can be used.

Further, the conductive film for forming the conductive films 710 and 711 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. A Cu—Mg—Al alloy, a Mo—Ti alloy, Ti, and Mo have high adhesiveness with an oxide film. Therefore, for the conductive films 710 and 711, a layered structure is employed in which a conductive film containing a Cu—Mg—Al alloy, a Mo—Ti alloy, Ti, or Mo is used for the lower layer and a conductive film containing Cu is used for the upper layer; thus, the adhesiveness between an insulating film which is an oxide film and the conductive films 710 and 711 can be increased.

In the case where heat treatment is performed after the formation of the conductive film, the conductive film preferably has heat resistance high enough to withstand the heat treatment.

Note that the material and etching conditions are adjusted as appropriate so that the oxide semiconductor layer 709 is not removed in etching of the conductive film as much as possible. Depending on the etching conditions, there are some cases in which an exposed portion of the oxide semiconductor layer 709 is partially etched and thus a groove (a depression portion) is formed.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of the process can be realized.

Further, oxide conductive films functioning as a source region and a drain region may be provided between the oxide semiconductor layer 709 and the conductive films 710 and 711 functioning as a source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive films are formed, patterning for forming the oxide conductive films and patterning for forming the conductive films 710 and 711 may be performed concurrently.

By providing the oxide conductive films functioning as a source region and a drain region, the resistance between the oxide semiconductor layer 709 and the conductive films 710 and 711 can be lowered, so that the transistor can operate at high speed.

Next, plasma treatment may be performed using a gas such as $N_2O$, $N_2$, or Ar. Through this plasma treatment, water or the like adhering to an exposed surface of the oxide semiconductor layer 709 is removed. Plasma treatment may be performed using a mixture gas of oxygen and argon.

Figure 9B:
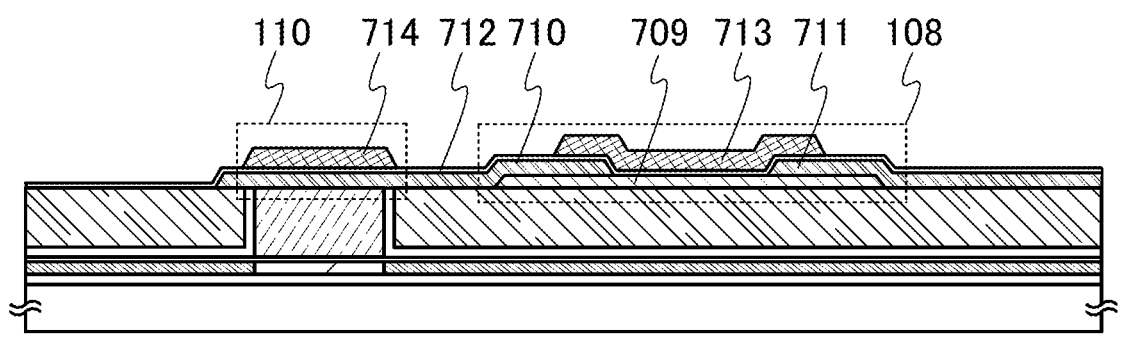

After the plasma treatment, as illustrated in FIG. 9B, the gate insulating film 712 is formed so as to cover the insulating film 708, the oxide semiconductor layer 709, and the conductive films 710 and 711. Then, a gate electrode 713 is formed over the gate insulating film 712 so as to overlap with the oxide semiconductor layer 709, and a conductive film 714 is formed over the gate insulating film 712 so as to overlap with the conductive film 710.

The gate insulating film 712 can be formed using a material and a layered structure which are similar to those of the gate insulating film 703. Note that the gate insulating film 712 preferably includes impurities such as moisture and hydrogen as little as possible, and the gate insulating film 712 may be formed using a single-layer insulating film or a plurality of insulating films stacked. When hydrogen is contained in the gate insulating film 712, hydrogen enters the oxide semiconductor layer 709 or oxygen in the oxide semiconductor layer 709 is extracted by hydrogen, whereby the oxide semiconductor layer 709 has lower resistance (n-type conductivity); thus, a parasitic channel might be formed. Thus, it is important that a deposition method in which hydrogen is not used be employed in order to form the gate insulating film 712 containing hydrogen as little as possible. A material having a high barrier property is preferably used for the gate insulating film 712.

As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having a lower proportion of nitrogen such as a silicon oxide film or a silicon oxynitride film is formed on the side closer to the oxide semiconductor layer 709 than the insulating film having a high barrier property. Then, the insulating film having a high barrier property is formed so as to overlap with the conductive films 710 and 711 and the oxide semiconductor layer 709 with the insulating film having a lower proportion of nitrogen provided therebetween. When the insulating film having a high barrier property is used, impurities such as moisture and hydrogen can be prevented from entering the oxide semiconductor layer 709, the gate insulating film 712, or the interface between the oxide semiconductor layer 709 and another insulating film and the vicinity thereof. In addition, the insulating film having a lower proportion of nitrogen such as a silicon oxide film or a silicon oxynitride film formed in contact with the oxide semiconductor layer 709 can prevent the insulating film formed using a material having a high barrier property from being in contact with the oxide semiconductor layer 709.

In this embodiment, the gate insulating film 712 with a structure in which a 100-nm-thick silicon nitride film formed by a sputtering method is stacked over a 200-nm-thick silicon oxide film formed by a sputtering method is formed. The substrate temperature in film formation may be higher than or equal to room temperature and lower than or equal to 300° C. and in this embodiment, is 100° C.

After the gate insulating film 712 is formed, heat treatment may be performed. The heat treatment is performed in a nitrogen atmosphere, an atmosphere of ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. The water content in the gas is preferably 20 ppm or less, more preferably 1 ppm or less, further preferably 10 ppb or less.

For example, heat treatment is performed at 250° C. for one hour in a nitrogen atmosphere in this embodiment. Alternatively, RTA treatment for a short time at a high temperature may be performed before the formation of the conductive films 710 and 711 in a manner similar to that of the heat treatment performed on the oxide semiconductor layer for reduction of moisture or hydrogen. Even when oxygen deficiency is generated in the oxide semiconductor layer 709 by the previous heat treatment performed on the oxide semiconductor layer 709, oxygen is supplied to the oxide semiconductor layer 709 from the gate insulating film 712 by performing heat treatment after providing the gate insulating film 712 containing oxygen. By supplying oxygen to the oxide semiconductor layer 709, oxygen deficiency can be reduced in the oxide semiconductor layer 709 and the stoichiometric ratio can be satisfied. It is preferable that the proportion of oxygen in the oxide semiconductor layer 709 be higher than that in the stoichiometric composition.

As a result, the oxide semiconductor layer 709 can be made to be substantially i-type (intrinsic), variation in electrical characteristics of the transistor due to oxygen deficiency can be reduced, and the off-state current of the transistor can be extremely small. The timing of this heat treatment is not particularly limited as long as it is after the formation of the gate insulating film 712. When this heat treatment doubles as another step such as heat treatment for formation of a resin film or heat treatment for reduction of the resistance of a transparent conductive film, the oxide semiconductor layer 709 can be made to be substantially i-type without the number of steps increased.

Alternatively, oxygen may be added to the oxide semiconductor layer 709 by an ion implantation method, an ion doping method, or the like to reduce oxygen deficiency. For example, oxygen which is made into a plasma state with a microwave at 2.45 GHz may be added to the oxide semiconductor layer 709.

The gate electrode 713 and the conductive film 714 can be formed in such a manner that a conductive film is formed over the gate insulating film 712 and then is patterned. The gate electrode 713 and the conductive film 714 can be formed using a material similar to that of the gate electrode 704 or the conductive films 710 and 711.

The thickness of each of the gate electrode 713 and the conductive film 714 is 10 nm to 400 nm, preferably 100 nm to 200 nm. In this embodiment, after a conductive film is formed with a thickness of 150 nm by a sputtering method using a tungsten target, the conductive film is processed (patterned and etched) into a desired shape by etching, whereby the gate electrode 713 and the conductive film 714 are formed. Note that a resist mask may be formed by an inkjet method. Formation of the resist mask by an inkjet method needs no photomask; thus, manufacturing cost can be reduced.

Through the above steps, the first transistor 108 is formed.

Note that a portion where the conductive film 710 and the conductive film 714 overlap with each other with the gate insulating film 712 provided therebetween corresponds to the first capacitor 110.

Although the first transistor 108 is described as a single-gate transistor, a multi-gate transistor including a plurality of channel formation regions can be manufactured when a plurality of gate electrodes are included, if needed.

Note that an insulating film in contact with the oxide semiconductor layer 709 (which corresponds to the gate insulating film 712 in this embodiment) may be formed using an insulating material containing a Group 13 element and oxygen. Many of oxide semiconductor materials contain a Group 13 element, and an insulating material containing a Group 13 element works well with oxide semiconductors. By using an insulating material containing a Group 13 element for an insulating film in contact with the oxide semiconductor layer, an interface with the oxide semiconductor layer can keep a favorable state.

An insulating material containing a Group 13 element refers to an insulating material containing one or more Group 13 elements. As the insulating material containing a Group 13 element, gallium oxide, aluminum oxide, aluminum gallium oxide, gallium aluminum oxide, or the like can be given as an example. Here, in aluminum gallium oxide, the amount of aluminum is larger than that of gallium in atomic percent, and in gallium aluminum oxide, the amount of gallium is larger than or equal to that of aluminum in atomic percent.

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pileup of hydrogen at the interface between the oxide semiconductor layer and the insulating film can be reduced. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water into the oxide semiconductor layer.

The insulating material of the insulating film in contact with the oxide semiconductor layer 709 is preferably made to contain oxygen in a proportion higher than that in the stoichiometric composition by heat treatment in an oxygen atmosphere or by oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes oxygen plasma doping in which oxygen that is made to be plasma is added to a bulk. The oxygen doping may be performed by an ion implantation method or an ion doping method.

For example, in the case where the insulating film in contact with the oxide semiconductor layer 709 is formed using gallium oxide, the composition of gallium oxide can be set to be $Ga_2O_x$ (x=3+a, 0<a<1) by heat treatment in an oxygen atmosphere or by oxygen doping.

In the case where the insulating film in contact with the oxide semiconductor layer 709 is formed using aluminum oxide, the composition of aluminum oxide can be set to be $Al_2O_x$ ($x=3+a$, $0<a<1$) by heat treatment in an oxygen atmosphere or by oxygen doping.

In the case where the insulating film in contact with the oxide semiconductor layer 709 is formed using gallium aluminum oxide (aluminum gallium oxide), the composition of gallium aluminum oxide (aluminum gallium oxide) can be set to be $Ga_xAl_{2-x}O_{3+a}$ ($0<x<2$, $0<a<1$) by heat treatment in an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor layer, excess oxygen in the insulating film is supplied to the oxide semiconductor layer, and oxygen defects in the oxide semiconductor layer or at the interface between the oxide semiconductor layer and the insulating film are reduced. Thus, the oxide semiconductor layer can be made to be an i-type or substantially i-type oxide semiconductor.

Note that the insulating film which includes a region where the proportion of oxygen is higher than that in the stoichiometric composition may be applied to either the insulating film located on the upper side of the oxide semiconductor layer 709 or the insulating film located on the lower side of the oxide semiconductor layer 709 of the insulating films in contact with the oxide semiconductor layer 709; however, it is preferable to apply such an insulating film to both of the insulating films in contact with the oxide semiconductor layer 709. The above-described effect can be enhanced with a structure where the oxide semiconductor layer 709 is sandwiched between the insulating films each including a region where the proportion of oxygen is higher than that in the stoichiometric composition, which are used as the insulating films in contact with the oxide semiconductor layer 709 and located on the upper side and the lower side of the oxide semiconductor layer 709.

The insulating films on the upper side and the lower side of the oxide semiconductor layer 709 may contain the same constituent elements or different constituent elements. For example, the insulating films on the upper side and the lower side may be both formed using gallium oxide whose composition is $Ga_2O_x$ ($x=3+a$, $0<a<1$). Alternatively, one of the insulating films on the upper side and the lower side may be formed using gallium oxide whose composition is $Ga_2O_x$ ($x=3+a$, $0<a<1$) and the other may be formed using aluminum oxide whose composition is $Al_2O_x$ ($x=3+a$, $0<a<1$). Further alternatively, one of the insulating films on the upper side and the lower side may be formed using silicon oxide whose composition is $SiO_x$ ($x=2+a$, $0<a<1$) and the other may be formed using aluminum oxide whose composition is $Al_2O_x$ ($x=3+a$, $0<a<1$).

The insulating film in contact with the oxide semiconductor layer 709 may be formed by stacking insulating films each including a region where the proportion of oxygen is higher than that in the stoichiometric composition. For example, the insulating film on the upper side of the oxide semiconductor layer 709 may be formed as follows: gallium oxide whose composition is $Ga_2O_x$ ($x=3+a$, $0<a<1$) is formed and gallium aluminum oxide (aluminum gallium oxide) whose composition is $Ga_xAl_{2-x}O_{3+a}$ ($0<x<2$, $0<a<1$) is formed thereover.

Note that the insulating film on the lower side of the oxide semiconductor layer 709 may be formed by stacking insulating films each including a region where the proportion of oxygen is higher than that in the stoichiometric composition. Further, both of the insulating films on the upper side and the lower side of the oxide semiconductor layer 709 may be formed by stacking insulating films each including a region where the proportion of oxygen is higher than that in the stoichiometric composition.

Figure 9C:
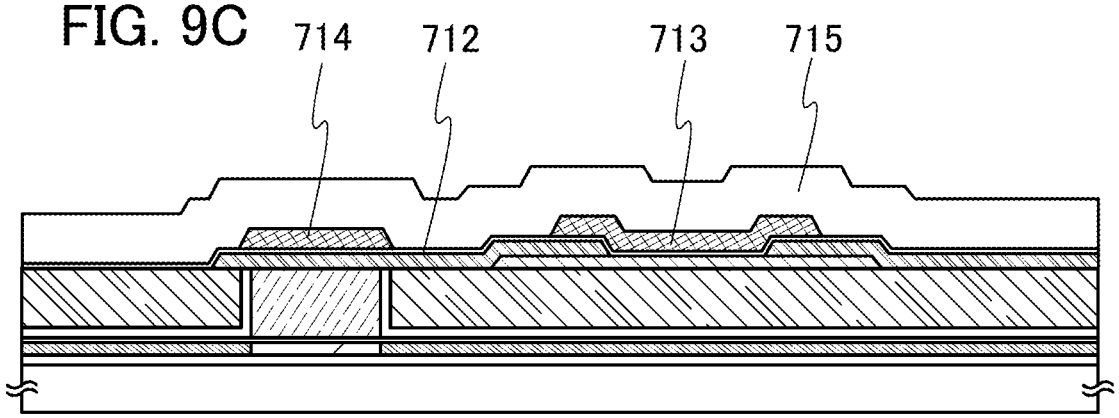

Next, as illustrated in FIG. 9C, an insulating film 715 is formed so as to cover the gate insulating film 712, the gate electrode 713, and the conductive film 714. The insulating film 715 can be formed by a sputtering method, a PECVD method, or the like. The insulating film 715 can be formed using a material containing an inorganic insulating material such as silicon oxide, silicon oxynitride, silicon nitride, hafnium oxide, gallium oxide, or aluminum oxide. Note that for the insulating film 715, a material with a low dielectric constant or a structure with a low dielectric constant (e.g., a porous structure) is preferably used. When the dielectric constant of the insulating film 715 is lowered, the parasitic capacitance generated between wirings or electrodes can be reduced, which results in higher speed operation. Note that although the insulating film 715 has a single-layer structure in this embodiment, one embodiment of the present invention is not limited to this. The insulating film 715 may have a layered structure of two or more layers.

Through the above process, the first transistor 108 to be used in the memory circuit can be manufactured. Note that in the manufacturing method described in this embodiment, the conductive films 710 and 711 functioning as a source and drain electrodes are formed after the formation of the oxide semiconductor layer 709. However, in the first transistor 108, the conductive films functioning as a source and drain electrodes may be formed below the oxide semiconductor layer 709, that is, between the oxide semiconductor layer 709 and the insulating film 708.

Figure 10:
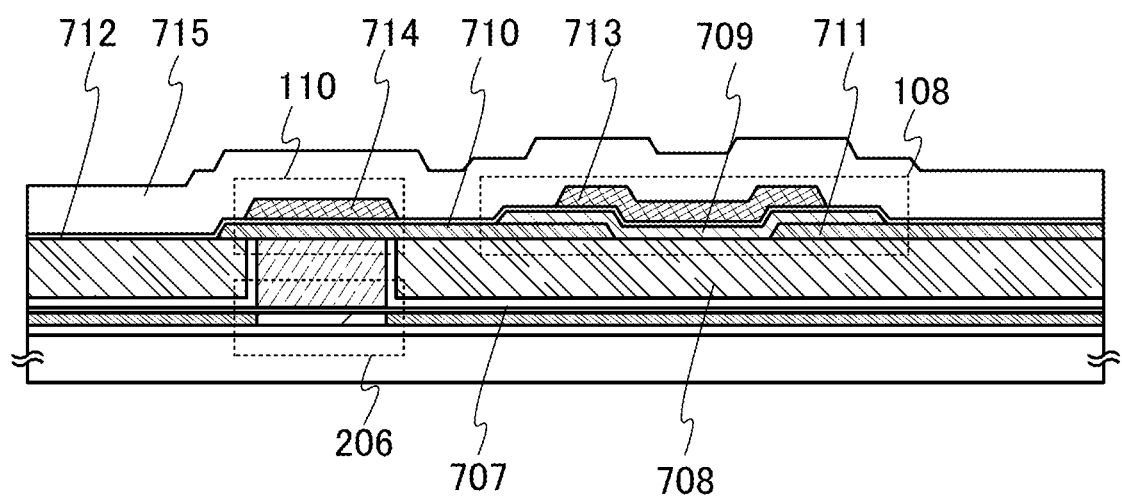
FIG. 10 is a cross-sectional view of a transistor that can be used in a signal processing circuit.

FIG. 10 is a cross-sectional view of the first transistor 108, the first capacitor 110, and the fourth transistor 206 in the case where the conductive films 710 and 711 functioning as a source and drain electrodes are provided between the oxide semiconductor layer 709 and the insulating film 708. The first transistor 108 illustrated in FIG. 10 can be obtained in such a manner that the conductive films 710 and 711 are formed after the formation of the insulating film 708, and then, the oxide semiconductor layer 709 is formed.

With such a transistor including an oxide semiconductor, a nonvolatile memory circuit can be formed. As a semiconductor device including a nonvolatile memory circuit, for example, a nonvolatile random access memory can be given.

A magnetic tunneling junction element (an MTJ element) is known as a nonvolatile random access memory. The MTJ element stores data in a low resistance state when the spin directions in films provided above and below an insulating film are parallel, and stores data in a high resistance state when the spin directions are anti-parallel. Therefore, the principles of the MTJ element and the memory circuit including an oxide semiconductor in this embodiment are completely different from each other. Table 1 shows comparison between the MTJ element and the memory circuit including an oxide semiconductor in this embodiment.

TABLE 1

|  | Spintronics (MTJ element) | OS/Si |
|---|---|---|
| Heat resistance | Curie temperature | Process temperature at 500° C. (reliability at 150° C.) |
| Driving method | Current driving | Voltage driving |
| Writing principle | Changing spin direction of magnetic material | Turning on/off FET |
| Si LSI | Suitable for bipolar LSI (For highly integrated circuit, MOS LSI is preferable to bipolar LSI, which is unsuitable for high integration. Note that W becomes larger.) | Suitable for MOS LSI |
| Overhead | Large (because of high Joule heat) | Smaller than overhead of MTJ element by 2 to 3 or more orders of magnitude (because of utilizing charging and discharging of parasitic capacitance) |
| Nonvolatility | Utilizing spin | Utilizing low off-state current |
| Read cycles | No limitation | No limitation |
| 3D structure | Difficult (at most two layers) | Easy (with a limitless number of layers) |
| Integration degree ($F^2$) | 4 $F^2$ to 15 $F^2$ | Depending on the number of layers stacked in 3D structure (need heat resistance high enough to withstand process of forming upper OS FET) |
| Material | Magnetic rare-earth element | OS material |
| Cost per bit | High | Low (might be slightly high depending on constituent of OS (e.g., In)) |
| Resistance to magnetic field | Low | High |

The MTJ element is disadvantageous in that its magnetic properties are lost when the temperature is the Curie temperature or higher because it contains a magnetic material. Further, the MTJ element is driven by current and thus is compatible with a silicon bipolar device. However, a silicon bipolar device is unsuitable for high integration. Furthermore, the MTJ element has a problem in that its power consumption is increased with the increase in memory capacity, although the MTJ element requires low write current.

In principle, the MTJ element has low resistance to a magnetic field, so that the spin direction is likely to change when the MTJ element is exposed to a high magnetic field. Moreover, it is necessary to control magnetic fluctuation due to a nanoscale magnetic material used for the MTJ element.

In addition, a rare earth element is used for the MTJ element; thus, it requires special attention to incorporate a process of forming the MTJ element in a process of forming a silicon semiconductor that is sensitive to metal contamination. Further, the MTJ element is expensive in terms of the material cost per bit.

On the other hand, the transistor including an oxide semiconductor, which is described in this embodiment, has an element structure and an operation principle similar to those of a silicon MOSFET except that a semiconductor material for forming a channel is a metal oxide. Further, the transistor including an oxide semiconductor is not affected by a magnetic field, and does not cause soft errors. These facts show that the transistor is highly compatible with a silicon integrated circuit.

This embodiment can be implemented in combination with any of the other embodiments as appropriate.

[Embodiment 6]

In this embodiment, a transistor which includes an oxide semiconductor layer and has a structure different from that in Embodiment 5 will be described with reference to FIGS. 11A to 11D.

Figure 11A:
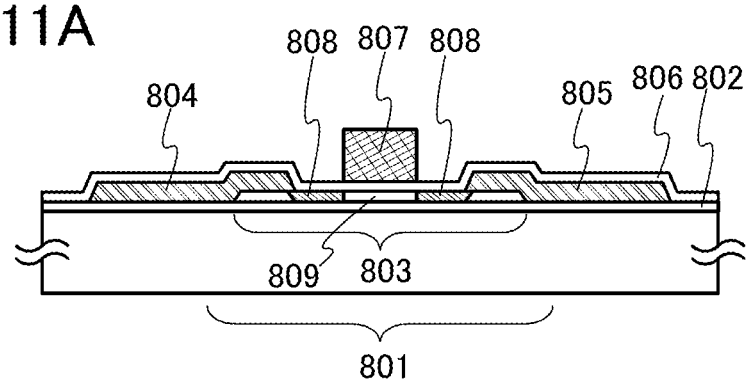
FIGS. 11A to 11D are each a cross-sectional view of a transistor that can be used in a signal processing circuit.

A transistor 801 in FIG. 11A includes an oxide semiconductor layer 803 which is formed over an insulating film 802 and functions as an active layer; a source electrode 804 which is formed over the oxide semiconductor layer 803; a drain electrode 805 which is formed over the oxide semiconductor layer 803; a gate insulating film 806 which is formed over the oxide semiconductor layer 803, the source electrode 804, and the drain electrode 805; and a gate electrode 807 which is provided over the gate insulating film 806 so as to overlap with the oxide semiconductor layer 803.

The transistor 801 illustrated in FIG. 11A is of a top-gate type where the gate electrode 807 is formed over the oxide semiconductor layer 803, and is also of a top-contact type where the source electrode 804 and the drain electrode 805 are formed over the oxide semiconductor layer 803. In the transistor 801, the source electrode 804 and the drain electrode 805 do not overlap with the gate electrode 807. That is, the distance between the gate electrode 807 and each of the source electrode 804 and the drain electrode 805 is larger than the thickness of the gate insulating film 806. Therefore, in the transistor 801, the parasitic capacitance generated between the gate electrode 807 and each of the source electrode 804 and the drain electrode 805 can be small, so that the transistor 801 can operate at high speed.

The oxide semiconductor layer 803 includes a pair of high-concentration regions 808 which are obtained by addition of dopant imparting n-type conductivity to the oxide semiconductor layer 803 after formation of the gate electrode 807. Further, the oxide semiconductor layer 803 includes a channel formation region 809 which overlaps with the gate electrode 807 with the gate insulating film 806 interposed therebetween. In the oxide semiconductor layer 803, the channel formation region 809 is provided between the pair of high-concentration regions 808. The addition of dopant for forming the high-concentration regions 808 can be performed by an ion implantation method. As the dopant, for example, nitrogen, phosphorus, boron, or the like can be used.

For example, in the case where nitrogen is used as the dopant, the concentration of nitrogen atoms in the high-concentration regions 808 is preferably higher than or equal to $5 \times 10^{19}/cm^3$ and lower than or equal to $1 \times 10^{22}/cm^3$.

The high-concentration regions 808 to which the dopant imparting n-type conductivity is added have higher conductivity than the other regions in the oxide semiconductor layer 803. Therefore, by providing the high-concentration regions 808 in the oxide semiconductor layer 803, the resistance between the source electrode 804 and the drain electrode 805 can be decreased.

In the case where an In—Ga—Zn-based oxide semiconductor is used for the oxide semiconductor layer 803, heat treatment is performed at a temperature higher than or equal to 300° C. and lower than or equal to 600° C. for approximately one hour after nitrogen is added. Consequently, the oxide semiconductor in the high-concentration regions 808 has a wurtzite crystal structure. Since the oxide semiconductor in the high-concentration regions 808 has a wurtzite crystal structure, the conductivity of the high-concentration regions 808 can be further increased and the resistance between the source electrode 804 and the drain electrode 805 can be decreased. Note that in order to effectively decrease the resistance between the source electrode 804 and the drain electrode 805 by forming an oxide semiconductor having a wurtzite crystal structure, in the case of using nitrogen as the dopant, the concentration of nitrogen atoms in the high-concentration regions 808 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 803 may be formed using a CAAC-OS film. In the case where the oxide semiconductor layer 803 is formed using a CAAC-OS film, the conductivity of the oxide semiconductor layer 803 can be increased as compared to the case of an amorphous semiconductor; thus, the resistance between the source electrode 804 and the drain electrode 805 can be decreased.

By decreasing the resistance between the source electrode 804 and the drain electrode 805, high on-state current and high-speed operation can be ensured even when the transistor 801 is miniaturized. With the miniaturization of the transistor 801, the area occupied by the memory circuit including the transistor can be reduced and the memory capacity per unit area can be increased.

Figure 11B:
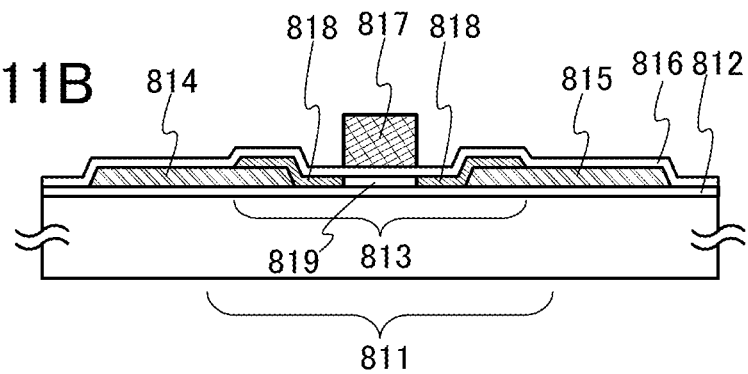

A transistor 811 illustrated in FIG. 11B includes a source electrode 814 formed over an insulating film 812; a drain electrode 815 formed over the insulating film 812; an oxide semiconductor layer 813 which is formed over the source electrode 814 and the drain electrode 815 and functions as an active layer; a gate insulating film 816 over the oxide semiconductor layer 813, the source electrode 814, and the drain electrode 815; and a gate electrode 817 which is provided over the gate insulating film 816 so as to overlap with the oxide semiconductor layer 813.

The transistor 811 illustrated in FIG. 11B is of a top-gate type where the gate electrode 817 is formed over the oxide semiconductor layer 813, and is also of a bottom-contact type where the source electrode 814 and the drain electrode 815 are formed below the oxide semiconductor layer 813. In the transistor 811, the source electrode 814 and the drain electrode 815 do not overlap with the gate electrode 817 as in the transistor 801; thus, the parasitic capacitance generated between the gate electrode 817 and the source electrode 814 or the drain electrode 815 can be small, so that the transistor 811 can operate at high speed.

The oxide semiconductor layer 813 includes a pair of high-concentration regions 818 which are obtained by addition of dopant imparting n-type conductivity to the oxide semiconductor layer 813 after formation of the gate electrode 817. Further, the oxide semiconductor layer 813 includes a channel formation region 819 which overlaps with the gate electrode 817 with the gate insulating film 816 interposed therebetween. In the oxide semiconductor layer 813, the channel formation region 819 is provided between the pair of high-concentration regions 818.

Like the above-described high-concentration regions 808 included in the transistor 801, the high-concentration regions 818 can be formed by an ion implantation method. The kind of dopant in the case of the high-concentration regions 808 can be referred to for the kind of dopant for forming the high-concentration regions 818.

For example, in the case where nitrogen is used as the dopant, the concentration of nitrogen atoms in the high-concentration regions 818 is preferably higher than or equal to $5 \times 10^{19}/cm^3$ and lower than or equal to $1 \times 10^{22}/cm^3$.

The high-concentration regions 818 to which the dopant imparting n-type conductivity is added have higher conductivity than the other regions in the oxide semiconductor layer 813. Therefore, by providing the high-concentration regions 818 in the oxide semiconductor layer 813, the resistance between the source electrode 814 and the drain electrode 815 can be decreased.

In the case where an In—Ga—Zn-based oxide semiconductor is used for the oxide semiconductor layer 813, heat treatment is performed at a temperature higher than or equal to 300° C. and lower than or equal to 600° C. after nitrogen is added. Consequently, the oxide semiconductor in the high-concentration regions 818 has a wurtzite crystal structure. Since the oxide semiconductor in the high-concentration regions 818 has a wurtzite crystal structure, the conductivity of the high-concentration regions 818 can be further increased and the resistance between the source electrode 814 and the drain electrode 815 can be decreased. Note that in order to effectively decrease the resistance between the source electrode 814 and the drain electrode 815 by forming an oxide semiconductor having a wurtzite crystal structure, in the case of using nitrogen as the dopant, the concentration of nitrogen atoms in the high-concentration regions 818 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 813 may be formed using a CAAC-OS film. In the case where the oxide semiconductor layer 813 is formed using a CAAC-OS film, the conductivity of the oxide semiconductor layer 813 can be increased as compared to the case of an amorphous semiconductor; thus, the resistance between the source electrode 814 and the drain electrode 815 can be decreased.

By decreasing the resistance between the source electrode 814 and the drain electrode 815, high on-state current and high-speed operation can be ensured even when the transistor 811 is miniaturized. With the miniaturization of the transistor 811, the area occupied by the memory circuit including the transistor can be reduced and the memory capacity per unit area can be increased.

Figure 11C:
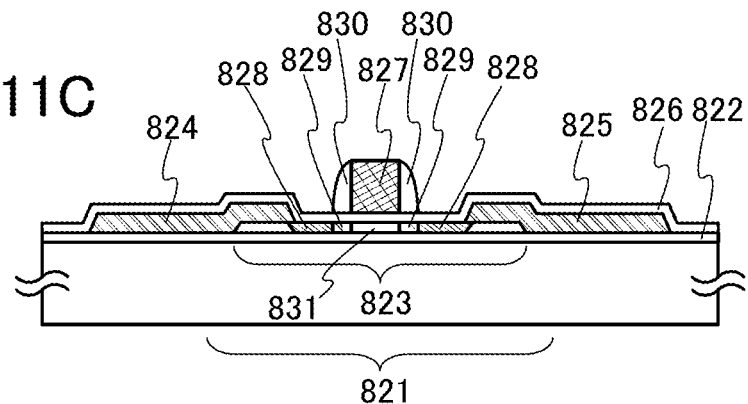

A transistor 821 illustrated in FIG. 11C includes an oxide semiconductor layer 823 which is formed over an insulating film 822 and functions as an active layer; a source electrode 824 formed over the oxide semiconductor layer 823; a drain electrode 825 formed over the oxide semiconductor layer 823; a gate insulating film 826 over the oxide semiconductor layer 823, the source electrode 824, and the drain electrode 825; and a gate electrode 827 which is provided over the gate insulating film 826 so as to overlap with the oxide semiconductor layer 823. In addition, the transistor 821 includes a sidewall 830 which is formed of an insulating film and is provided on a side surface of the gate electrode 827.

The transistor 821 illustrated in FIG. 11C is of a top-gate type where the gate electrode 827 is formed over the oxide semiconductor layer 823, and is also of a top-contact type where the source electrode 824 and the drain electrode 825 are formed over the oxide semiconductor layer 823. In the transistor 821, the source electrode 824 and the drain electrode 825 do not overlap with the gate electrode 827 as in the transistor 801; thus, the parasitic capacitance generated between the gate electrode 827 and the source electrode 824 or the drain electrode 825 can be small, so that the transistor 821 can operate at high speed.

The oxide semiconductor layer 823 includes a pair of high-concentration regions 828 and a pair of low-concentration regions 829 which are obtained by addition of dopant imparting n-type conductivity to the oxide semiconductor layer 823 after formation of the gate electrode 827. Further, the oxide semiconductor layer 823 includes a channel formation region 831 which overlaps with the gate electrode 827 with the gate insulating film 826 interposed therebetween. In the oxide semiconductor layer 823, the channel formation region 831 is provided between the pair of low-concentration regions 829 which are provided between the pair of high-concentration regions 828. The pair of low-concentration regions 829 is provided in a region which is in the oxide semiconductor layer 823 and overlaps with the sidewall 830 with the gate insulating film 826 interposed therebetween.

Like the above-described high-concentration regions 808 included in the transistor 801, the high-concentration regions 828 and the low-concentration regions 829 can be formed by an ion implantation method. The kind of dopant in the case of the high-concentration regions 808 can be referred to for the kind of dopant for forming the high-concentration regions 828.

For example, in the case where nitrogen is used as the dopant, the concentration of nitrogen atoms in the high-concentration regions 828 is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the low-concentration regions 829 is preferably higher than or equal to $5 \times 10^{18}/cm^3$ and lower than $5 \times 10^{19}/cm^3$.

The high-concentration regions 828 to which the dopant imparting n-type conductivity is added have higher conductivity than the other regions in the oxide semiconductor layer 823. Therefore, by providing the high-concentration regions 828 in the oxide semiconductor layer 823, the resistance between the source electrode 824 and the drain electrode 825 can be decreased. The low-concentration regions 829 are provided between the channel formation region 831 and the high-concentration regions 828, whereby a negative shift of the threshold voltage due to a short-channel effect can be reduced.

In the case where an In—Ga—Zn-based oxide semiconductor is used for the oxide semiconductor layer 823, heat treatment is performed at a temperature higher than or equal to 300° C. and lower than or equal to 600° C. after nitrogen is added. Consequently, the oxide semiconductor in the high-concentration regions 828 has a wurtzite crystal structure. Further, depending on the nitrogen concentration, the low-concentration regions 829 also have a wurtzite crystal structure due to the heat treatment. Since the oxide semiconductor in the high-concentration regions 828 has a wurtzite crystal structure, the conductivity of the high-concentration regions 828 can be further increased and the resistance between the source electrode 824 and the drain electrode 825 can be decreased. Note that in order to effectively decrease the resistance between the source electrode 824 and the drain electrode 825 by forming an oxide semiconductor having a wurtzite crystal structure, in the case of using nitrogen as the dopant, the concentration of nitrogen atoms in the high-concentration regions 828 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 823 may be formed using a CAAC-OS film. In the case where the oxide semiconductor layer 823 is formed using a CAAC-OS film, the conductivity of the oxide semiconductor layer 823 can be increased as compared to the case of an amorphous semiconductor; thus, the resistance between the source electrode 824 and the drain electrode 825 can be decreased.

By decreasing the resistance between the source electrode 824 and the drain electrode 825, high on-state current and high-speed operation can be ensured even when the transistor 821 is miniaturized. With the miniaturization of the transistor 821, the area occupied by a memory cell including the transistor can be reduced and the memory capacity per unit area of a cell array can be increased.

Figure 11D:
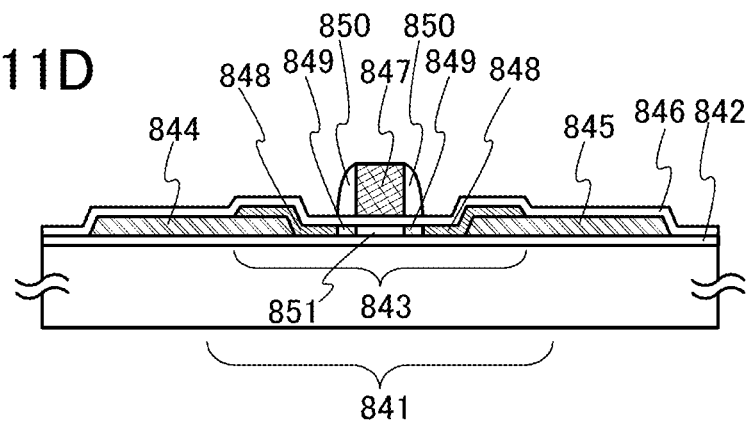

A transistor 841 illustrated in FIG. 11D includes a source electrode 844 formed over an insulating film 842; a drain electrode 845 formed over the insulating film 842; an oxide semiconductor layer 843 which is formed over the source electrode 844 and the drain electrode 845 and functions as an active layer; a gate insulating film 846 over the oxide semiconductor layer 843, the source electrode 844, and the drain electrode 845; and a gate electrode 847 which is provided over the gate insulating film 846 so as to overlap with the oxide semiconductor layer 843. In addition, the transistor 841 includes a sidewall 850 which is formed of an insulating film and is provided on a side surface of the gate electrode 847.

The transistor 841 illustrated in FIG. 11D is of a top-gate type where the gate electrode 847 is formed over the oxide semiconductor layer 843, and is also of a bottom-contact type where the source electrode 844 and the drain electrode 845 are formed below the oxide semiconductor layer 843. In the transistor 841, the source electrode 844 and the drain electrode 845 do not overlap with the gate electrode 847 as in the transistor 801. Therefore, the parasitic capacitance generated between the gate electrode 847 and the source electrode 844 or the drain electrode 845 can be small, so that the transistor 841 can operate at high speed.

The oxide semiconductor layer 843 includes a pair of high-concentration regions 848 and a pair of low-concentration regions 849 which are obtained by addition of dopant imparting n-type conductivity to the oxide semiconductor layer 843 after formation of the gate electrode 847. Further, the oxide semiconductor layer 843 includes a channel formation region 851 which overlaps with the gate electrode 847 with the gate insulating film 846 interposed therebetween. In the oxide semiconductor layer 843, the channel formation region 851 is provided between the pair of low-concentration regions 849 which are provided between the pair of high-concentration regions 848. The pair of low-concentration regions 849 is provided in a region which is in the oxide semiconductor layer 843 and overlaps with the sidewall 850 with the gate insulating film 846 interposed therebetween.

Like the above-described high-concentration regions 808 included in the transistor 801, the high-concentration regions 848 and the low-concentration regions 849 can be formed by an ion implantation method. The kind of dopant in the case of the high-concentration regions 808 can be referred to for the kind of dopant for forming the high-concentration regions 848.

For example, in the case where nitrogen is used as the dopant, the concentration of nitrogen atoms in the high-concentration regions 848 is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the low-concentration regions 849 is preferably higher than or equal to $5 \times 10^{18}/cm^3$ and lower than $5 \times 10^{19}/cm^3$.

The high-concentration regions 848 to which the dopant imparting n-type conductivity is added have higher conductivity than the other regions in the oxide semiconductor layer 843. Therefore, by providing the high-concentration regions 848 in the oxide semiconductor layer 843, the resistance between the source electrode 844 and the drain electrode 845 can be decreased. The low-concentration regions 849 are provided between the channel formation region 851 and the high-concentration regions 848, whereby a negative shift of the threshold voltage due to a short-channel effect can be reduced.

In the case where an In—Ga—Zn-based oxide semiconductor is used for the oxide semiconductor layer 843, heat treatment is performed at a temperature higher than or equal to 300° C. and lower than or equal to 600° C. after nitrogen is added. Consequently, the oxide semiconductor in the high-concentration regions 848 has a wurtzite crystal structure. Further, depending on the nitrogen concentration, the low-concentration regions 849 also have a wurtzite crystal structure due to the heat treatment. Since the oxide semiconductor in the high-concentration regions 848 has a wurtzite crystal structure, the conductivity of the high-concentration regions 848 can be further increased and the resistance between the source electrode 844 and the drain electrode 845 can be decreased. Note that in order to effectively decrease the resistance between the source electrode 844 and the drain electrode 845 by forming an oxide semiconductor having a wurtzite crystal structure, in the case of using nitrogen as the dopant, the concentration of nitrogen atoms in the high-concentration regions 848 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 843 may be formed using a CAAC-OS film. In the case where the oxide semiconductor layer 843 is formed using a CAAC-OS film, the conductivity of the oxide semiconductor layer 843 can be increased as compared to the case of an amorphous semiconductor; thus, the resistance between the source electrode 844 and the drain electrode 845 can be decreased.

By decreasing the resistance between the source electrode 844 and the drain electrode 845, high on-state current and high-speed operation can be ensured even when the transistor 841 is miniaturized. With the miniaturization of the transistor 841, the area occupied by the memory circuit including the transistor can be reduced and the memory capacity per unit area can be increased.

Note that as a method for forming high-concentration regions functioning as a source region and a drain region in a self-aligning process in a transistor including an oxide semiconductor, disclosed is a method in which a surface of an oxide semiconductor layer is exposed and argon plasma treatment is performed so that the resistivity of a region which is exposed to plasma in the oxide semiconductor layer is decreased (S. Jeon et al., "180 nm Gate Length Amorphous InGaZnO Thin Film Transistor for High Density Image Sensor Applications", *IEDM Tech. Dig.*, pp. 504-507, 2010).

However, in the above manufacturing method, after a gate insulating film is formed, the gate insulating film needs to be partially removed so that a portion which is to be the source region and the drain region is exposed. Therefore, at the time of removing the gate insulating film, the oxide semiconductor layer which is below the gate insulating film is partially over-etched; thus, the thickness of the portion which is to be the source region and the drain region becomes small. As a result, the resistance of the source region and the drain region is increased, and defects of transistor characteristics due to overetching easily occur.

In order to promote miniaturization of a transistor, a dry etching method with which high processing accuracy can be provided needs to be employed. However, the overetching easily occurs remarkably in the case where a dry etching method with which the selectivity of a gate insulating film to an oxide semiconductor layer is not sufficiently obtained is employed.

For example, the overetching does not become a problem as long as the oxide semiconductor layer has an enough thickness; however, when the channel length is 200 nm or shorter, the thickness of the oxide semiconductor layer in a region which is to be a channel formation region needs to be 20 nm or shorter, preferably 10 nm or shorter so that a short-channel effect can be prevented. When such a thin oxide semiconductor layer is used, the overetching of the oxide semiconductor layer is not preferable because the resistance of the source region and the drain region is increased and defects of transistor characteristics occur as described above.

However, as described in this embodiment, addition of dopant to an oxide semiconductor layer is performed in the state where a gate insulating film is left so as not to expose the oxide semiconductor layer; thus, the overetching of the oxide semiconductor layer can be prevented and excessive damage to the oxide semiconductor layer can be reduced. In addition, the interface between the oxide semiconductor layer and the gate insulating film is kept clean. Therefore, the characteristics and reliability of the transistor can be improved.

This embodiment can be implemented in combination with any of the other embodiments as appropriate.

[Embodiment 7]

In this embodiment, a description will be given of an electronic device including the signal processing circuit according to one embodiment of the present invention so that power consumption is low. In particular, in the case of a portable electronic device which has difficulty in continuously receiving power, when a signal processing circuit with low power consumption according to one embodiment of the present invention is added as a component of the device, an advantage in increasing the continuous operation time can be obtained.

A signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images). In addition, as an electronic device which can employ a signal processing circuit according to one embodiment of the present invention, mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case where a signal processing circuit according to one embodiment of the present invention is applied to electronic devices such as a mobile phone, a smartphone, and an e-book reader will be described with reference to FIG. 12 and FIG. 13.

Figure 12:
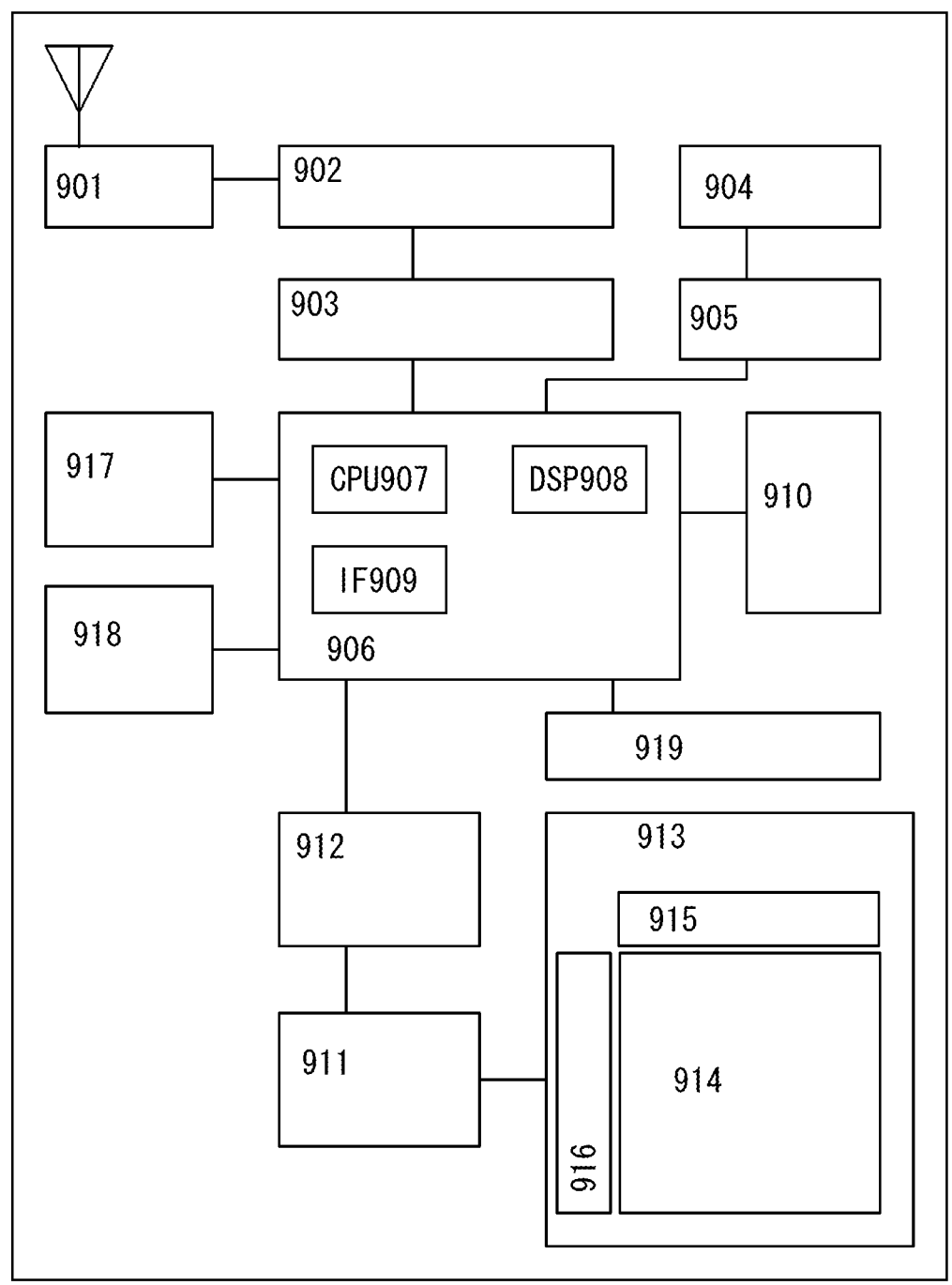
FIG. 12 is a block diagram of a portable electronic device.

FIG. 12 is a block diagram of a portable electronic device. The portable electronic device illustrated in FIG. 12 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. The use of the signal processing circuit described in the above embodiment for, for example, the CPU 907 leads to a reduction in power consumption.

Figure 13:
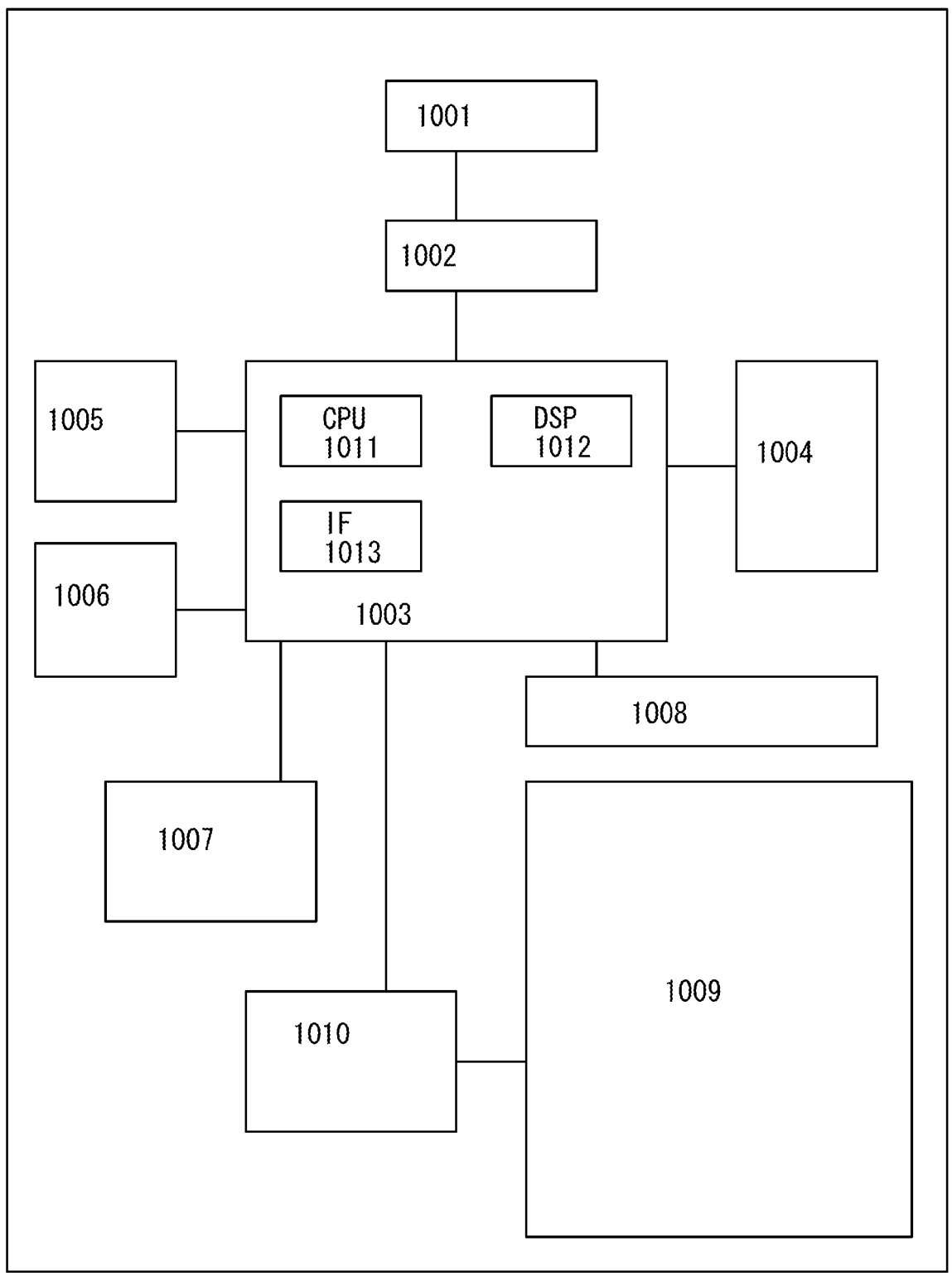
FIG. 13 is a block diagram of an e-book reader.

FIG. 13 is a block diagram of an e-book reader. The e-book reader includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010. The microprocessor 1003 includes a CPU 1011, a DSP 1012, and an interface 1013. The use of the signal processing circuit described in the above embodiment for, for example, the CPU 1011 leads to a reduction in power consumption.

This embodiment can be implemented in combination with any of the other embodiments as appropriate.

[Embodiment 8]

In this embodiment, the transistor including an oxide semiconductor, which is described in Embodiments 1 to 7, will be described in detail.

A transistor in which an oxide semiconductor film containing In, Sn, and Zn as main components is used for a channel formation region can have favorable characteristics by depositing the oxide semiconductor film while heating a substrate or by performing heat treatment after the oxide semiconductor film is formed. Note that a main component refers to an element included in a composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 24A:
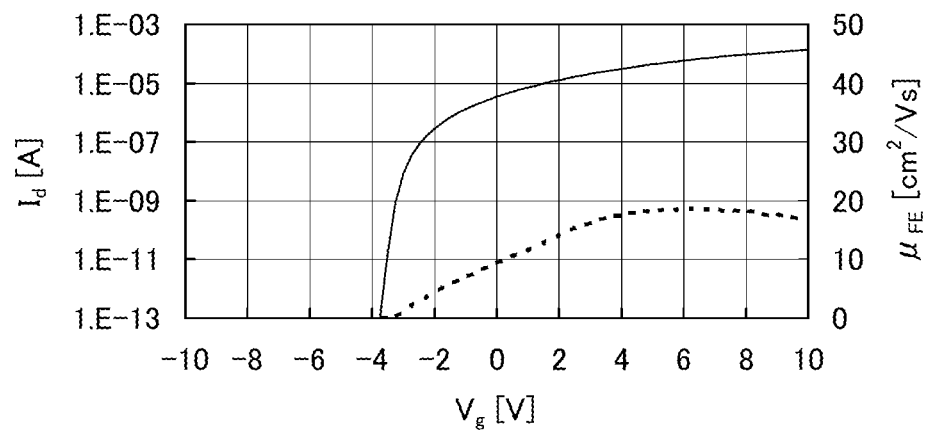
FIGS. 24A to 24C are graphs showing characteristics of transistors each including an oxide semiconductor film.
Figure 24B:
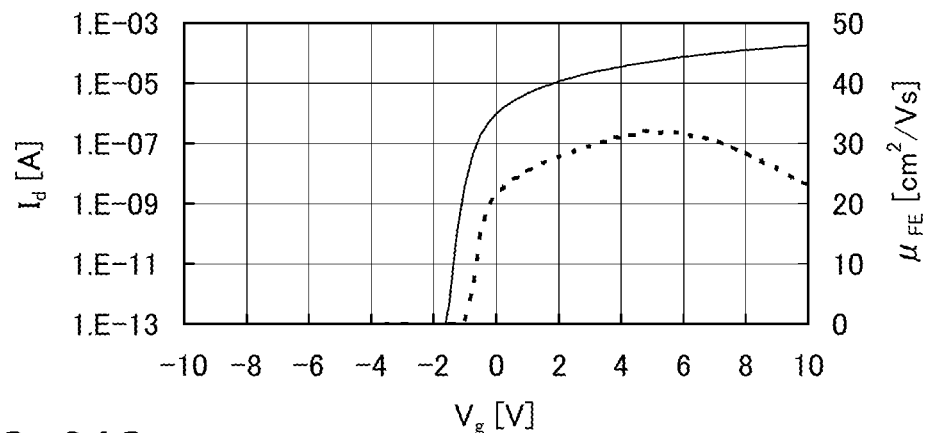
Figure 24C:
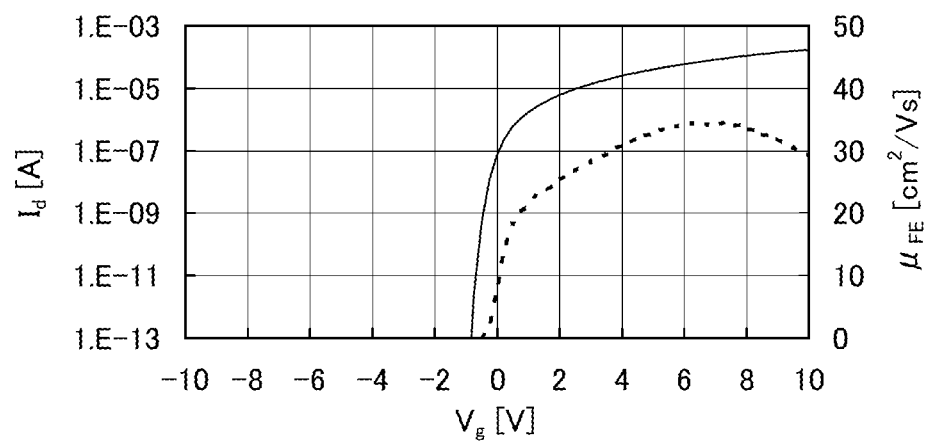

As an example, FIGS. 24A to 24C are graphs each showing characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 24A is a graph showing characteristics of a transistor whose oxide semiconductor film containing In, Sn, and Zn as main components was formed by a sputtering method without heating a substrate intentionally. The field-effect mobility of the transistor was 18.8 cm$^2$/Vsec. On the other hand, when the oxide semiconductor film containing In, Sn, and Zn as main components is formed while heating the substrate intentionally, the field-effect mobility can be improved. FIG. 24B shows characteristics of a transistor whose oxide semiconductor film containing In, Sn, and Zn as main components was formed while heating a substrate at 200° C. The field-effect mobility of the transistor was 32.2 cm$^2$/Vsec.

The field-effect mobility can be further improved by performing heat treatment after formation of the oxide semiconductor film containing In, Sn, and Zn as main components. FIG. 24C shows characteristics of a transistor whose oxide semiconductor film containing In, Sn, and Zn as main components was formed by sputtering at 200° C. and then subjected to heat treatment at 650° C. The field-effect mobility of the transistor was 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film which contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 24A and 24B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be achieved by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Note that $V_d$ refers to a drain voltage (a potential difference between the drain and the source). Then, the substrate temperature was set to 150° C. and $V_d$ was set to 0.1 V. After that, $V_g$ of 20 V was applied so that the intensity of an electric field applied to a gate insulating film 608 was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of −20 V was applied so that the intensity of an electric field applied to the gate insulating film 608 was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 25A:
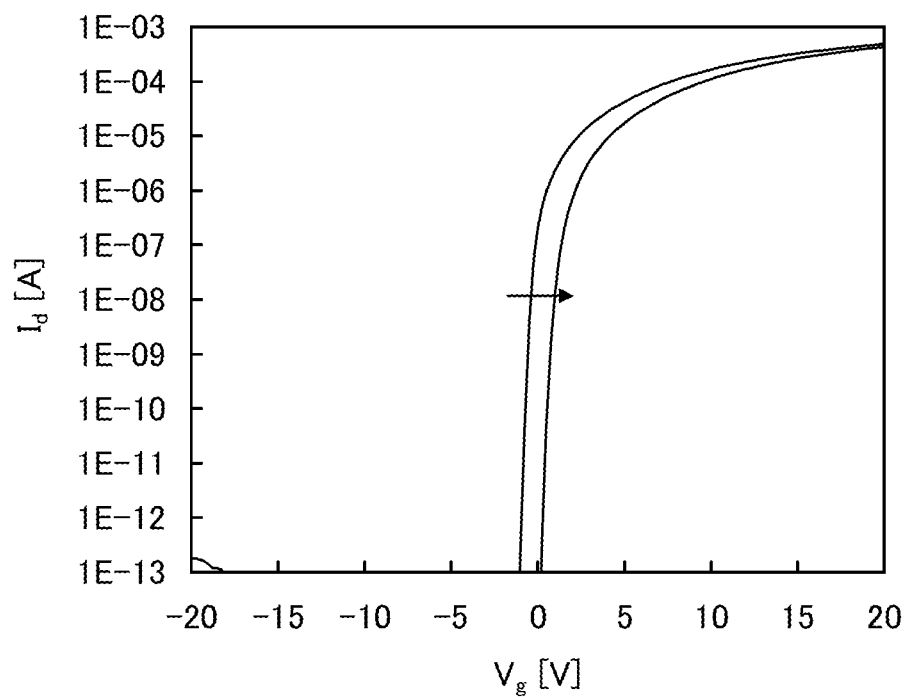
FIGS. 25A and 25B are graphs showing $V_g$-$I_d$ characteristics after a BT test of a transistor of Sample 1.
Figure 25B:
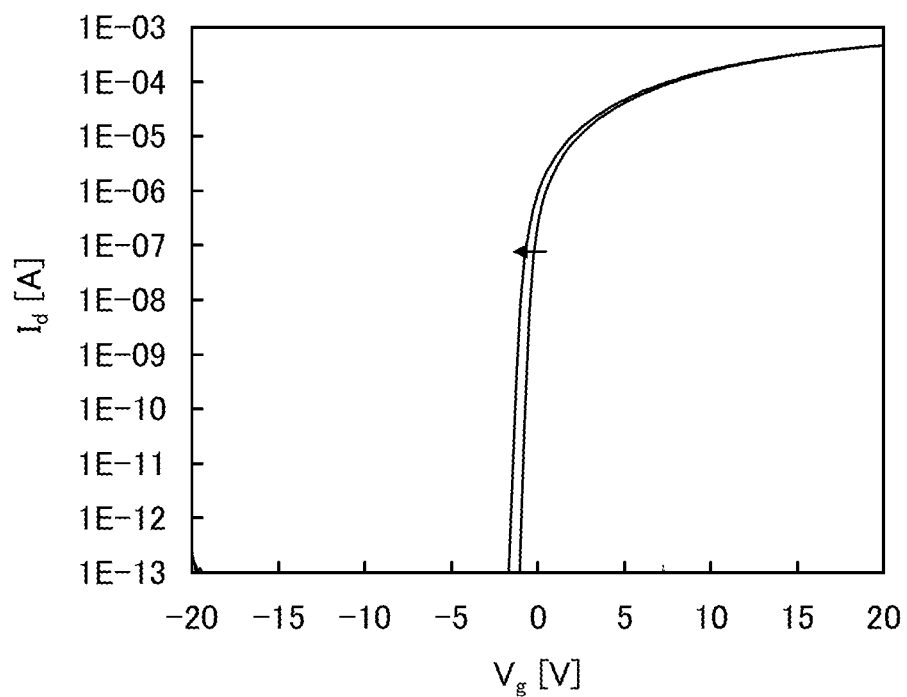
Figure 26A:
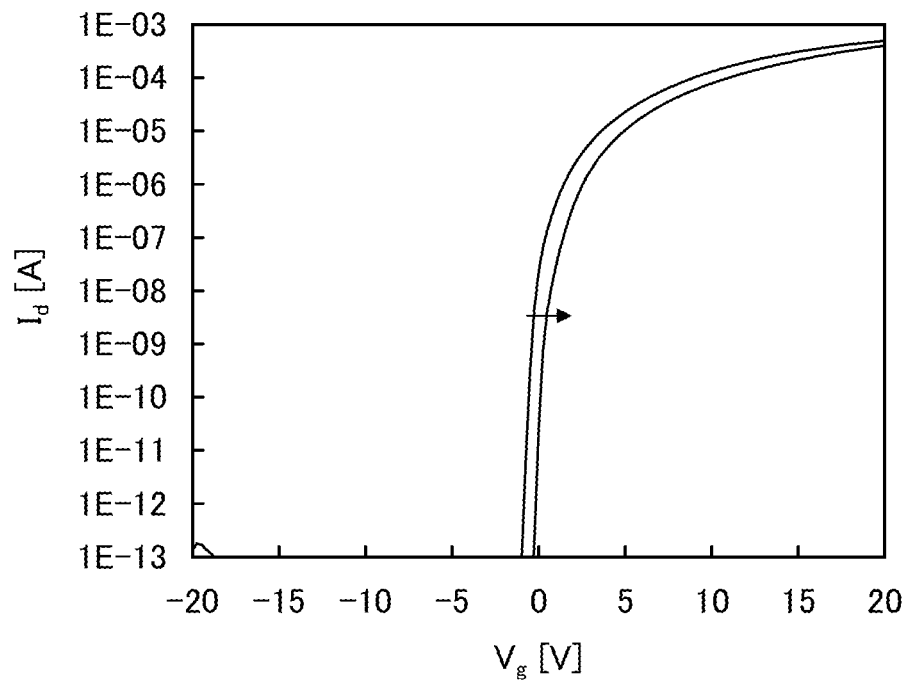
FIGS. 26A and 26B are graphs showing $V_g$-$I_d$ characteristics after a BT test of a transistor of Sample 2.
Figure 26B:
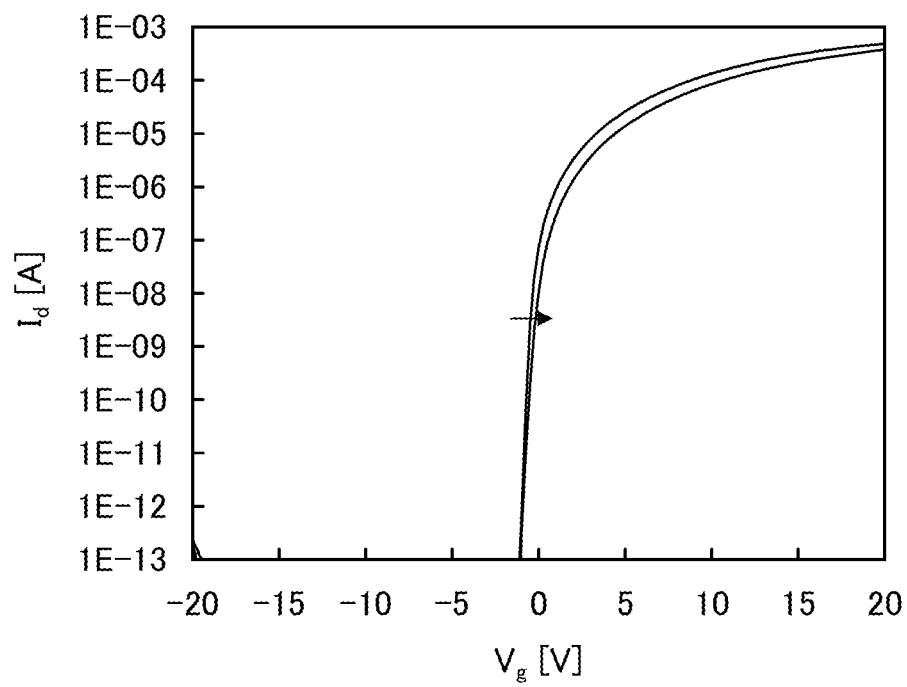

FIGS. 25A and 25B show results of the positive BT test and the negative BT test, respectively, of Sample 1. FIGS. 26A and 26B show results of the positive BT test and the negative BT test, respectively, of Sample 2.

The amount of shift in threshold voltage of Sample 1 due to the positive BT test and that due to the negative BT test were 1.80 V and −0.42 V, respectively. The amount of shift in threshold voltage of Sample 2 due to the positive BT test and that due to the negative BT test were 0.79 V and 0.76 V, respectively. It is found that, in each of Sample 1 and Sample 2, the amount of shift in threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set in the range of $1\times10^{16}$/cm$^3$ to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 27:
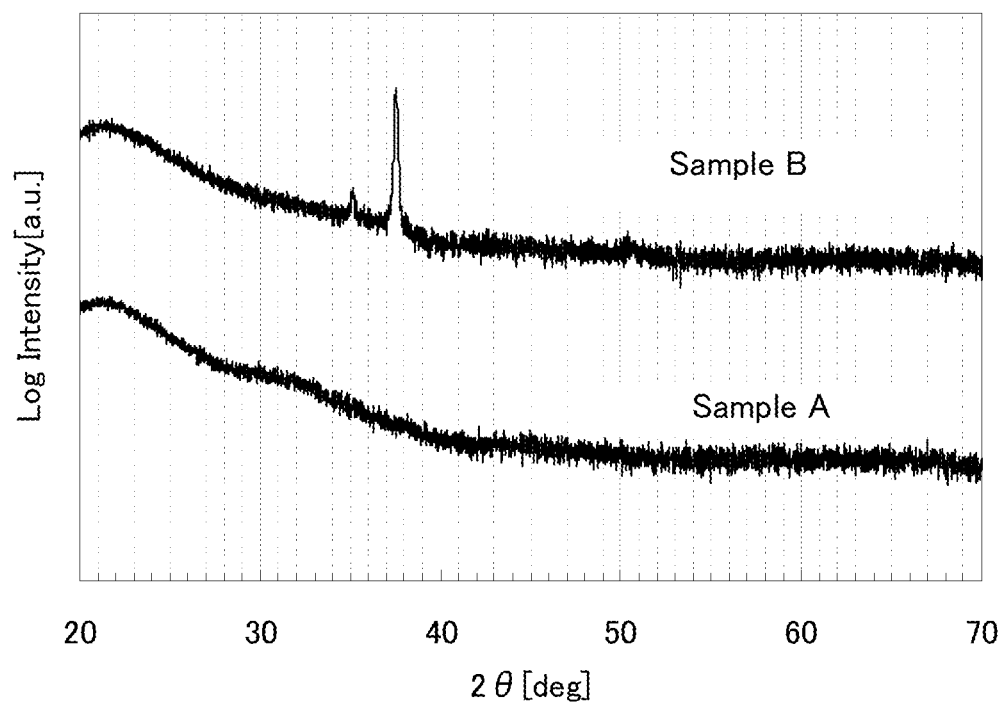
FIG. 27 shows XRD spectra of Sample A and Sample B.

FIG. 27 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 28:
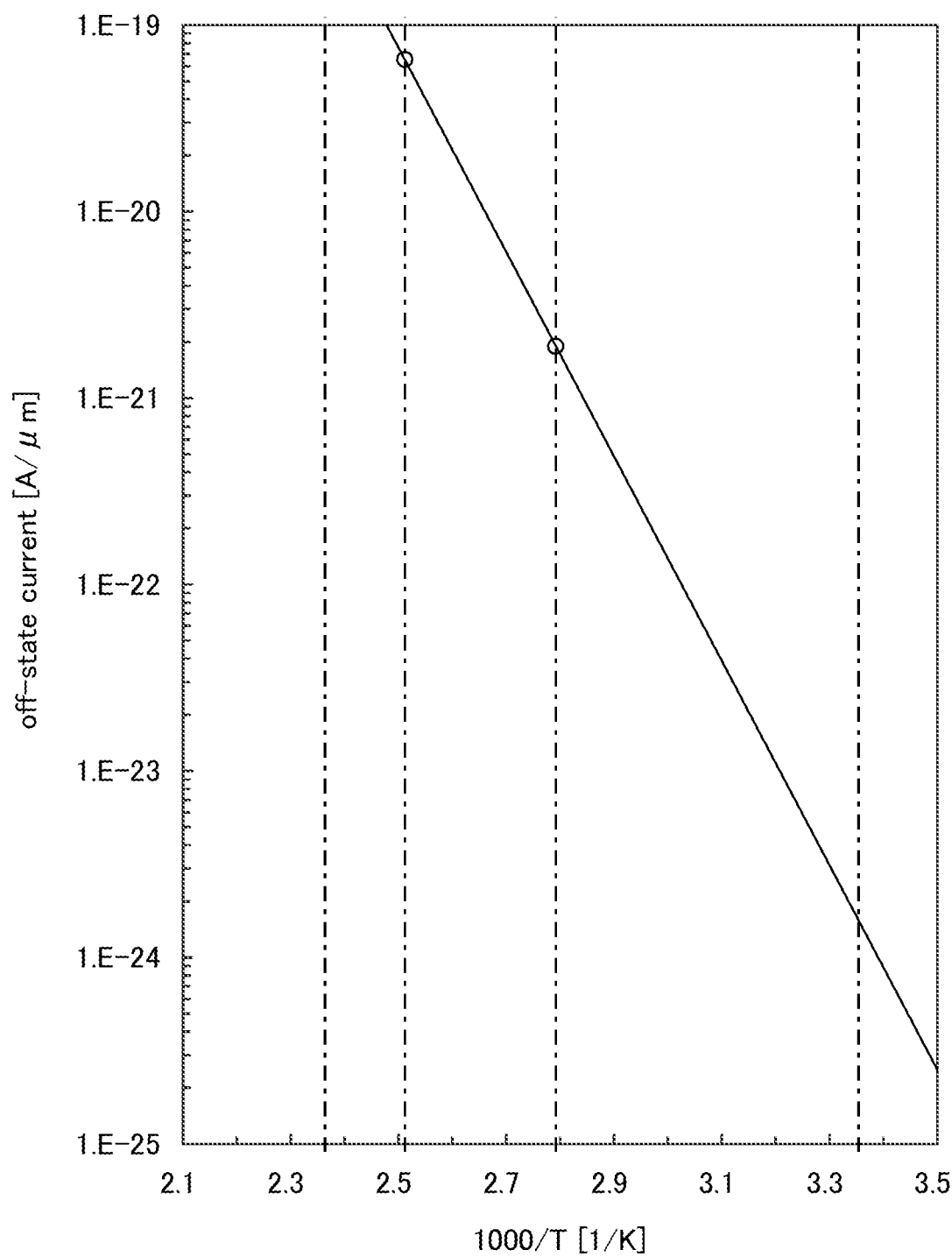
FIG. 28 is a graph showing a relation between off-state current and substrate temperature in measurement of a transistor.

FIG. 28 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 28, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when a substrate temperature T is 125° C., 85° C., and room temperature (27° C.), respectively. Preferably, the off-state current can be 0.1 aA/μm (1×10$^{-19}$ A/μm) or lower, 10 zA/μm (1×10$^{-20}$ A/μm) or lower, and 0.1 zA/μm (1×10$^{-22}$ A/μm) or lower at 125° C., 85° C., and room temperature, respectively. The above values of off-state currents are clearly much lower than that of the transistor using Si as a semiconductor film.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not include moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electrical characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that V$_d$ was set to 10 V. Note that the substrate temperature was −40° C., −25° C., 25° C., 75° C., 125° C., and 150° C. Here, in the transistor, the width of a portion where a gate electrode overlaps with one of a pair of electrodes in a channel length direction is referred to as Lov, and the width of a portion of the pair of electrodes, which does not overlap with an oxide semiconductor film, in a channel width direction is referred to as dW.

Figure 29:
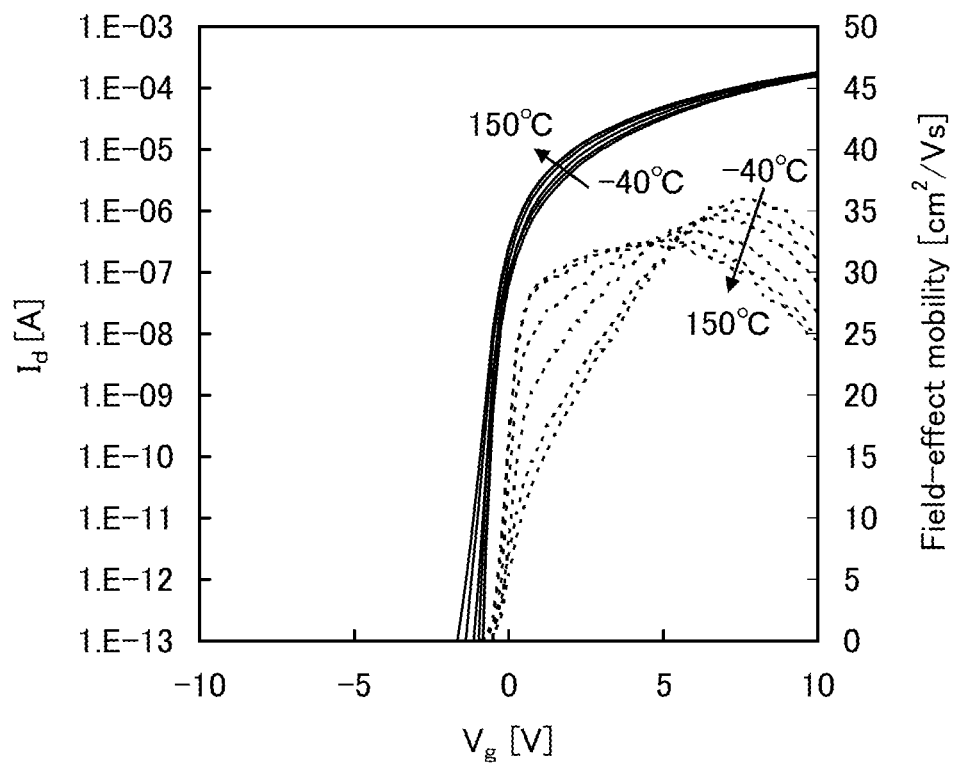
FIG. 29 is a graph showing $V_g$ dependence of $I_d$ and field-effect mobility.
Figure 30A:
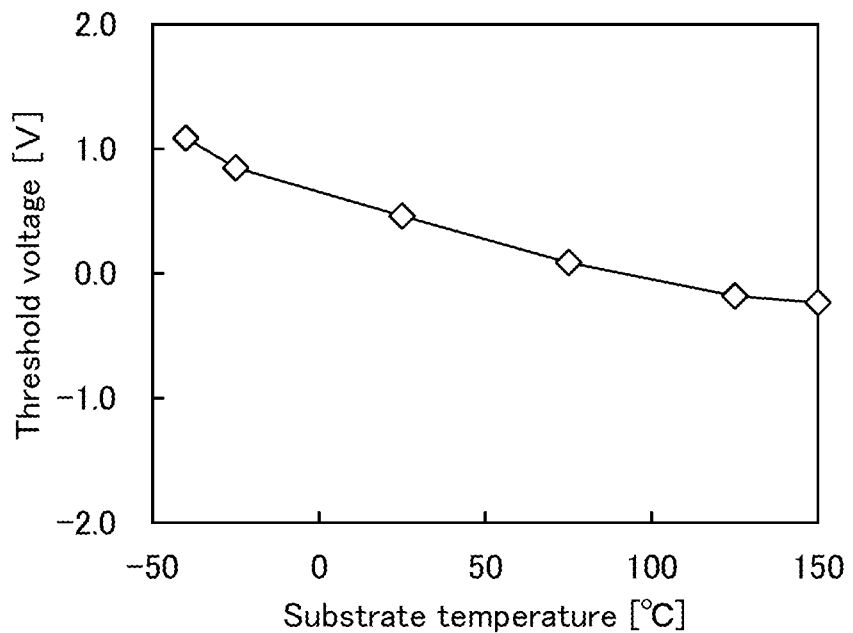
FIG. 30A shows a relation between substrate temperature and threshold voltage.

FIG. 29 shows the V$_g$ dependence of I$_d$ (a solid line) and field-effect mobility (a dotted line). FIG. 30A shows a relation between the substrate temperature and the threshold voltage, and FIG. 30B shows a relation between the substrate temperature and the field-effect mobility.

From FIG. 30A, it is found that the threshold voltage gets lower as the substrate temperature increases. Note that the threshold voltage is decreased from 1.09 V to −0.23 V in the range from −40° C. to 150° C.

Figure 30B:
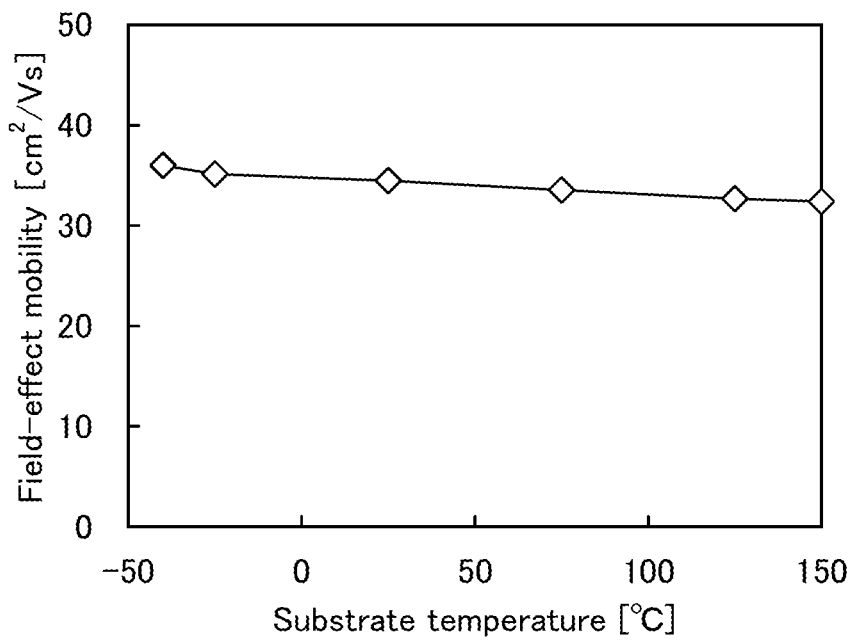
FIG. 30B shows a relation between substrate temperature and field-effect mobility.

From FIG. 30B, it is found that the field-effect mobility gets lower as the substrate temperature increases. Note that the field-effect mobility is decreased from 36 cm$^2$/Vs to 32 cm$^2$/Vs in the range from −40° C. to 150° C. Thus, it is found that variation in electrical characteristics is small in the above temperature range.

In a transistor in which such an oxide semiconductor containing In, Sn, and Zn as main components is used as a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor. With such characteristics, an integrated circuit having a novel function can be realized without decreasing the operation speed even when a transistor including an oxide semiconductor is provided in an integrated circuit formed using a Si semiconductor.

Example 1

In this example, an example of a transistor in which an In—Sn—Zn—O film is used as an oxide semiconductor film will be described with reference to FIGS. 31A and 31B and the like.

Figure 31A:
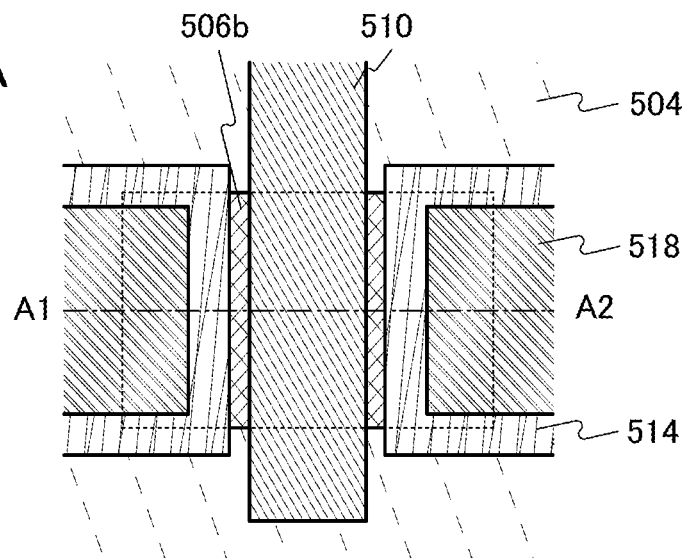
FIG. 31A is a top view of a semiconductor device.
Figure 31B:
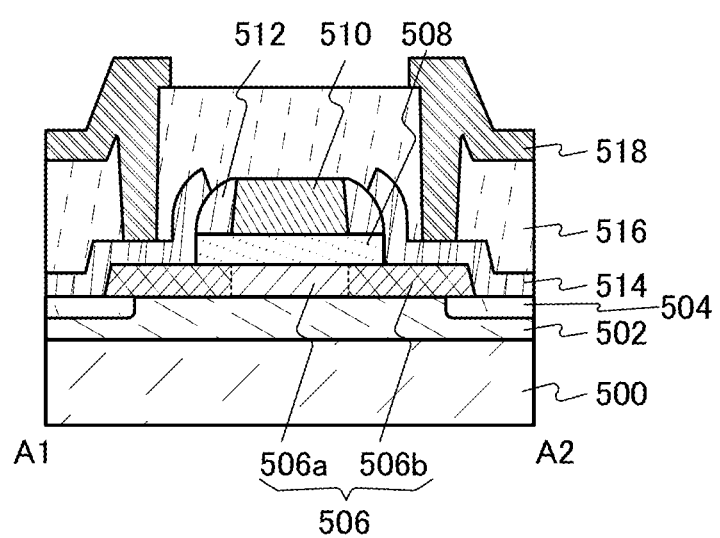
FIG. 31B is a cross-sectional view thereof.

FIGS. 31A and 31B are a top view and a cross-sectional view of a coplanar transistor having a top-gate top-contact structure. FIG. 31A is the top view of the transistor. FIG. 31B is the cross-sectional view taken along dashed-dotted line A1-A2 in FIG. 31A.

The transistor illustrated in FIG. 31B includes a substrate 500; a base insulating film 502 provided over the substrate 500; a protective insulating film 504 provided in the periphery of the base insulating film 502; an oxide semiconductor film 506 which is provided over the base insulating film 502 and the protective insulating film 504 and includes a high-resistance region 506a and low-resistance regions 506b; a gate insulating film 508 provided over the oxide semiconductor film 506; a gate electrode 510 provided to overlap with the oxide semiconductor film 506 with the gate insulating film 508 positioned therebetween; a sidewall insulating film 512 provided in contact with a side surface of the gate electrode 510; a pair of electrodes 514 provided in contact with at least the low-resistance regions 506b; an interlayer insulating film 516 provided to cover at least the oxide semiconductor film 506, the gate electrode 510, and the pair of electrodes 514; and a wiring 518 provided to be connected to at least one of the pair of electrodes 514 through an opening formed in the interlayer insulating film 516.

Although not illustrated, a protective film may be provided to cover the interlayer insulating film 516 and the wiring 518. With the protective film, a minute amount of leakage current generated by surface conduction of the interlayer insulating film 516 can be reduced and thus the off-state current of the transistor can be reduced.

Example 2

In this example, another example of a transistor in which an In—Sn—Zn—O film is used as an oxide semiconductor film will be described.

Figure 32A:
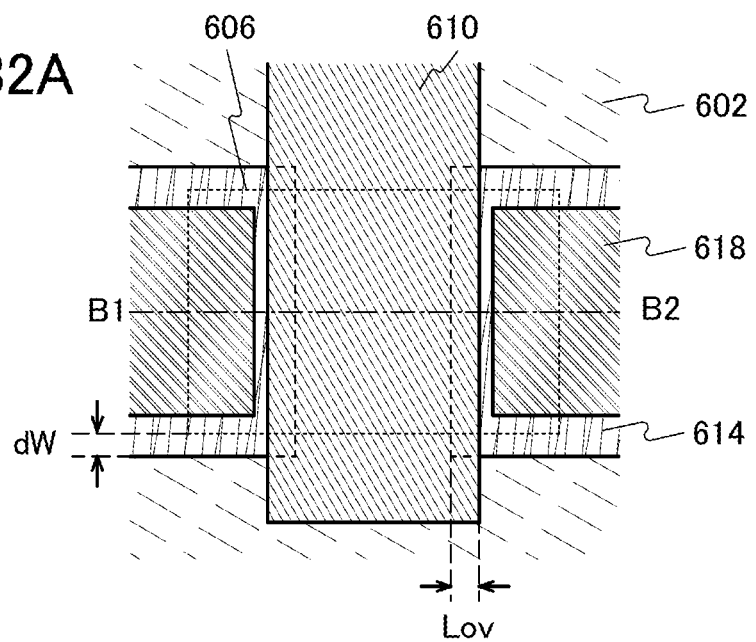
FIG. 32A is a top view of a semiconductor device.
Figure 32B:
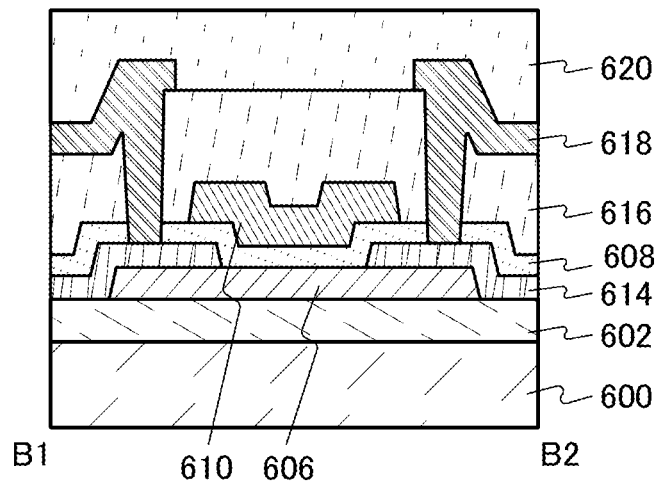
FIG. 32B is a cross-sectional view thereof.

FIGS. 32A and 32B are a top view and a cross-sectional view which illustrate a structure of a transistor manufactured in this example. FIG. 32A is the top view of the transistor. FIG. 32B is the cross-sectional view taken along dashed-dotted line B1-B2 in FIG. 32A.

The transistor illustrated in FIG. 32B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate can be used. As the base insulating film 602, a silicon oxide film can be used. As the oxide semiconductor film 606, an In—Sn—Zn—O film can be used. As the pair of electrodes 614, a tungsten film can be used. As the gate insulating film 608, a silicon oxide film can be used. The gate electrode 610 can have a stacked structure of a tantalum nitride film and a tungsten film. The interlayer insulating film 616 can have a stacked structure of a silicon oxynitride film and a polyimide film. The wirings 618 can each have a stacked structure in which a titanium film, an aluminum film, and a titanium film are formed in this order. As the protective film 620, a polyimide film can be used.

Note that in the transistor having the structure illustrated in FIG. 32A, the width of a portion where the gate electrode 610 overlaps with one of the pair of electrodes 614 in a channel length direction is referred to as Lov. Further, the width of a portion of the pair of electrodes 614, which does not overlap with the oxide semiconductor film 606, in a channel width direction is referred to as dW.

This application is based on Japanese Patent Application serial no. 2011-101158 filed with Japan Patent Office on Apr. 28, 2011, and Japanese Patent Application serial no. 2011-112994 filed with Japan Patent Office on May 20, 2011, the entire contents of which are hereby incorporated by reference.

What is claimed is:

1. A memory circuit comprising:
   a first circuit comprising at least two input terminals and at least one output terminal;
   a second circuit comprising at least two input terminals and at least one output terminal;
   a third circuit comprising at least two input terminals and at least one output terminal;
   a first switch;
   a first transistor comprising an oxide semiconductor;
   a first capacitor;
   a first inverter; and
   a second inverter,
   wherein one of the input terminals of the first circuit is configured to be supplied with a reading signal, the other of the input terminals of the first circuit is electrically connected to one of a source electrode and a drain electrode of the first transistor, and the output terminal of the first circuit is electrically connected to an input terminal of the first switch,
   wherein one of the input terminals of the second circuit is configured to be supplied with the reading signal, the other of the input terminals of the second circuit is electrically connected to an output terminal of the first switch, and the output terminal of the second circuit is electrically connected to the other of the source electrode and the drain electrode of the first transistor,
   wherein one of the input terminals of the third circuit is electrically connected to an output terminal of the first inverter, the other of the input terminals of the third circuit is configured to be supplied with the reading signal, the output terminal of the third circuit is electrically connected to an input terminal of the second inverter and a first control terminal of the first switch, and an output terminal of the second inverter is electrically connected to a second control terminal of the first switch,
   wherein a gate electrode of the first transistor is configured to be supplied with a control signal,
   wherein an input terminal of the first inverter is configured to be supplied with the control signal,
   wherein one of electrodes of the first capacitor is electrically connected to the one of the source electrode and the drain electrode of the first transistor, and the other of the electrodes of the first capacitor is grounded,
   wherein a low-level potential is supplied to either of the input terminals of the second circuit before supply of a power supply voltage is stopped, and
   wherein a high-level potential is supplied between the other of the source electrode and the drain electrode of the first transistor and the first capacitor.

2. The memory circuit according to claim 1,
   wherein the oxide semiconductor comprises In, Ga, and Zn.

3. The memory circuit according to claim 1,
   wherein the first circuit comprises a second transistor, a third transistor, a fourth transistor, and a fifth transistor,
   wherein one of a source electrode and a drain electrode of the second transistor is configured to be supplied with a power supply potential,
   wherein the other of the source electrode and the drain electrode of the second transistor is electrically connected to one of a source electrode and a drain electrode of the third transistor,
   wherein the other of the source electrode and the drain electrode of the third transistor is electrically connected to one of a source electrode and a drain electrode of the fourth transistor,
   wherein the other of the source electrode and the drain electrode of the fourth transistor is grounded,
   wherein a gate electrode of the second transistor and a gate electrode of the third transistor are configured to be supplied with the reading signal,
   wherein one of a source electrode and a drain electrode of the fifth transistor is configured to be supplied with the power supply potential,
   wherein the other of the source electrode and the drain electrode of the fifth transistor is electrically connected to the other of the source electrode and the drain electrode of the second transistor,
   wherein a gate electrode of the fifth transistor is electrically connected to a gate electrode of the fourth transistor, and
   wherein the one of the source electrode and the drain electrode of the first transistor is electrically connected to the gate electrode of the fourth transistor.

4. The memory circuit according to claim 1,
   wherein the first circuit comprises a second transistor, a third transistor, a fourth transistor, and a second capacitor,
   wherein one of a source electrode and a drain electrode of the second transistor is configured to be supplied with a power supply potential,
   wherein the other of the source electrode and the drain electrode of the second transistor is electrically connected to one of a source electrode and a drain electrode of the third transistor,
   wherein the other of the source electrode and the drain electrode of the third transistor is electrically connected to one of a source electrode and a drain electrode of the fourth transistor,
   wherein the other of the source electrode and the drain electrode of the fourth transistor is grounded,
   wherein a gate electrode of the second transistor and a gate electrode of the third transistor are configured to be supplied with the reading signal,
   wherein one of electrodes of the second capacitor is electrically connected to the other of the source electrode and the drain electrode of the second transistor,
   wherein the other of the electrodes of the second capacitor is grounded, and wherein the one of the source electrode and the drain electrode of the first transistor is electrically connected to a gate electrode of the fourth transistor.

5. An electronic device comprising the memory circuit according to claim 1.

6. A signal processing circuit comprising:
the memory circuit according to claim 1;
a second switch;
a third inverter;
a third switch;
a fourth inverter;
a fourth switch;
a fifth inverter; and
a sixth inverter,
wherein an input terminal of the second switch is configured to be supplied with an input signal, and an output terminal of the second switch is electrically connected to an input terminal of the third inverter and an output terminal of the fourth inverter,
wherein an output terminal of the third inverter is electrically connected to an input terminal of the third switch,
wherein an output terminal of the third switch is electrically connected to an input terminal of the fourth inverter and an input terminal of the fourth switch,
wherein an output terminal of the fourth switch is electrically connected to an input terminal of the fifth inverter and an output terminal of the sixth inverter,
wherein an output terminal of the fifth inverter is electrically connected to an input terminal of the sixth inverter, and
wherein the memory circuit is electrically connected to the third switch.

7. An electronic device comprising the signal processing circuit according to claim 6.

* * * * *